(12) United States Patent  
Kim et al.

(10) Patent No.: US 12,457,829 B2  
(45) Date of Patent: Oct. 28, 2025

(54) DISPLAY DEVICE

(71) Applicant: Samsung Display Co., LTD., Yongin-si (KR)

(72) Inventors: Dae Hyun Kim, Hwaseong-si (KR); Keun Kyu Song, Seongnam-si (KR); Sung Chan Jo, Seoul (KR); Hyun Min Cho, Seoul (KR); Tae Jin Kong, Hwaseong-si (KR); Ock Soo Son, Seoul (KR); Chang Il Tae, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 390 days.

(21) Appl. No.: 18/018,255

(22) PCT Filed: May 4, 2021

(86) PCT No.: PCT/KR2021/005604  
§ 371 (c)(1),  
(2) Date: Jan. 26, 2023

(87) PCT Pub. No.: WO2022/025395  
PCT Pub. Date: Feb. 3, 2022

(65) Prior Publication Data  
US 2023/0275197 A1 Aug. 31, 2023

(30) Foreign Application Priority Data  
Jul. 28, 2020 (KR) .................. 10-2020-0093960

(51) Int. Cl.  
*H10H 20/851* (2025.01)  
*H01L 21/768* (2006.01)  
(Continued)

(52) U.S. Cl.  
CPC ....... *H10H 20/8514* (2025.01); *H01L 25/167* (2013.01); *H10H 20/856* (2025.01)

(58) Field of Classification Search  
CPC .................... H10H 20/856; H10H 20/851  
See application file for complete search history.

(56) References Cited

U.S. PATENT DOCUMENTS 8,872,214 B2  10/2014  Negishi et al.  
9,112,112 B2  8/2015  Do et al.  
(Continued)

FOREIGN PATENT DOCUMENTS

KR  20120138805 A  12/2012  
KR  10-1244926 B1  3/2013  
(Continued)

OTHER PUBLICATIONS

International Search Report for corresponding Application No. PCT/KR2021/005605, dated Aug. 20, 2021, 4 pps.

(Continued)

*Primary Examiner* — Antonio B Crite  
(74) *Attorney, Agent, or Firm* — Womble Bond Dickinson (US) LLP

(57) ABSTRACT

A display device including: a first substrate on which a plurality of sub-pixels are located; a plurality of color filter layers on the first substrate; a bank layer including a first bank at a boundary between the plurality of sub-pixels and located on the color filter layers; a color control structure including a plurality of light transmitting layers and wavelength conversion layers in a region surrounded by the first bank on the color filter layer; a light emitting element layer between the color filter layer and the color control structure; a reflective layer on the color control structure; and a first electrode and a second electrode on the color filter layer and at least partially located at the same plane, wherein the light emitting element layer includes a plurality of light emitting elements, each of the light emitting elements having respective ends on the first and second electrodes.

24 Claims, 36 Drawing Sheets

(51) Int. Cl.
*H01L 25/075* (2006.01)
*H01L 25/10* (2006.01)
*H01L 25/16* (2023.01)
*H10H 20/855* (2025.01)
*H10H 20/856* (2025.01)
*H10H 29/14* (2025.01)

(56) References Cited

U.S. PATENT DOCUMENTS

| | | | |
|---|---|---|---|
| 9,329,433 B2 | 5/2016 | Negishi et al. | |
| 9,599,857 B2 | 3/2017 | Bibl et al. | |
| 10,373,978 B2 | 8/2019 | Lee et al. | |
| 2011/0089850 A1 | 4/2011 | Shibata et al. | |
| 2013/0027623 A1* | 1/2013 | Negishi | F21K 9/00 |
| | | | 438/30 |
| 2014/0138630 A1 | 5/2014 | Lee et al. | |
| 2015/0084026 A1 | 3/2015 | Miyamoto et al. | |
| 2018/0151120 A1* | 5/2018 | Kim | H10K 59/1213 |
| 2018/0211979 A1 | 7/2018 | Lee et al. | |
| 2019/0013370 A1 | 1/2019 | Nie | |
| 2019/0305035 A1 | 10/2019 | Cho et al. | |
| 2020/0013766 A1 | 1/2020 | Kim | |
| 2020/0168667 A1 | 5/2020 | Kim et al. | |

FOREIGN PATENT DOCUMENTS

| | | | |
|---|---|---|---|
| KR | 2014-0064523 A | 5/2014 |
| KR | 10-1490758 B1 | 2/2015 |
| KR | 20180087908 A | 8/2018 |
| KR | 2018-0114413 A | 10/2018 |
| KR | 2019-0115160 A | 10/2019 |
| KR | 10-2019251 B1 | 11/2019 |
| KR | 2020-0001649 A | 1/2020 |
| KR | 2020-0005692 A | 1/2020 |
| TW | 201935100 A | 9/2019 |

OTHER PUBLICATIONS

Extended European Search Report dated Aug. 8, 2024 for corresponding European Application No. 21851305.9 (10 pages).
Office Action dated Sep. 1, 2025 regarding Taiwanese Patent Application No. 110127746 corresponding to U.S. Appl. No. 18/018,255 (10 pages).

* cited by examiner

DISPLAY DEVICE

CROSS REFERENCE TO RELATED APPLICATION(S)

This application is a U.S. National Phase Patent Application of International Patent Application No. PCT/KR2021/005604, filed on May 4, 2021, which claims priority to and the benefit of Korean Patent Application No. 10-2020-0093960, filed on Jul. 28, 2020, in the Korean Intellectual Property Office (KIPO), the entire contents of all of which are incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects and features of embodiments of the present disclosure provide a rear emission type light emitting display device including an inorganic light emitting element.

It should be noted that aspects and features of embodiments of the present disclosure are not limited thereto and other aspects and features, which are not mentioned herein, will be apparent to those of ordinary skill in the art from the following description.

According to one or more embodiments of the present disclosure, a display device including: a first substrate on which a plurality of sub-pixels are located, a plurality of color filter layers on the first substrate, a bank layer including a first bank at a boundary between the plurality of sub-pixels and located on the color filter layers, a color control structure including a plurality of light transmitting layers and wavelength conversion layers in a region surrounded by the first bank on the color filter layer, a light emitting element layer between the color filter layer and the color control structure, a reflective layer on the color control structure, and a first electrode and a second electrode on the color filter layer and at least partially located at the same plane, wherein the light emitting element layer includes a plurality of light emitting elements, each of the plurality of light emitting elements having respective ends on the first electrode and the second electrode.

The color filter layer may include a first color filter layer in a first sub-pixel and a second color filter layer in a second sub-pixel, the light emitting element layer may include a first light emitting element layer in the first sub-pixel and a second light emitting element layer in the second sub-pixel, and the color control structure may include a first light transmitting layer in the first sub-pixel and a first wavelength conversion layer in the second sub-pixel.

Light emitted from the first light emitting element layer may be reflected from the reflective layer while passing through the light transmitting layer and may be emitted to a bottom surface of the first substrate through the first color filter layer, and light emitted from the second light emitting element layer may be reflected from the reflective layer while passing through the first wavelength conversion layer and be emitted to the bottom surface of the first substrate through the second color filter layer.

The light emitting element layer may be configured to emit light of a first color, and the first sub-pixel configured to emit light of the first color, and the second sub-pixel may be configured to emit light of a second color different from the first color.

The color filter layer may further include a third color filter layer in a third sub-pixel, the light emitting element layer may further include a third light emitting element layer in the third sub-pixel, the color control structure may further include a second wavelength conversion layer in the third sub-pixel, and the third sub-pixel may be configured to emit light of a third color that is different from the first color and the second color.

The display device may further include a light blocking member surrounding the first color filter layer and the second color filter layer and overlapping the first bank in a thickness direction of the display device.

The display device may further include a circuit layer between the first substrate and the color filter layer and including at least one first transistor and a plurality of wirings, wherein the first electrode and the second electrode of the light emitting element may be electrically connected to the first transistor and the plurality of wirings, respectively.

The display device may further include a first planarization layer between the color filter layer and the circuit layer, wherein the color filter layer may be directly on the first planarization layer.

The first electrode may be electrically connected to the first transistor through a first contact hole penetrating the light blocking member and the first planarization layer, and the second electrode may be electrically connected to the plurality of wiring through a second contact hole penetrating the light blocking member and the first planarization layer.

The plurality of wirings and the first transistor of the circuit layer may overlap the first bank in the thickness direction of the display device.

The first bank may be surrounding the sub-pixels, the plurality of light emitting elements of the light emitting element layer may be in the sub-pixel, and the light transmitting layer and the wavelength conversion layers may be on the light emitting elements in a region surrounded by the first bank.

The bank layer may further include a plurality of second banks on the color filter layer in a region surrounded by the first bank, and the first electrode and the second electrode may be on the plurality of second banks, and are at least partially directly on the color filter layer.

The display device may further include a first insulating layer on the color filter layer and the plurality of second banks, wherein the first bank may be directly on the first insulating layer.

The first insulating layer may partially cover the first electrode and the second electrode of the light emitting element layer.

The reflective layer may be on the first bank.

The reflective layer may include a metal material or a low refractive material.

The display device may further include an encapsulation layer on the reflective layer, wherein the encapsulation layer may include a first inorganic encapsulation layer, a second inorganic encapsulation layer on the first inorganic encapsulation layer, and an organic encapsulation layer between the first inorganic encapsulation layer and the second inorganic encapsulation layer.

The light emitting element layer may further include a first contact electrode in contact with one end of the light emitting element and the first electrode, and a second contact electrode in contact with an other end of the light emitting element and the second electrode.

According to one or more embodiments of the present disclosure, a display device including: a plurality of sub-pixels arranged along a first direction and a second direction, a bank layer at a boundary between the plurality of sub-pixels and extending in the first direction and the second direction, a first color filter layer in a first sub-pixel and a second color filter layer in a second sub-pixel located in the second direction of the first sub-pixel, a light emitting element layer including a first electrode and a second electrode respectively located in the first sub-pixel and the second sub-pixel and extending in the first direction and a plurality of light emitting elements, each of the plurality of light emitting elements having respective ends on the first electrode and the second electrode, a color control structure including a light transmitting layer in the first sub-pixel and a first wavelength conversion layer in the second sub-pixel in a region surrounded by the bank layer, and a reflective layer covering the color control structure and the bank layer.

The display device may further include a light blocking member overlapping the bank layer and surrounding the first color filter layer and the second color filter layer.

A width of the light blocking member may be smaller than a width of the bank layer, and the first color filter layer and the second color filter layer may partially overlap the bank layer.

The light transmitting layer and the first wavelength conversion layer may have widths measured in the second direction that are smaller than widths measured in the second direction of the first color filter layer and the second color filter layer, respectively.

The display device may further include a third color filter layer in a third sub-pixel located in the second direction of the second sub-pixel, and a second wavelength conversion layer in the third sub-pixel.

The first color filter layer and the second color filter layer may extend in the first direction and are over the bank layer, and the light blocking member may have a shape extending in the first direction.

The details of other embodiments are included in the detailed description and the accompanying drawings.

A display device according to one or more embodiments may implement a rear emission type light emitting display device that includes a reflective layer on a color control structure to emit light emitted from a light emitting element layer to the bottom surface of a substrate on which the light emitting element layer is located.

Further, in a display device according to one or more embodiments, the color filter layer, the light emitting element layer, and the color control structure are sequentially located on the substrate, so that processes may be continuously performed on one substrate, thereby improving the manufacturing process efficiency of the display device.

The effects, aspects, and features according to one or more embodiments are not limited by the contents exemplified above, and more various effects, aspects, and features are included in the present disclosure.

DETAILED DESCRIPTION

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
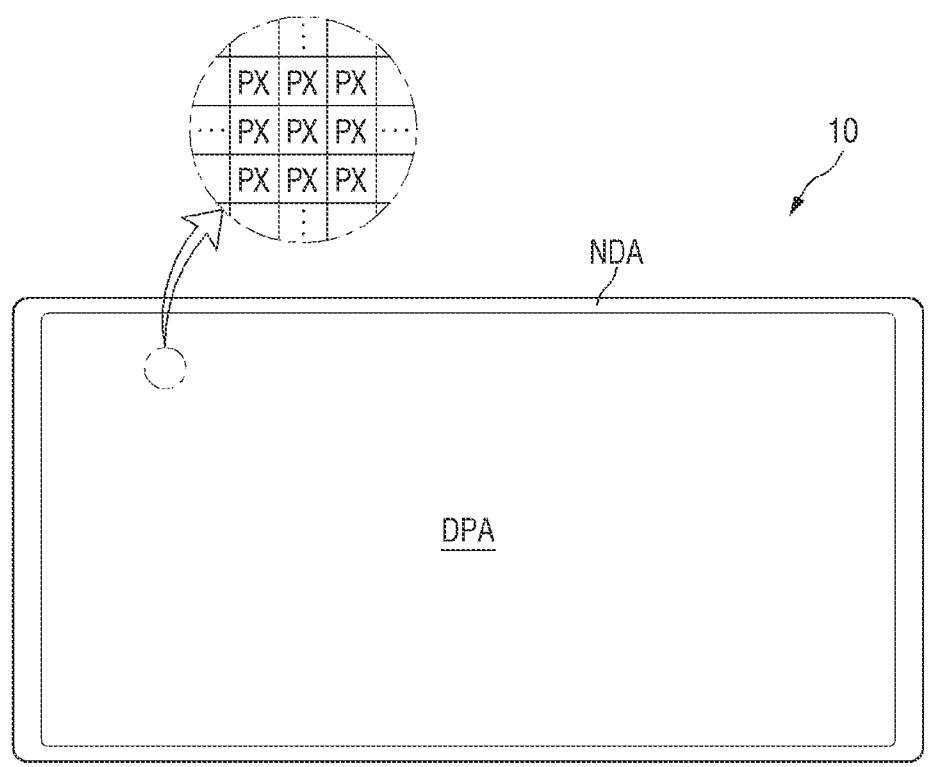
FIG. 1 is a schematic plan view of a display device according to one or more embodiments.

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include the display area DPA and a non-display area NDA around an edge or periphery of the display area DPA. The display area DPA is an area where an image can be displayed, and the non-display area NDA is an area where no image is displayed. The display area DPA may also be referred to as an active region, and the non-display area NDA may also be referred to as a non-active region. The display area DPA may substantially occupy the center (or the central region) of the display device 10.

The display area DPA may include a plurality of pixels PX. The plurality of pixels PX may be arranged in a matrix. The shape of each pixel PX may be a rectangular or square shape in a plan view. However, the present disclosure is not limited thereto, and it may be a rhombic shape in which each side is inclined with respect to one direction. The pixels PX may be alternately arranged in a stripe type or a PENTILE arrangement structure, or the like. The PENTILE pixel arrangement structure may be referred to as an RGBG matrix structure (e.g., a PENTILE® matrix structure or an RGBG structure (e.g., a PENTILE structure)). PENTILE is a registered trademark of Samsung Display Co., Ltd., Republic of Koreas. In addition, each of the pixels PX may include one or more light emitting elements 30 that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wirings or circuit drivers included in the display device 10 may be disposed in the non-display area NDA, or external devices may be mounted thereon.

Figure 2:
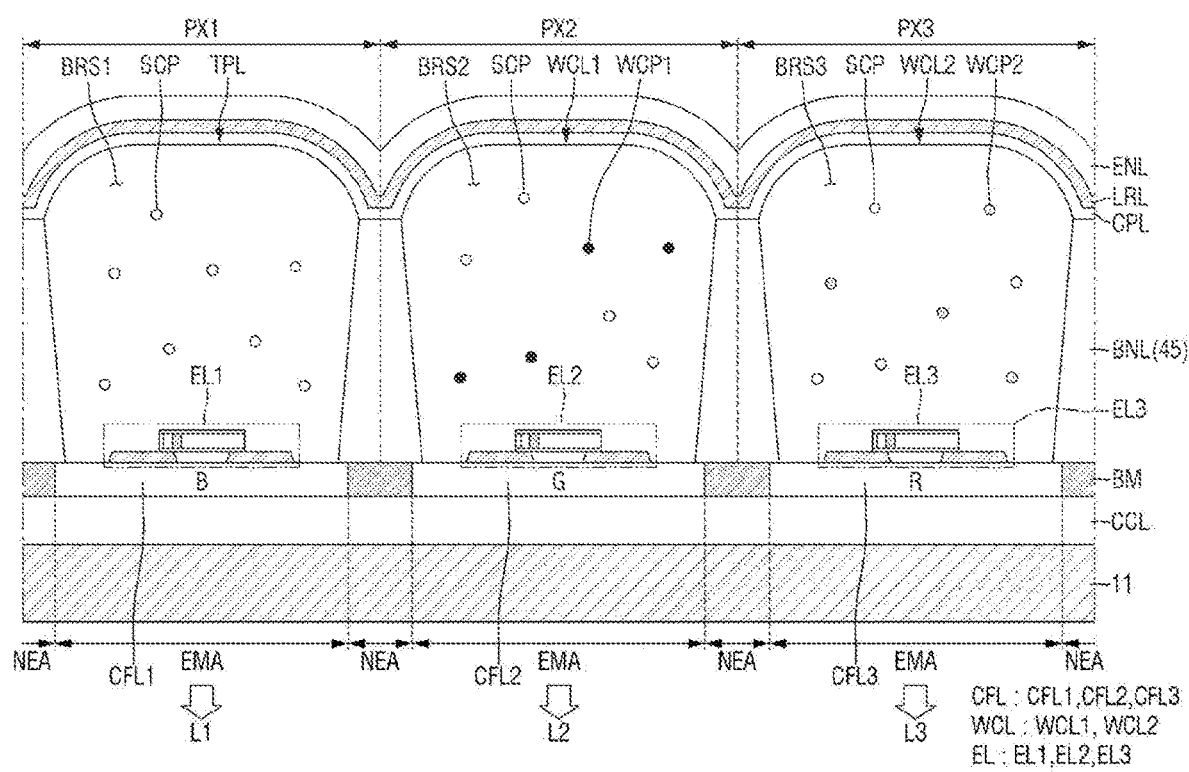
FIG. 2 is a schematic cross-sectional view of the display device of FIG. 1.

FIG. 2 is a schematic cross-sectional view of the display device of FIG. 1.

Referring to FIG. 2, each of the plurality of pixels PX may include a plurality of sub-pixels PXn (n being an integer of 1 to 3). For example, one pixel PX may include a first sub-pixel PX1, a second sub-pixel PX2 and a third sub-pixel PX3. The first sub-pixel PX1 may emit light L1 of a first color, the second sub-pixel PX2 may emit light L2 of a second color, and the third sub-pixel PX3 may emit light L3 of a third color. The first color may be blue, the second color may be green, and the third color may be red. However, the present disclosure is not limited thereto, and the sub-pixels PXn may emit light of the same color. In addition, although FIG. 2 illustrates that the pixel PX includes three sub-pixels PXn, the present disclosure is not limited thereto, and the pixel PX may include a larger number of sub-pixels PXn.

Each sub-pixel PXn of the display device 10 may include an emission area EMA and a non-emission area NEA. The emission area EMA may be an area in which a light emitting element layer EL is disposed to emit light of a specific wavelength band, and the non-emission area may be an area in which the light emitting element layer EL is not disposed and from which no light is emitted because the aforementioned lights do not reach there.

The display device 10 includes a first substrate 11 and a color filter layer CFL, a light emitting element layer EL, color control structures TPL and WCL, and a reflective layer LRL that are disposed on the first substrate 11. In addition, the display device 10 may further include a circuit layer CCL disposed between the first substrate 11 and the color filter layer CFL and an encapsulation layer ENL disposed on the reflective layer LRL. The circuit layer CCL, the color filter layer CFL, the light emitting element layer EL, the color control structures TPL and WCL, and the reflective layer LRL may be sequentially disposed on the first substrate 11.

A bank layer BNL may be disposed at the boundary between the plurality of sub-pixels PXn, and the light emitting element layer EL may be disposed for each sub-pixel PXn separated by the bank layer BNL. The light emitting element layer EL may be disposed between the color control structures TPL and WCL and the color filter layer CFL disposed on the first substrate 11, and may include a plurality of light emitting elements 30 (see FIG. 4) to emit light of a specific wavelength band. The light may be reflected from the reflective layer LRL through the color control structures TPL and WCL to be incident on the color filter layer CFL. The display device 10 according to one or more embodiments may be a rear emission type light emitting display device in which light L is emitted not in an upward direction of the first substrate 11 on which the light emitting element layer EL is disposed but in an opposite direction thereof or in a downward direction of the first substrate 11. The light emitted from the light emitting element layer EL may travel in the upward direction of the first substrate 11, but may be reflected from the reflective layer LRL disposed on the color control structures TPL and WCL and emitted in the downward direction of the first substrate 11. The display device 10 may be a rear emission type light emitting display device including only one substrate, including the plurality of layers sequentially disposed on the first substrate 11. Further, the display device 10 can be manufactured by sequentially stacking the layers using only one substrate while omitting a process of bonding the substrate to another substrate, so that the manufacturing process can be improved.

Hereinafter, the color filter layer CFL, the light emitting element layer EL, and the color control structures TPL and WCL will be described in detail with further reference to other drawings.

Figure 3:
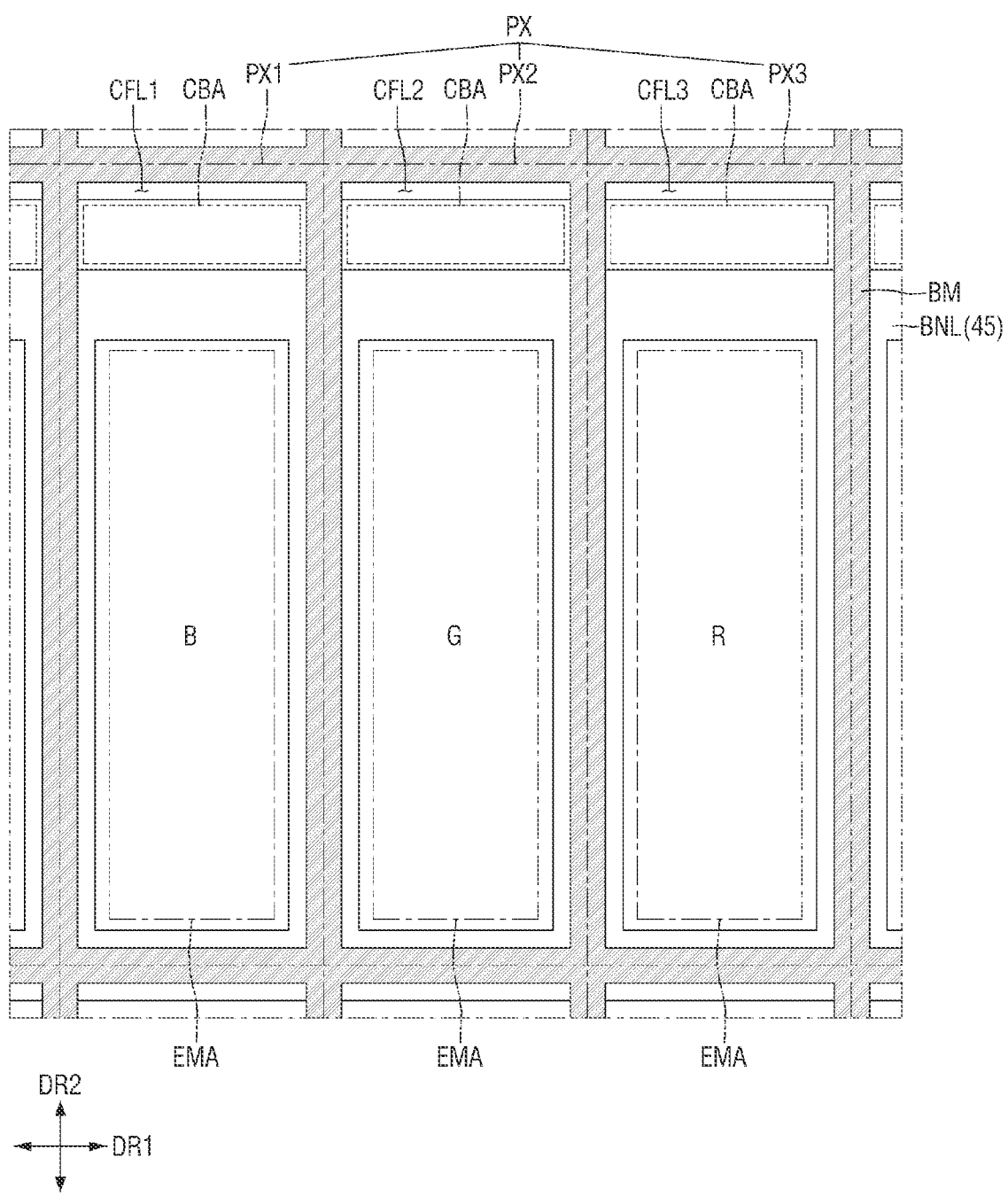
FIG. 3 is a schematic plan view showing a color filter layer disposed in one pixel of a display device according to one or more embodiments.
Figure 4:
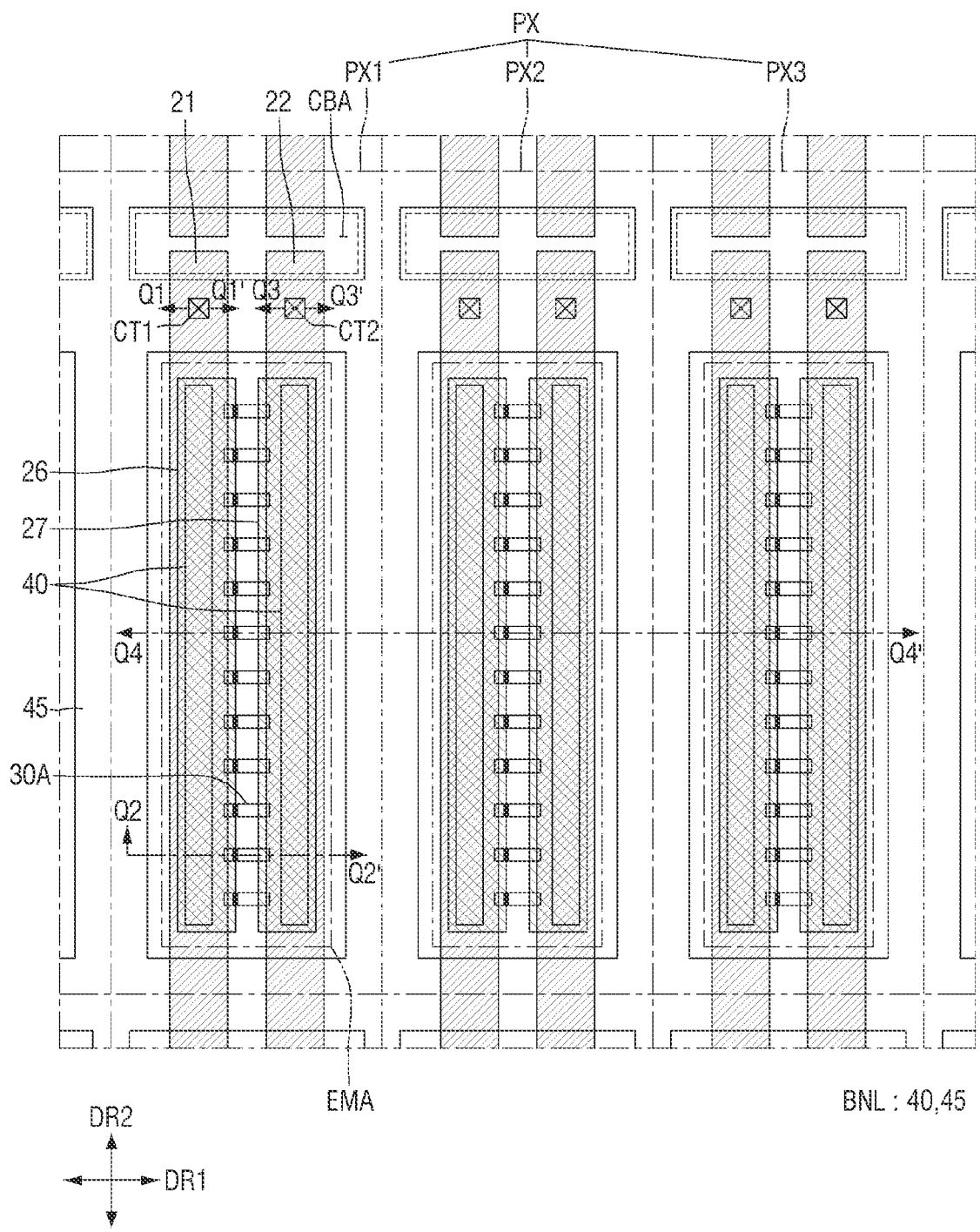
FIG. 4 is a schematic plan view showing a light emitting element layer disposed in one pixel of a display device according to one or more embodiments.
Figure 5:
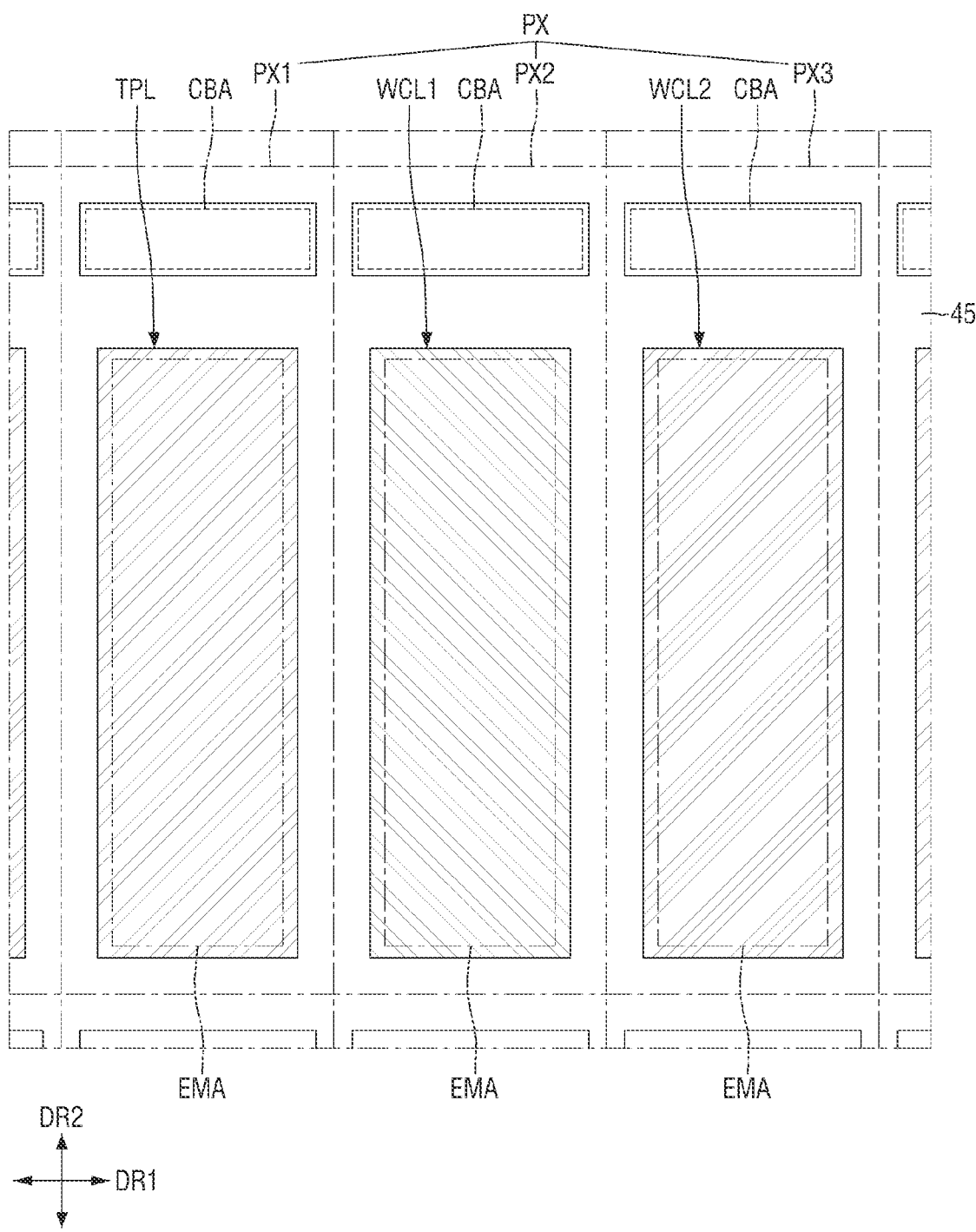
FIG. 5 is a schematic plan view showing a color control structure disposed in one pixel of a display device according to one or more embodiments.
Figure 6:
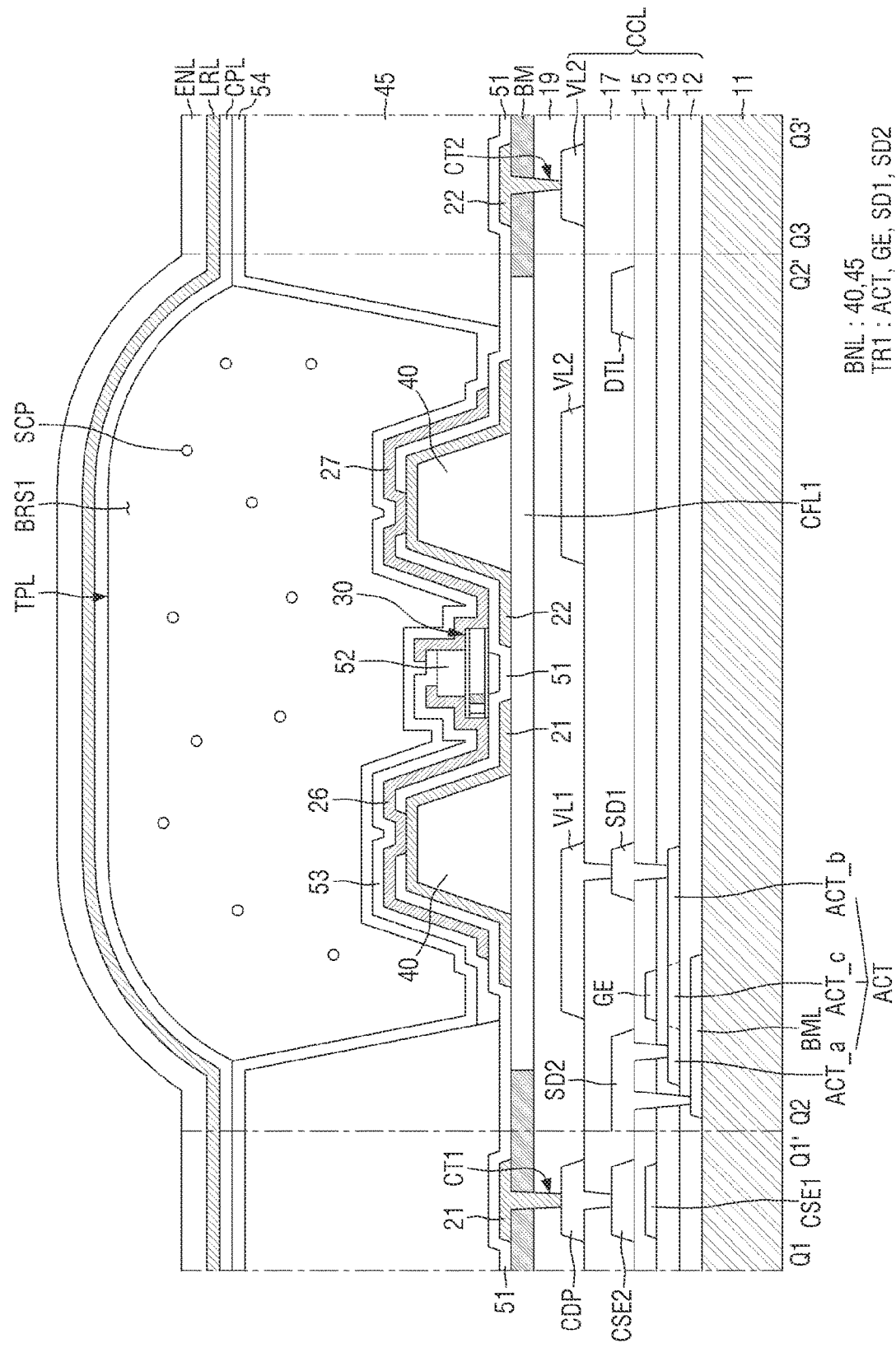
FIG. 6 is a cross-sectional view taken along the lines Q1-Q1', Q2-Q2', and Q3-Q3' of FIG. 4.
Figure 7:
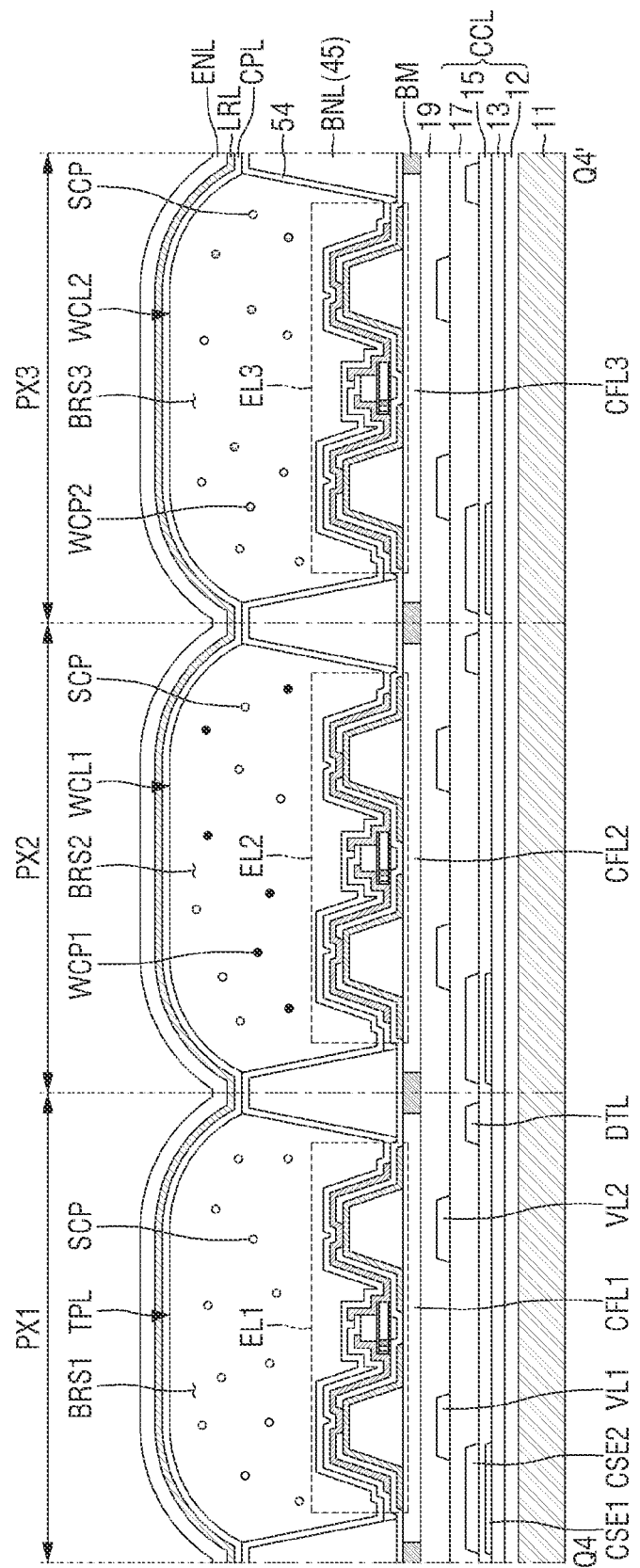
FIG. 7 is a cross-sectional view taken along the line Q4-Q4' of FIG. 4.

FIG. 3 is a schematic plan view showing a color filter layer disposed in one pixel of a display device according to one or more embodiments. FIG. 4 is a schematic plan view showing a light emitting element layer disposed in one pixel of a display device according to one or more embodiments. FIG. 5 is a schematic plan view showing a color control structure disposed in one pixel of a display device according to one or more embodiments. FIG. 6 is a cross-sectional view taken along the lines Q1-Q1', Q2-Q2', and Q3-Q3' of FIG. 4. FIG. 7 is a cross-sectional view taken along the line Q4-Q4' of FIG. 4. FIGS. 3 to 5 illustrate schematic arrangement of the color filter layer CFL, the light emitting element layer EL, and the color control structures TPL and WCL with respect to the bank layer BNL disposed across the boundary between the plurality of sub-pixels PXn. FIG. 3 illustrates the color filter layer CFL and a light blocking member BM, FIG. 4 illustrates the light emitting element layer EL, and FIG. 5 illustrates the color control structures TPL and WCL. FIG. 6 illustrates a cross section of the first sub-pixel PX1, and FIG. 7 illustrates a cross section of the first to third sub-pixels PX1, PX2, and PX3. FIGS. 6 and 7 also illustrate the color filter layer CFL and the color control structures TPL and WCL disposed at portions corresponding to the cutting lines of FIG. 4.

Referring to FIGS. 3 to 7 in conjunction with FIG. 2, the bank layer BNL or a first bank 45 is disposed across the boundary of each sub-pixel PXn. The bank layer BNL may be disposed to extend in the first direction DR1 and the second direction DR2, and surrounds the sub-pixel PXn while separating the neighboring sub-pixels PXn.

Each sub-pixel PXn may include a non-emission area ('NEA' in FIG. 2) in addition to the emission area EMA. Further, each sub-pixel PXn may include a sub-region CBA disposed in the non-emission area NEA. The sub-region CBA may be disposed on one side of the emission area EMA in a second direction DR2. The sub-region CBA may be disposed between the emission areas EMA of the sub-pixels PXn adjacent in the second direction DR2. The plurality of emission areas EMA and sub-regions CBA may be arranged in the display area DPA of the display device 10. For example, the plurality of emission areas EMA and the plurality of sub-regions CBA may each be repeatedly disposed along the first direction DR1 and alternately disposed along the second direction DR2. In addition, the separation distance between the sub-regions CBA in the first direction DR1 may be smaller than the separation distance between the emission areas EMA in the first direction DR1. A first bank 45 may be disposed between the sub-region CBA and the emission area EMA, and the gap therebetween may vary according to the width of the first bank 45. Although light is not emitted from the sub-region CBA because of no light emitting element 30 disposed therein, a part of electrodes 21 and 22 provided in each sub-pixel PXn may be disposed in the sub-region CBA. The electrodes 21 and 22 provided in each sub-pixel PXn may be disposed separately from each other in the sub-region CBA.

The first substrate 11 may be an insulating substrate. The first substrate 11 may be made of a transparent insulating material such as glass, quartz, or polymer resin. Further, the first substrate 11 may be a rigid substrate, but may also be a flexible substrate that can be bent, folded or rolled.

The circuit layer CCL is disposed on the first substrate 11. The circuit layer CCL may include a first conductive layer, a semiconductor layer, a second conductive layer, a third conductive layer, and a fourth conductive layer, and a plurality of insulating layers disposed therebetween. Although it is illustrated in the drawing that the circuit layer CCL includes only one first transistor TR1, a storage capacitor (e.g., CSE1, CSE2), and some wirings, the present disclosure is not limited thereto. The circuit layer CCL of the display device 10 may include a larger number of transistors in addition to the first transistor TR1, including more wirings, electrodes, and semiconductor layers. For example, the display device 10 may include two or three transistors by further including one or more transistors in addition to the first transistor TR1 for each sub-pixel PXn.

The first conductive layer BML may be disposed on the first substrate 11. The first conductive layer BML is disposed to overlap an active layer ACT of the first transistor TR1 of the display device 10 in a thickness direction of the first substrate 11. The first conductive layer BML may include a material of blocking light to prevent light from reaching the active layer ACT of the first transistor TR1. For example, the first conductive layer BML may be formed of an opaque metal material that blocks transmission of light. However, the present disclosure is not limited thereto, and in some cases, the first conductive layer BML may be omitted.

A buffer layer 12 may be entirely disposed on the first conductive layer BML and the first substrate 11. The buffer layer 12 may be formed on the first substrate 11 to protect the first transistors TR1 of the pixel PX from moisture permeating through the first substrate 11 susceptible to moisture permeation, and may perform a surface planarization function. The buffer layer 12 may be formed of a plurality of inorganic layers that are alternately stacked. For example, the buffer layer 12 may be formed as a double layer formed by stacking, or a multilayer formed by alternately stacking, inorganic layers including at least one of silicon oxide (SiOx), silicon nitride (SiNx), or silicon oxynitride (SiOxNy). Alternatively, each of the layers may be formed of a single inorganic layer including those materials.

The semiconductor layer is disposed on the buffer layer 12. The semiconductor layer may include the active layer ACT of the first transistor TR1. The active layer ACT may be disposed to partially overlap, in the thickness direction of the first substrate 11, a gate electrode GE of the second conductive layer, which will be described later.

In one or more embodiments, the semiconductor layer may include polycrystalline silicon, monocrystalline silicon, oxide semiconductor, or the like. When the semiconductor layer includes the oxide semiconductor, each active layer ACT may include a plurality of conductive regions ACT_a and ACT_b and a channel region ACT_c between them. The oxide semiconductor may be an oxide semiconductor containing indium (In). In one or more embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

In one or more embodiments, the semiconductor layer may include polycrystalline silicon. The polycrystalline silicon may be formed by crystallizing amorphous silicon. In this case, the conductive regions of the active layer ACT may be regions doped with impurities.

The first gate insulating layer 13 is disposed on the semiconductor layer and the buffer layer 12. The first gate insulating layer 13 may function as a gate insulating layer of each transistor. The first gate insulating layer 13 may be formed as a double layer formed by stacking, or a multilayer formed by alternately stacking, inorganic layers including at least one of silicon oxide (SiOx), silicon nitride (SiNx), or silicon oxynitride (SiOxNy). Alternatively, each of the layers may be formed of a single inorganic layer including those materials.

The second conductive layer is disposed on the first gate insulating layer 13. The second conductive layer may include the gate electrode GE of the first transistor TR1 and a first capacitance electrode CSE1 of the storage capacitor. The gate electrode GE may be disposed to overlap the channel region ACT_c of the active layer ACT in the thickness direction of the first substrate 11. The first capacitive electrode CSE1 may be disposed to overlap a second capacitive electrode CSE2 to be described later in the thickness direction of the first substrate 11. In one or more embodiments, the first capacitive electrode CSE1 may be connected to and integrated with the gate electrode GE. The first capacitive electrode CSE1 is disposed to overlap the second capacitive electrode CSE2 in the thickness direction of the first substrate 11, and a storage capacitor may be formed therebetween.

The second conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A first passivation layer 15 is disposed on the second conductive layer and the first gate insulating layer 13. The first passivation layer 15 may be disposed to cover the second conductive layer to protect it. The first passivation layer 15 may be formed as a double layer formed by stacking, or a multilayer formed by alternately stacking, inorganic layers including at least one of silicon oxide (SiOx), silicon nitride (SiNx), or silicon oxynitride (SiOxNy). Alternatively, each of the layers may be formed of a single inorganic layer including those materials.

The third conductive layer is disposed on the first passivation layer 15. The third conductive layer may include a first source/drain electrode SD1 and a second source/drain electrode SD2 of the first transistor TR1, a data line DTL, and the second capacitive electrode CSE2.

The source/drain electrodes SD1 and SD2 of the first transistor TR1 may be in contact with the doped regions ACTb and ACTa of the active layer ACT, respectively, through contact holes penetrating the first passivation layer 15 and the first gate insulating layer 13. Further, the first source/drain electrode SD1 of the first transistor TR1 may be electrically connected to the first conductive layer BML through another contact hole penetrating through the first passivation layer 15, the first gate insulating layer 13, and the buffer layer 12.

The data line DTL may apply a data signal to another transistor included in the display device 10. In one or more embodiments, the data line DTL may be connected to a source/drain electrode of another transistor to transfer a signal applied from the data line DTL.

The second capacitive electrode CSE2 is disposed to overlap the first capacitive electrode CSE1 in the thickness direction of the first substrate 11. In one or more embodiments, the second capacitive electrode CSE2 may be connected to and integrated with the second source/drain electrode SD2.

The third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

The first interlayer insulating layer 17 is disposed on the third conductive layer and the first passivation layer 15. The first interlayer insulating layer 17 may function as an insulating layer between the third conductive layer and other layers disposed thereon. Further, the first interlayer insulating layer 17 may cover the third conductive layer to protect the third conductive layer. The first interlayer insulating layer 17 may be formed as a double layer formed by stacking, or a multilayer formed by alternately stacking, inorganic layers including at least one of silicon oxide (SiOx), silicon nitride (SiNx), or silicon oxynitride (SiOxNy). Alternatively, each of the layers may be formed of a single inorganic layer including those materials.

The fourth conductive layer is disposed on the first interlayer insulating layer 17. The fourth conductive layer may include a first voltage line VL1, a second voltage line VL2, and a first conductive pattern CDP. The first voltage line VL1 may receive a high potential voltage (or a first source voltage) that is supplied to the first transistor TR1, and the second voltage line VL2 may receive a low potential voltage (or a second source voltage) that is supplied to the second electrode 22. For example, the first voltage line VL1 may be connected to the first source/drain electrode SD1 of the first transistor TR1 through a contact hole penetrating the first interlayer insulating layer 17. Also, during the manufacturing process of the display device 10, the second voltage line VL2 may receive an alignment signal required to align the light emitting element 30.

The first conductive pattern CDP may be connected to the second capacitive electrode CSE2 through a contact hole formed in the first interlayer insulating layer 17. However, as described above, the second capacitive electrode CSE2 may be integrated with the second source/drain electrode SD2 of the first transistor TR1, and the first conductive pattern CDP may be electrically connected to the second source/drain electrode SD2. The first conductive pattern CDP may also be in contact with the first electrode 21 to be described later, and the first transistor TR1 may transfer the first source voltage applied from the first voltage line VL1 to the first electrode 21 through the first conductive pattern CDP. Although it is illustrated in the drawing that the fourth conductive layer includes one second voltage line VL2 and one first voltage line VL1, the present disclosure is not limited thereto. The fourth conductive layer may include a larger number of first voltage lines VL1 and second voltage lines VL2.

The fourth conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A first planarization layer 19 is disposed on the fourth conductive layer. The first planarization layer 19 may include an organic insulating material, for example, an organic material such as polyimide (PI), to perform a surface planarization function. However, in one or more embodiments, the first planarization layer 19 may be omitted.

The color filter layer CFL and the light blocking member BM are disposed on the first planarization layer 19. In the display device 10 according to one or more embodiments, the color filter layer CFL may be disposed between the light emitting element layer EL from which light is emitted and the first substrate 11 from which light is emitted. The color filter layer CFL may transmit only a part of the light incident through the light emitting element layer EL, the color control structures TPL and WCL, and the reflective layer LRL to the bottom surface of the first substrate 11 as will be described later.

The light blocking member BM may overlap the bank layer BNL in the thickness direction of the first substrate 11, and may be positioned in the non-emission area NEA. The light blocking member BM may include openings exposing one surface of the first planarization layer 19 overlapping the emission area EMA and thus may be formed in a grid shape in a plan view. However, the light blocking member BM may not be disposed between the sub-region CBA and the emission area EMA of each sub-pixel PXn. The light blocking member BM is disposed to overlap a portion of the bank layer BNL that is disposed across the boundary between the sub-pixels PXn. That is, the light blocking member BM may not necessarily arranged to surround only the emission area EMA, but may include a part of the non-emission area NEA to be located at the boundary of the sub-pixel PXn at which the color filter layer CFL is located. In one or more embodiments, the light blocking member BM may be formed to have a width smaller than that of the first bank 45 of the bank layer BNL. However, the present disclosure is not limited thereto, and the light blocking member BM may be formed to have substantially the same width as that of the first bank 45.

The light blocking member BM may include an organic material. The light blocking member BM may reduce color distortion due to external light reflection by absorbing the external light. Further, the light blocking member BM may serve to prevent light emitted from the light emitting element layer EL from entering the adjacent sub-pixels PXn. In one or more embodiments, the light blocking member BM may absorb all visible wavelengths. The light blocking member BM may include a light absorbing material. For example, the light blocking member BM may be formed of a material used as a black matrix of the display device 10. In one or more embodiments, the light blocking member BM may absorb light of specific wavelengths from among visible wavelengths and transmit light of other wavelengths. For example, the light blocking member BM may include the same material as one of color filter layers CFL. Specifically, the light blocking member BM may be formed of the same material as the first color filter layer CFL1. In some embodiments, the light blocking member BM may be integrally formed with the first color filter layer.

The color filter layers CFL may be provided on the first planarization layer 19 that is exposed through the openings of the light blocking member BM. The color filter layer CFL may include a first color filter layer CFL1 disposed in the first sub-pixel PX1, a second color filter layer CFL2 disposed in the second sub-pixel PX2, and a third color filter layer CFL3 disposed in the third sub-pixel PX3. Each color filter layer CFL may contain a colorant such as a dye or a pigment that absorbs a wavelength other than the wavelength of the color displayed by each sub-pixel PXn. The first color filter layer CFL1 may be a blue color filter layer, the second color filter layer CFL2 may be a green color filter layer, and the third color filter layer CFL3 may be a red color filter layer. Lights emitted from the light emitting element layer EL may be reflected from the reflective layer LRL and emitted to the bottom surface of the first substrate 11 through the color filter layer CFL. In the drawing, neighboring color filter layers CFL are disposed to be spaced from each other with respect to the light blocking member BM, but the neighboring color filter layers CFL may partially overlap each other on the light blocking member BM.

In one or more embodiments, the opening of the light blocking member BM may have a different area for each sub-pixel PXn. The opening of the light blocking member BM may have a different area for each sub-pixel PXn depending on the colorant contained in the color filter layer CFL, and the first bank 45 is disposed to correspond thereto, so that the sub-pixels PXn may have different areas. For example, the third color filter layer CFL3 containing a red colorant may be disposed in the third sub-pixel PX3, and the area of the third sub-pixel PX3 may be greater than those of the first sub-pixel PX1 and the second sub-pixel PX2. Further, the second color filter layer CFL2 containing a green colorant may be disposed in the second sub-pixel PX2, and the area of the second sub-pixel PX2 may be greater than that of the first sub-pixel PX1. However, the present disclosure is not limited thereto. The area of at least one of the plurality of sub-pixels PXn may be different from those of the other sub-pixels PXn, and the size relationship therebetween may be different from the above-described example. In the display device 10, the area of each sub-pixel PXn may be designed to be different to prevent degradation of display quality that might be caused by reflection of external light.

The color filter layer CFL may be disposed across the emission area EMA and the sub-region CBA in each sub-pixel PXn. Although it is illustrated in the drawing that the color filter layer CFL is disposed for each sub-pixel PXn individually to form island-shaped patterns, the present disclosure is not limited thereto. The color filter layer CFL may form a linear pattern in the entire display area DPA. Further, the light blocking member BM may have a width smaller than that of the first bank 45 of the bank layer BNL, and the color filter layer CFL may partially overlap the first bank 45 in the thickness direction of the first substrate 11.

The bank layer BNL and the light emitting element layer EL are disposed on the color filter layer CFL. The bank layer BNL may further include the first bank 45 disposed at the boundary between the sub-pixels PXn or between the emission area EMA and the sub-region CBA, and second banks 40 disposed in the emission area EMA of each sub-pixel PXn on the color filter layer CFL. The light emitting element layer EL includes a first light emitting element layer EL1 disposed in the first sub-pixel PX1, a second light emitting element layer EL2 disposed in the second sub-pixel PX2, and a third light emitting element layer EL3 disposed in the third sub-pixel PX3. Each of the light emitting element layers EL may include a plurality of electrodes 21 and 22, a light emitting element 30, and a plurality of contact electrodes 26 and 27. In addition, the light emitting element layer EL may further include a plurality of insulating layers 51, 52, 53, and 54.

In one or more embodiments, the second banks 40 of the bank layer BNL may be directly disposed on the color filter layer CFL. The plurality of second banks 40 may extend in the second direction DR2 in each sub-pixel PXn without extending to another sub-pixel PXn adjacent in the second direction DR2 and may be disposed in the emission area EMA. Further, the plurality of second banks 40 may be disposed to be spaced from each other in the first direction DR1, and a region in which the light emitting element 30 is disposed may be formed therebetween. The plurality of second banks 40 may be disposed for each sub-pixel PXn to form a linear pattern in the display area DPA of the display device 10. In the drawing, two second banks 40 are illustrated, but the present disclosure is not limited thereto. A larger number of second banks 40 may be further arranged according to the number of electrodes 21 and 22 to be described later.

The second bank 40 may have a structure in which at least a portion thereof protrudes from the top surface of the color filter layer CFL. The protruding portion of the second bank 40 may have an inclined side surface, and light emitted from the light emitting element 30 may proceed toward the inclined side surface of the second bank 40. The electrodes 21 and 22 disposed on the second bank 40 may include a material having high reflectivity, and light emitted from the light emitting element 30 may be reflected from the electrodes 21 and 22 disposed on the side surface of the second bank 40 to be incident on the color control structures TPL and WCL. That is, the second bank 40 may provide a region in which the light emitting elements 30 are disposed, and may also function as a reflective wall that reflects light emitted from the light emitting elements 30 upward towards the reflective layer LRL. The side surface of the second bank 40 may be inclined in a linear shape, but is not limited thereto, and the outer surface of the second bank 40 may have a curved semi-circle or semi-ellipse shape. In one or more embodiments, the second banks 40 may include an organic insulating material such as polyimide (PI), but are not limited thereto.

The plurality of electrodes 21 and 22 are disposed on the second bank 40 and the color filter layer CFL. The plurality of electrodes 21 and 22 may include a first electrode 21 and a second electrode 22. The first electrode 21 and the second electrode 22 may extend in the second direction DR2, and may be disposed to be spaced from each other in the first direction DR1.

Each of the first electrode 21 and the second electrode 22 may extend in the second direction DR2 within the sub-pixel PXn, but may be separated from the other electrodes 21 and 22 in the sub-region CBA. In one or more embodiments, the first electrode 21 and the second electrode 22 may be separated from another first electrode 21 and another second electrode 22 disposed in the sub-pixel PXn adjacent in the second direction DR2 in the sub-region CBA. However, the present disclosure is not limited thereto, and some of the electrodes 21 and 22 may be arranged to extend beyond the adjacent sub-pixel PXn in the second direction DR2 without being separated for each sub-pixel PXn, or only one of the first electrode 21 and the second electrode 22 may be separated.

The first electrode 21 may be electrically connected to the first transistor TR1 through a first contact hole CT1, and the second electrode 22 may be electrically connected to the second voltage line VL2 through a second contact hole CT2. For example, the first electrode 21 may be in contact with the first conductive pattern CDP through the first contact hole CT1 penetrating the light blocking member BM and the first planarization layer 19 in a portion of the first bank 45 extending in the first direction DR1. The second electrode 22 may also be in contact with the second voltage line VL2 through the second contact hole CT2 penetrating the light blocking member BM and the first planarization layer 19 in a portion of the first bank 45 extending in the first direction DR1. However, the present disclosure is not limited thereto. In one or more embodiments, the first contact hole CT1 and the second contact hole CT2 may be disposed in the emission area EMA surrounded by the first bank 45 so as not to overlap the first bank 45. In this case, each of the first contact hole CT1 and the second contact hole CT2 may penetrate the color filter layer CFL and the first planarization layer 19.

Although it is illustrated in the drawing that one first electrode 21 and one second electrode 22 are disposed for each sub-pixel PXn, the present disclosure is not limited thereto. In one or more embodiments, a larger number of the first electrodes 21 and the second electrodes 22 may be disposed for each sub-pixel PXn. In addition, the first electrode 21 and the second electrode 22 disposed in each sub-pixel PXn may not necessarily have a shape extending in one direction, and the first electrode 21 and the second electrode 22 may be arranged in various structures. For example, the first electrode 21 and the second electrode 22 may have a partially curved or bent shape, and one electrode may be disposed to surround the other electrode.

The first electrode 21 and the second electrode 22 may be disposed on the second banks 40. In one or more embodiments, the first electrode 21 and the second electrode 22 may each be formed to have a width larger than that of the respective second bank 40. For example, each of the first electrode 21 and the second electrode 22 may be disposed to cover the outer surface of the second bank 40. The first electrode 21 and the second electrode 22 may be disposed on the side surfaces of the second bank 40, and the distance between the first electrode 21 and the second electrode 22 may be smaller than the distance between the second banks 40. Further, at least a part of the first electrode 21 and at least a part of the second electrode 22 are directly disposed on the color filter layer CFL, so that they may be disposed on the same plane.

Each of the electrodes 21 and 22 may include a transparent conductive material. For example, each of the electrodes 21 and 22 may include a material such as indium tin oxide (ITO), indium zinc oxide (IZO), and indium tin zinc oxide (ITZO), but is not limited thereto. In one or more embodiments, each of the electrodes 21 and 22 may include a conductive material having high reflectivity. For example, each of the electrodes 21 and 22 may include, as a material having high reflectivity, metal such as silver (Ag), copper (Cu), or aluminum (Al). In this case, each electrode 21, 22 may reflect light emitted from the light emitting element 30 and traveling to the side surface of the second bank 40 in the upward direction of each sub-pixel PXn.

Without being limited thereto, each electrode 21, 22 may have a structure in which at least one transparent conductive material and at least one metal layer having high reflectivity are stacked, or may be formed as one layer including them. In one or more embodiments, each electrode 21, 22 may have a stacked structure such as ITO/Ag/ITO, ITO/Ag/IZO, or ITO/Ag/ITZO/IZO, or may be an alloy including aluminum (Al), nickel (Ni), lanthanum (La), and the like.

The plurality of electrodes 21 and 22 may be electrically connected to the light emitting elements 30 and may receive a suitable voltage (e.g., a predetermined voltage) to allow the light emitting elements 30 to emit light. For example, the plurality of electrodes 21 and 22 may be electrically connected to the light emitting elements 30 through the contact electrodes 26 and 27 to be described later, and the electrical signals applied to the electrodes 21 and 22 may be transferred to the light emitting elements 30 through the contact electrodes 26 and 27.

In one or more embodiments, one of the first electrode 21 and the second electrode 22 may be electrically connected to an anode electrode of the light emitting element 30, and the other one thereof may be electrically connected to a cathode electrode of the light emitting element 30. However, the present disclosure is not limited thereto, and an opposite case may also be possible.

Further, each of the electrodes 21 and 22 may be used to form an electric field in the sub-pixel PXn to align the light emitting elements 30. The light emitting elements 30 may be disposed between the first electrode 21 and the second electrode 22 by an electric field formed between the first electrode 21 and the second electrode 22.

The first insulating layer 51 is disposed on the color filter layer CFL. The first insulating layer 51 may be disposed to cover the second banks 40 and the first and second electrodes 21 and 22, and may be disposed to expose a part of the top surface of the first electrode 21 and a part of the top surface of the second electrode 22. In other words, the first insulating layer 51 may be substantially entirely formed on the color filter layer CFL, and may include an opening exposing a part of the first electrode 21 and a part of the second electrode 22.

In one or more embodiments, the first insulating layer 51 may be formed to have a step such that a portion of the top surface thereof is recessed between the first electrode 21 and the second electrode 22. Because the first insulating layer 51 is disposed to cover the first electrode 21 and the second electrode 22, a stepped portion may be formed therebetween. However, the present disclosure is not limited thereto. The first insulating layer 51 may protect the first electrode 21 and the second electrode 22 while insulating them from each other. Further, it is possible to prevent the light emitting element ED disposed on the first insulating layer 51 from being damaged by direct contact with other members.

The first bank 45 is disposed on the first insulating layer 51. The first bank 45 may include portions extending in the first direction DR1 and the second direction DR2 in a plan view to be arranged in a grid pattern over the entire surface of the display area DPA. In one or more embodiments, the first bank 45 may be disposed to overlap the light blocking member BM in the thickness direction of the first substrate 11, and may have a width greater than that of the light blocking member BM. The light blocking member BM may be disposed between the color filter layers CFL to separate them, whereas the first bank 45 may be disposed across the boundary between the sub-pixels PXn to separate neighboring sub-pixels PXn.

The first bank 45 may also be arranged to surround the emission area EMA and the sub-region CBA in each sub-pixel PXn to separate the sub-pixels PXn from each other. The first electrode 21 and the second electrode 22 may extend in the second direction DR2 to be disposed across a portion of the first bank 45 extending in the first direction DR1. In a portion extending in the second direction DR2 of the first bank 45, a portion disposed between the emission areas EMA may have a larger width than a portion disposed between the sub-regions CBA. Accordingly, the distance between the sub-regions CBA may be smaller than the distance between the emission areas EMA.

According to one or more embodiments, the first bank 45 may be formed to have a height greater than that of the second bank 40. The first bank 45 may function to prevent inks from overflowing to adjacent sub-pixels PXn during the inkjet printing process in the manufacturing process of the display device 10. The first bank 45 may separate inks in which different light emitting elements 30 are dispersed for different sub-pixels PXn so as not to be mixed with each other. Further, the first bank 45 may prevent the material of the color control structures TPL and WCL from overflowing to another sub-pixel PXn. Similar to the second bank 40, the first bank 45 may include polyimide (PI), but is not limited thereto.

The light emitting element 30 may be disposed on the first insulating layer 51. The plurality of light emitting elements 30 may be disposed to be spaced from each other along the second direction DR2 in which the electrodes 21 and 22 extend, and may be aligned substantially parallel to each other. The light emitting element 30 may have a shape extending in one direction, and the extension direction of the light emitting element 30 may be substantially perpendicular to the extension direction of the electrodes 21 and 22. However, the present disclosure is not limited thereto, and the light emitting element 30 may be disposed obliquely without being perpendicular to the extension direction of the electrodes 21 and 22.

The light emitting element 30 may include a light emitting layer 36 (see FIG. 11) to emit light of a specific wavelength band. Further, the light emitting element 30 may emit lights of different wavelength bands depending on the material forming the light emitting layer 36. However, although the display device 10 includes the color control structures TPL and WCL and the color filter layer CFL and the light emitting elements 30 disposed in each sub-pixel PXn emit light of the same color, the sub-pixels PXn may display different colors. In one or more embodiments, each light emitting element layer EL of the display device 10 may include the light emitting elements 30 emitting light L1 of the first color, and the sub-pixels PXn may display lights of different colors. For example, the first sub-pixel PX1, the second sub-pixel PX2, and the third sub-pixel PX3 may emit the light L1 of the first color, the light L2 of the second color, and the light L3 of the third color, respectively. However, the present disclosure is not limited thereto, and in some cases, each of the sub-pixels PXn may include different types of light emitting elements 30.

Between the second banks 40, the light emitting element 30 may have respective ends disposed above the electrodes 21 and 22. The light emitting element 30 may be disposed such that one end thereof is located on the first electrode 21 and the other end thereof is located on the second electrode 22. The extension length of the light emitting element 30 may be longer than the distance between the first electrode 21 and the second electrode 22, and respective ends of the light emitting element 30 may be disposed above the first electrode 21 and the second electrode 22.

In the light emitting element 30, a plurality of layers may be disposed in a direction perpendicular to the top surface of the first substrate 11. The light emitting element 30 of the display device 10 may be disposed such that one extension direction is parallel to the first substrate 11, and the plurality of semiconductor layers included in the light emitting element 30 may be sequentially arranged along a direction parallel to the top surface of the first substrate 11. However, the present disclosure is not limited thereto. In one or more embodiments, when the light emitting element 30 has a different structure, the plurality of layers may be disposed in a direction perpendicular to the first substrate 11.

Both ends of the light emitting element 30 may be in contact with the contact electrodes 26 and 27. Because, on the end surfaces of the light emitting element 30 in its extension direction, an insulating film 38 is not formed and a part of the semiconductor layer is exposed, the exposed semiconductor layer may be in contact with the contact electrodes 26 and 27. However, the present disclosure is not limited thereto. In one or more embodiments, in the light emitting element 30 at least a part of the insulating film 38 is removed, so that at the side surfaces at both ends of the light emitting element 30, semiconductor layers may be partially exposed. The side surfaces of the exposed semiconductor layers may be in contact (e.g., direct contact) with the contact electrodes 26 and 27.

The second insulating layer 52 may be partially disposed on the light emitting element 30. For example, the second insulating layer 52 is disposed to partially surround the outer surface of the light emitting element 30 so as not to cover both ends of the light emitting element 30. The contact electrodes 26 and 27 to be described later may be in contact with both ends of the light emitting element 30 that are not covered by the second insulating layer 52. The portion of the second insulating layer 52 disposed on the light emitting element 30 may be arranged to extend in the second direction DR2 on the first insulating layer 51 in a plan view, so that it may form a linear or island-like pattern in each sub-pixel PXn. The second insulating layer 52 may protect the light emitting element 30 while fixing the light emitting element 30 during the manufacturing process of the display device 10.

The plurality of contact electrodes 26 and 27 and a third insulating layer 53 may be disposed on the second insulating layer 52.

The plurality of contact electrodes 26 and 27 may have a shape extending in one direction. A first contact electrode 26 and a second contact electrode 27 of the contact electrodes 26 and 27 may be disposed on and in contact with a portion of the first electrode 21 that is exposed by the first insulating layer 51 and a portion of the second electrode 22 that is exposed by the first insulating layer 51, respectively. The first contact electrode 26 is disposed on the first electrode 21, and the second contact electrode 27 is disposed on the second electrode 22. The first contact electrode 26 and the second contact electrode 27 may each have a shape extending in the second direction DR2. The first contact electrode 26 and the second contact electrode 27 may be spaced from each other in the first direction DR1, and they form a linear pattern in the emission area EMA of each sub-pixel PXn.

In one or more embodiments, the widths of the first contact electrode 26 and the second contact electrode 27 measured in one direction may be equal to or smaller than the widths of the first electrode 21 and the second electrode 22 measured in the one direction, respectively. The first contact electrode 26 and the second contact electrode 27 may be disposed not only to contact one end and the other end of the light emitting element 30, respectively, but also to cover a portion of the top surface of the first electrode 21 and a portion of the top surface of the second electrode 22, respectively.

The plurality of contact electrodes 26 and 27 may be in contact with the light emitting element 30 and the electrodes 21 and 22. In the light emitting element 30, the semiconductor layer may be exposed on both end surfaces of the light emitting element 30 in its extension direction, and the first contact electrode 26 and the second contact electrode 27 may be in contact with the end surfaces of the light emitting element 30 on which the semiconductor layer has been exposed. One end of the light emitting element 30 may be electrically connected to the first electrode 21 through the first contact electrode 26, and the other end thereof may be electrically connected to the second electrode 22 through the second contact electrode 27.

Although one first contact electrode 26 and one second contact electrode 27 are disposed in one sub-pixel PXn in the drawing, the present disclosure is not limited thereto. The number of the first contact electrodes 26 and the second contact electrodes 27 may vary depending on the number of the first electrodes 21 and the second electrodes 22 disposed in each sub-pixel PXn.

A third insulating layer 53 is disposed on the first contact electrode 26. The third insulating layer 53 may electrically insulate the first contact electrode 26 and the second contact electrode 27 from each other. The third insulating layer 53 may be disposed to cover the first contact electrode 26, but may not be disposed on the other end of the light emitting element 30 such that the light emitting element 30 can be brought into contact with the second contact electrode 27. The third insulating layer 53 may partially contact the first contact electrode 26 and the second insulating layer 52 on the top surface of the second insulating layer 52. The side surface of the third insulating layer 53 in a direction in which the second electrode 22 is disposed may be aligned with one side surface of the second insulating layer 52. In addition, the third insulating layer 53 may be disposed in the non-emission area, e.g., on the first insulating layer 51 disposed on the first planarization layer 19. However, the present disclosure is not limited thereto.

The second contact electrode 27 is disposed on the second electrode 22, the second insulating layer 52, and the third insulating layer 53. The second contact electrode 27 may be in contact with the other end of the light emitting element 30 and the exposed top surface of the second electrode 22. The other end of the light emitting element 30 may be electrically connected to the second electrode 22 through the second contact electrode 27.

The second contact electrode 27 may be partially in contact with the second insulating layer 52, the third insulating layer 53, the second electrode 22, and the light emitting element 30. The first contact electrode 26 and the second contact electrode 27 may not be in contact with (e.g., be insulated from) each other by the second insulating layer 52 and the third insulating layer 53. However, the present disclosure is not limited thereto, and in some cases, the third insulating layer 53 may be omitted.

The contact electrodes 26 and 27 may include a conductive material. For example, they may include ITO, IZO, ITZO, aluminum (Al), or the like. As an example, the contact electrodes 26 and 27 may include a transparent conductive material, and light emitted from the light emitting element 30 may pass through the contact electrodes 26 and 27 and proceed toward the electrodes 21 and 22. However, the present disclosure is not limited thereto.

The fourth insulating layer 54 may be disposed entirely on the first substrate 11. The fourth insulating layer 54 may function to protect the members of the light emitting element layer EL from external environment. Further, the fourth insulating layer 54 may also be disposed on the first bank 45.

Each of the first insulating layer 51, the second insulating layer 52, the third insulating layer 53, and the fourth insulating layer 54 described above may include an inorganic insulating material or an organic insulating material. In one or more embodiments, the first insulating layer 51, the second insulating layer 52, the third insulating layer 53, and the fourth insulating layer 54 may include an inorganic insulating material such as silicon oxide (SiOx), silicon nitride (SiNx), silicon oxynitride (SiOxNy), aluminum oxide (AlOy), aluminum nitride (AlNx), and the like. Alternatively, they may include an organic insulating material such as acrylic resin, epoxy resin, phenolic resin, polyamide resin, polyimide resin, unsaturated polyester resin, polyphenylene resin, polyphenylenesulfide resin, benzocyclobutene resin, cardo resin, siloxane resin, silsesquioxane resin, polymethylmethacrylate, polycarbonate, polymethylmethacrylate-polycarbonate synthetic resin, and the like. However, the present disclosure is not limited thereto.

The color control structures TPL and WCL are disposed on the light emitting element layer EL. In accordance with one or more embodiments, the color control structures TPL and WCL may be disposed in the region surrounded by the first bank 45 of the bank layer BNL. The color control structures TPL and WCL may be disposed in each sub-pixel PXn, and may be disposed in the emission area EMA without being disposed in the sub-region CBA in the region surrounded by the first bank 45. The sub-region CBA is an area in which the light emitting elements 30 of the light emitting element layer EL are not disposed, and light may not be substantially emitted therefrom. The color control structures TPL and WCL may be disposed in the region surrounded by the first bank 45 in the region of the light emitting element layer EL in which the light emitting element 30 is disposed.

In one or more embodiments, the heights of the color control structures TPL and WCL may be greater than the height of the first bank 45. The color control structures TPL and WCL may be formed by an inkjet printing process or a photoresist process during the manufacturing process of the display device 10. The color control structures TPL and WCL may be formed by spraying or applying the material thereof into the region surrounded by the first bank 45, and then performing drying or exposure and development. For example, the material of the color control structures TPL and WCL may include an organic material and have viscosity, and the organic material may not overflow to another sub-pixel PXn over the first bank 45 even if it sprayed or applied to a position higher than the first bank 45. Accordingly, the heights of the color control structures TPL and WCL may be higher than that of the first bank 45. However, the present disclosure is not limited thereto.

In one or more embodiments in which the light emitting element layer EL of each sub-pixel PXn emits light of the first color, the color control structures TPL and WCL may include a light transmitting layer TPL disposed in the first sub-pixel PX1, a first wavelength conversion layer WCL1 disposed in the second sub-pixel PX2, and a second wavelength conversion layer WCL2 disposed in the third sub-pixel PX3.

The light transmitting layer TPL may include a first base resin BRS1 and scatterers SCP disposed in the first base resin BRS1. The light transmitting layer TPL transmits the first color light L1 incident from the light emitting element layer EL while maintaining the wavelength thereof. The scatterer SCP of the light transmitting layer TPL may serve to control an emission path of the light emitted through the light transmitting layer TPL. The light transmitting layer TPL may not include a wavelength conversion material.

The first wavelength conversion layer WCL1 may include a second base resin BRS2 and a first wavelength conversion material WCP1 provided in the second base resin BRS2. The second wavelength conversion layer WCL2 may include a third base resin BRS3 and a second wavelength conversion material WCP2 provided in the third base resin BRS3. The first wavelength conversion layer WCL1 and the second wavelength conversion layer WCL2 may transmit the first color light L1 incident from the light emitting element layer EL while converting the wavelength thereof. Scatterers SCP of the first wavelength conversion layer WCL1 and the second wavelength conversion layer WCL2 may increase wavelength conversion efficiency.

The scatterer SCP may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2 and BRS3 may be formed of the same material, but the present disclosure is not limited thereto.

The first wavelength conversion material WCP1 may convert the first color light L1 into the second color light L2, and the second wavelength conversion material WCP2 may convert the first color light L1 into the third color light L3. The first wavelength conversion material WCP1 and the second wavelength conversion material WCP2 may be quantum dots, quantum bars, phosphors or the like. Examples of the quantum dot may include Group IV nanocrystal, Group II-VI compound nanocrystal, Group III-V compound nanocrystal, Group IV-VI nanocrystal, and a combination thereof.

The color control structures TPL and WCL may be directly disposed on the light emitting element layer EL. In the display device 10, the first bank 45 may be disposed to surround the sub-pixels PXn with a suitable height (e.g., a predetermined height), so that the base resins BRS1, BRS2, and BRS3 of the color control structures TPL and WCL may be directly disposed on the fourth insulating layer 54 of the light emitting element layer EL.

In accordance with one or more embodiments, the light transmitting layer TPL, the first wavelength conversion layer WCL1, and the second wavelength conversion layer WCL2 of the color control structures TPL and WCL may be disposed to correspond to the emission area EMA surrounded by the first bank 45, and the width measured in the first direction DR1 may be smaller than the width of each color filter layer CFL measured in the first direction DR1. The color filter layer CFL is disposed in the region surrounded by the light blocking member BM, and the light blocking member BM has a width smaller than that of the first bank 45, so that the color filter layer CFL may partially overlap the first bank 45 in the thickness direction of the first substrate 11. On the other hand, the widths of the color control structures TPL and WCL are substantially the same as that of the emission area EMA surrounded by the first bank 45, and thus may be smaller than that of the color filter layer CFL.

Further, the base resins BRS1, BRS2, and BRS3 may be disposed to be around (e.g., to surround) the light emitting element 30, the second banks 40, the electrodes 21 and 22, and the contact electrodes 26 and 27 of the light emitting element layer EL that are arranged to protrude with respect to the top surface of the color filter layer CFL in the region surrounded by the first bank 45. Further, the scatterers SCP and the wavelength conversion materials WCP1 and WCP2 of the color control structures TPL and WCL may be arranged around the light emitting element layer EL in each of the base resins BRS1, BRS2, and BRS3.

In one or more embodiments, the lights emitted from the respective light emitting element layers EL may be light L1 of the first color. Lights emitted from both ends of the light emitting element 30 may be reflected from the electrodes 21 and 22 disposed on the second bank 40 and may travel toward the color control structures TPL and WCL disposed thereabove. The light L1 emitted from the first light emitting element layer EL1 disposed in the first sub-pixel PX1 is incident on the light transmitting layer TPL, the light L1 emitted from the second light emitting element layer EL2 disposed in the second sub-pixel PX2 is incident on the first wavelength conversion layer WCL1, and the light L1 emitted from the third light emitting element layer EL3 disposed in the third sub-pixel PX3 is incident on the second wavelength conversion layer WCL2. The light incident on the light transmitting layer TPL may be transmitted as the light L1 of the first color without wavelength conversion, the light incident on the first wavelength conversion layer WCL1 may be converted into the light L2 of the second color, and the light incident on the second wavelength conversion layer WCL2 may be converted into the light L3 of the third color. Although each sub-pixel PXn contains the light emitting element layers EL that emit the light of the same color, the lights of different colors may be displayed depending on the arrangement of the color control structures TPL and WCL arranged thereabove.

A capping layer CPL is disposed on the color control structures TPL and WCL. The capping layer CPL may be disposed to cover the color control structures TPL and WCL and the first bank 45 of the bank layer BNL. The capping layer CPL may prevent impurities such as moisture or air from permeating from the outside and damaging or contaminating the color control structures TPL and WCL. Further, the capping layer CPL may prevent the materials of the color control structures TPL and WCL from being diffused to other components. The capping layer CPL may be formed of an inorganic material. For example, the capping layer CPL may include silicon nitride, aluminum nitride, zirconium nitride, titanium nitride, hafnium nitride, tantalum nitride, silicon oxide, aluminum oxide, titanium oxide, tin oxide, silicon oxynitride, or the like. However, the capping layer CPL may be omitted.

The reflective layer LRL is disposed on the capping layer CPL. The reflective layer LRL may be disposed to cover the color control structures TPL and WCL and the first bank 45 in the entire display area DPA. The reflective layer LRL disposed in the emission area EMA of each sub-pixel PXn may reflect lights emitted from the light emitting element layer EL and having passed through the color control structures TPL and WCL. In one or more embodiments, the reflective layer LRL may include a material having high reflectivity. In one or more embodiments, the reflective layer LRL may include a material such as silver (Ag), copper (Cu), aluminum (Al), nickel (Ni), lanthanum (La), or an alloy thereof, but is not limited thereto.

The display device 10 according to one or more embodiments may be a rear emission type light emitting display device that includes the reflective layer LRL disposed on the light emitting element layer EL to emit light toward the bottom surface of the first substrate 11 on which the light emitting element layer EL is disposed.

Figure 8:
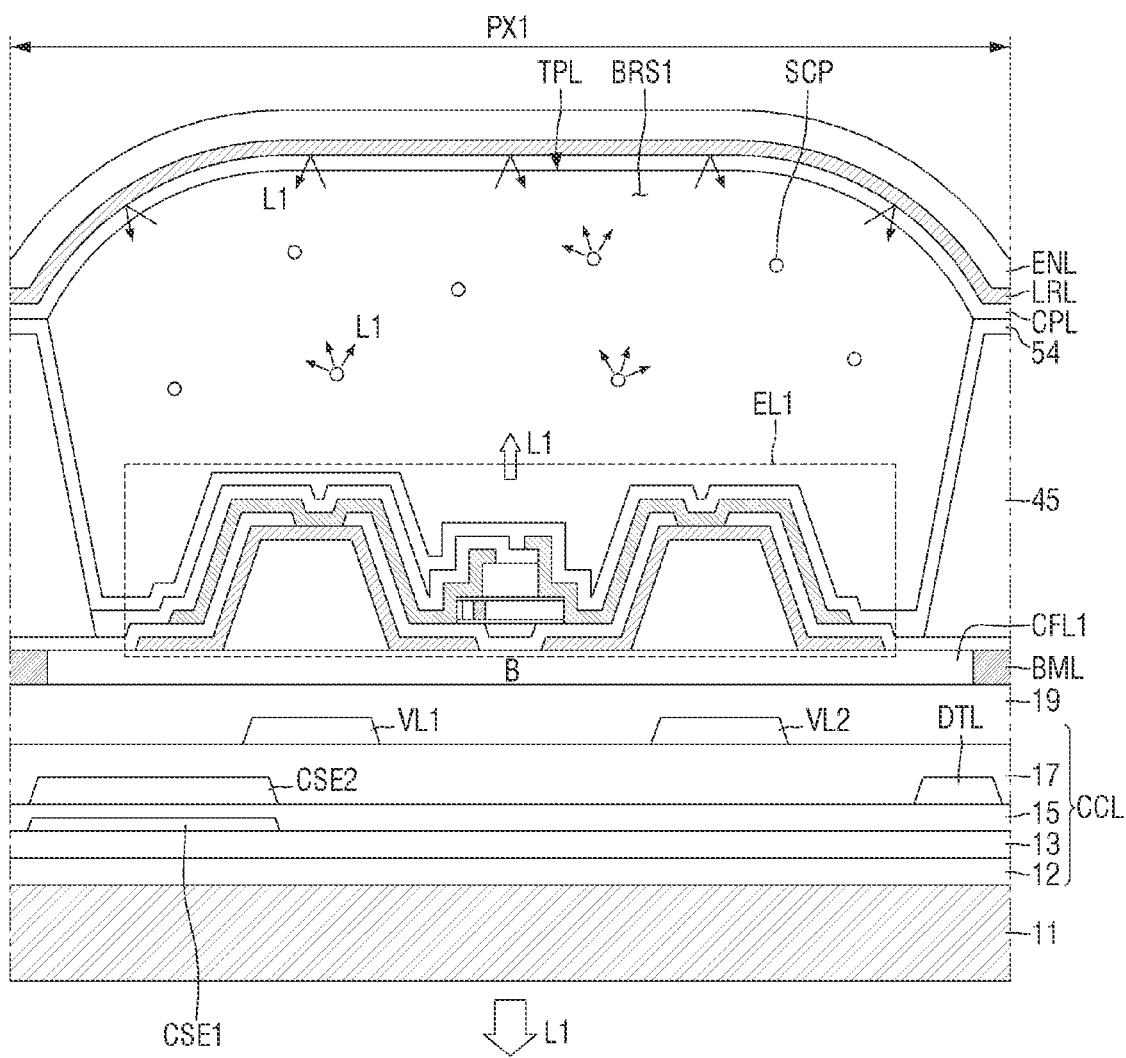
FIGS. 8 and 9 are schematic cross-sectional views illustrating emission of lights from the first sub-pixel and the second sub-pixel of FIG. 7.
Figure 9:
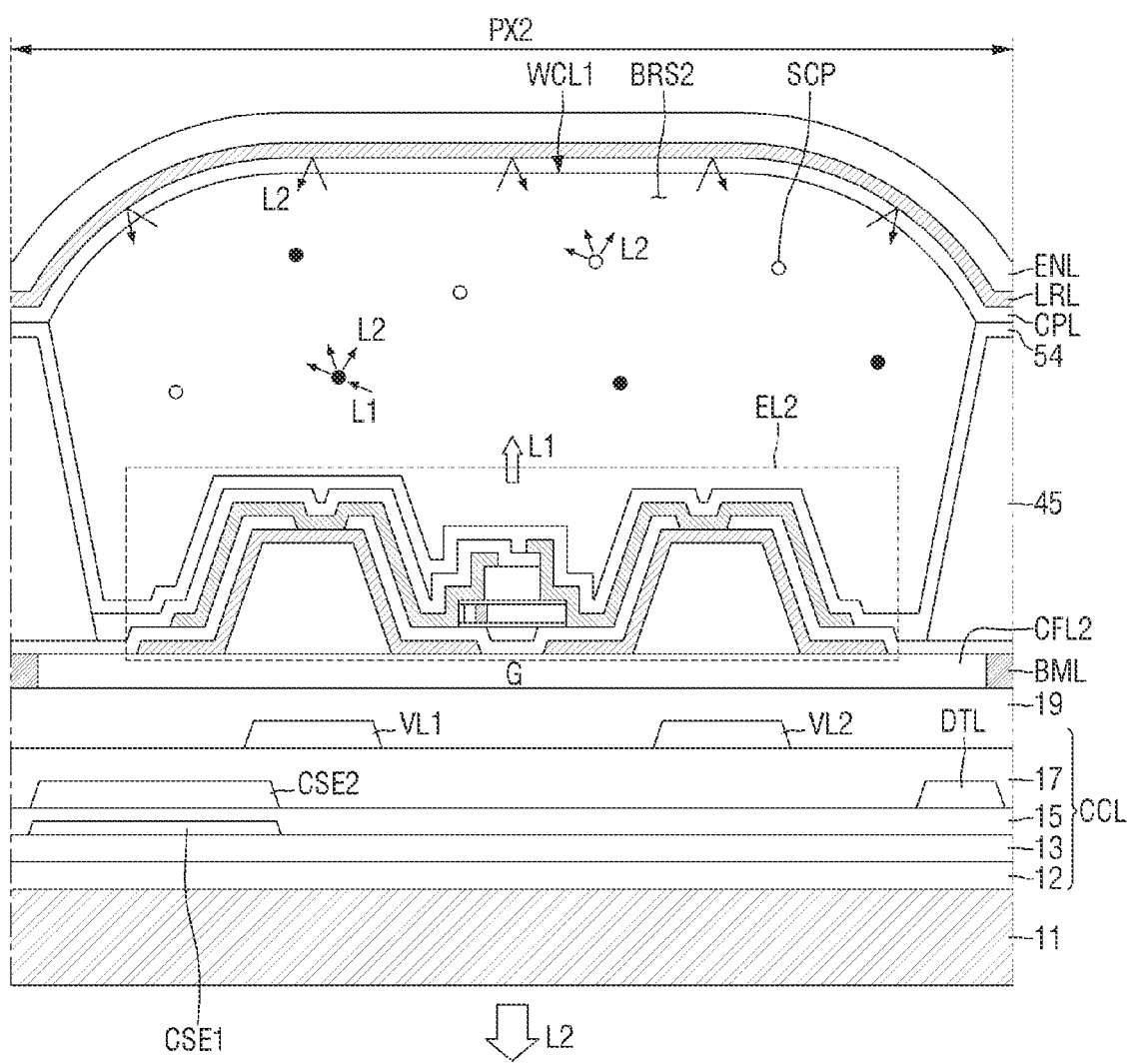

FIGS. 8 and 9 are schematic cross-sectional views illustrating emission of lights from the first sub-pixel and the second sub-pixel of FIG. 7. FIG. 8 illustrates that the first color light L1 is emitted from the first sub-pixel PX1 to the bottom surface of the first substrate 11, and FIG. 9 illustrates that the second color light L2 is emitted from the second sub-pixel PX2 to the bottom surface of the first substrate 11.

Referring to FIGS. 8 and 9, the light emitting element 30 of the first light emitting element layer EL1 may emit the first color light L1, and the light may be incident on the light transmitting layer TPL disposed on the first light emitting element layer EL1. The first base resin BRS1 of the light transmitting layer TPL may be made of a transparent material, and some of the light may pass through the first base resin BRS1 to be incident on the capping layer CPL and the reflective layer LRL disposed thereon. Further, at least a part of the light may be incident on the scatterers SCP disposed in the first base resin BRS1 and may be incident on the capping layer CPL and the reflective layer LRL after the light is scattered. The lights incident on the capping layer CPL may be reflected from the reflective layer LRL while passing through the capping layer CPL made of a transparent material and may be incident on the light transmitting layer TPL again. The lights incident on the light transmitting layer TPL may be incident on the first color filter layer CFL1 while passing through the light emitting element layer EL, and the first color filter layer CFL1 may block other lights except the first color light L1. The lights emitted from the first light emitting element layer EL1 toward the light transmitting layer TPL may be emitted as the first color light L1 to the bottom surface of the first substrate 11 while passing through the light transmitting layer TPL, the reflective layer LRL, and the first color filter layer CFL1. That is, in the first sub-pixel PX1, the first color light L1 may be displayed on the bottom surface of the first substrate 11. The lights reflected from the reflective layer LRL may be emitted in the downward direction through a region of the emission area EMA shown in FIG. 4 in which the electrodes 21 and 22 are not disposed, for example, a region between the electrodes 21 and 22 and the first bank 45 or a region in which the light emitting elements 30 are not disposed between the electrodes 21 and 22.

The light emitting element 30 of the second light emitting element layer EL2 may emit the first color light L1, and the light may be incident on the first wavelength conversion layer WCL1 disposed on the second light emitting element layer EL2. The second base resin BRS2 of the first wavelength conversion layer WCL1 may be made of a transparent material, and a part of the light may pass through the second base resin BRS2 to be incident on the capping layer CPL and the reflective layer LRL disposed thereon. However, at least a part of the light may be incident on the scatterers SCP and the first wavelength conversion material WCP1 disposed in the second base resin BRS2, and the light may be scattered and subjected to wavelength conversion, and then may be incident as the second color light L2 on the capping layer CPL and the reflective layer LRL. The lights incident on the capping layer CPL may be reflected from the reflective layer LRL while passing through the capping layer CPL made of a transparent material and may be incident on the first wavelength conversion layer WCL1 again. At least a part of the light incident on the first wavelength conversion layer WCL1 is incident on the scatterers SCP and the first wavelength conversion material WCP1 again and converted into the second color light L2, and then is incident on the second color filter layer CFL2 while passing through the light emitting element layer EL. The second color filter layer CFL2 may block transmission of other lights except the second color light L2, and may transmit the second color lights L2 without transmitting the first color light L1 incident on the second color filter layer CFL2. The lights emitted from the second light emitting element layer EL2 toward the first wavelength conversion layer WCL1 may be emitted as the second color light L2 from the bottom surface of the first substrate 11 while passing through the first wavelength conversion layer WCL1, the reflective layer LRL, and the second color filter layer CFL2. That is, in the second sub-pixel PX2, the second color light L2 may be displayed on the bottom surface of the first substrate 11.

Similarly, the first color lights L1 emitted from the third light emitting element layer EL3 may be emitted as the third color light L3 from the bottom surface of the first substrate 11 while passing through the second wavelength conversion layer WCL2, the reflective layer LRL, and the third color filter layer CFL3. That is, in the third sub-pixel PX3, the third color light L3 may be displayed on the bottom surface of the first substrate 11.

In the display device 10 according to one or more embodiments, the color control structures TPL and WCL may be disposed on the light emitting element layer EL from which light is emitted, and the lights reflected from the reflective layer LRL may be emitted to the bottom surface of the first substrate 11 through the color filter layer CFL disposed under the light emitting element layer EL. The display device 10 may be a rear emission type light emitting display device that includes the reflective layer LRL disposed on the light emitting element layer EL and the color control structures TPL and WCL to emit light toward the bottom surface of the first substrate 11. Further, in the display device 10 according to one or more embodiments, the color filter layer CFL, the light emitting element layer EL, and the color control structures TPL and WCL may be sequentially stacked in the thickness direction of the display device 10 in a suitable region (e.g., a predetermined region) including the first bank 45, and only one substrate, e.g., the first substrate 11, is included, so that the sub-pixels PXn may display different colors.

In one or more embodiments, the electrodes 21 and 22 of the light emitting element layer EL and the source/drain electrode and the plurality of wirings of the circuit layer CCL in addition to the reflective layer LRL may also include a material having high reflectivity. The lights emitted from the light emitting element layer EL may be reflected from the reflective layer LRL while passing through the color control structures TPL and WCL, and may be recycled while being reflected multiple times by the electrodes and the lines. Because, however, the reflective layer LRL is disposed to cover the color control structures TPL and WCL and the first bank 45, and the electrodes and the wirings are disposed only in a part of each sub-pixel PXn, the amount of light reflected from the light reflective layer LRL may be greater than the amount of light reflected by the electrodes and the lines, and most of the lights emitted from the light emitting element layer EL of each sub-pixel PXn may be emitted to the bottom surface of the first substrate 11. Further, in one or more embodiments, the ratio of light reflected by the circuit layer CCL may be reduced or minimized by adjusting the arrangement of the light emitting element layer EL and the wirings of the circuit layer CCL disposed thereunder. In one or more embodiments, the first transistor TR1 and the plurality of lines VL1 and VL2 of the circuit layer CCL may be disposed only in the non-emission area NEA without overlapping the emission area EMA. A description thereof may refer to other embodiments.

The encapsulation layer ENL is disposed on the reflective layer LRL. The encapsulation layer ENL may include at least one thin film encapsulation layer to protect the members disposed on the first substrate 11 from external air. For example, the encapsulation layer ENL may be formed of a single encapsulation layer including an inorganic material, but is not limited thereto. When the encapsulation layer ENL includes the inorganic material, the inorganic material may include silicon nitride, silicon oxide, silicon oxynitride, or the like.

Figure 10:
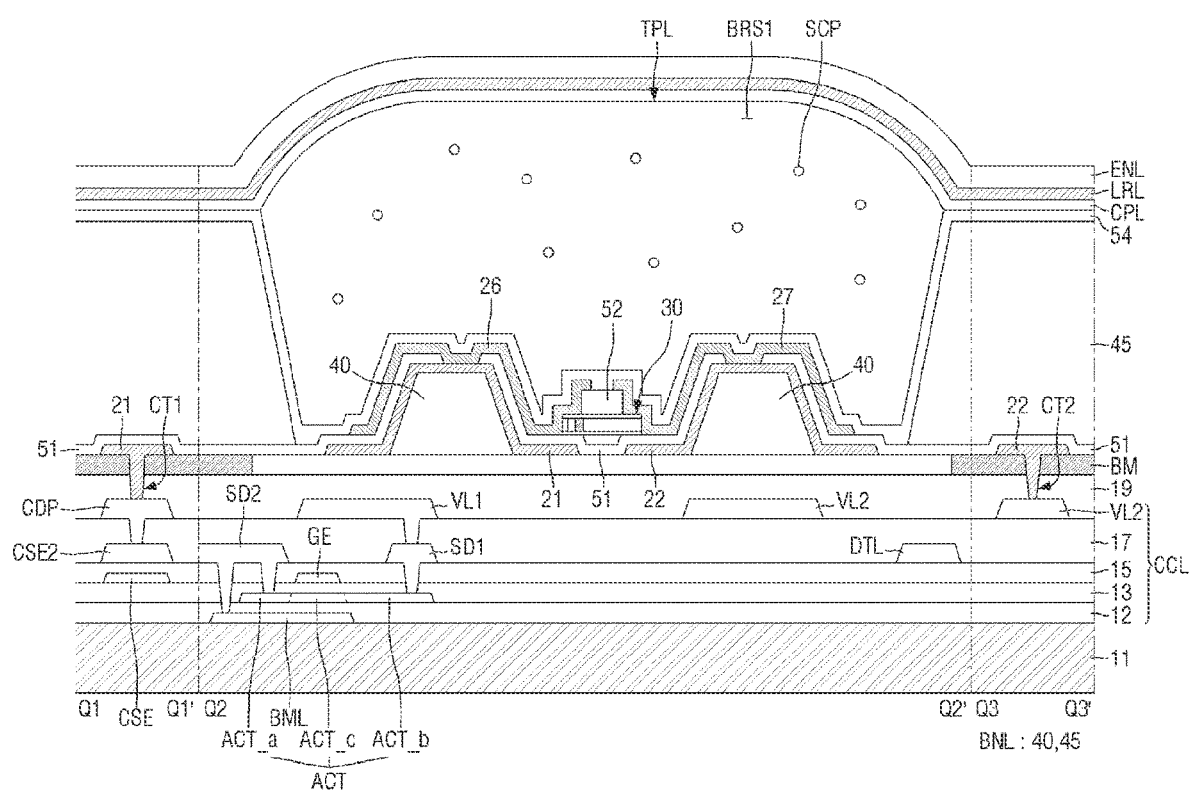
FIG. 10 is a partial cross-sectional view of a display device according to one or more embodiments.

FIG. 10 is a partial cross-sectional view of a display device according to one or more embodiments.

Referring to FIG. 10, in the light emitting element layer EL of the display device 10, the third insulating layer 53 may be omitted. A part of the second contact electrode 27 may be directly disposed on the second insulating layer 52, and the first contact electrode 26 and the second contact electrode 27 may be spaced from each other on the second insulating layer 52. According to one or more embodiments, in the display device 10, even if the third insulating layer 53 is omitted, the second insulating layer 52 may include an organic insulating material to perform a function of fixing the light emitting element 30. In addition, the first contact electrode 26 and the second contact electrode 27 may be concurrently (e.g., simultaneously) formed through a patterning process. The embodiment of FIG. 10 is the same as the embodiment of FIG. 7 except that the third insulating layer 53 is omitted. Hereinafter, redundant description will be omitted.

Figure 11:
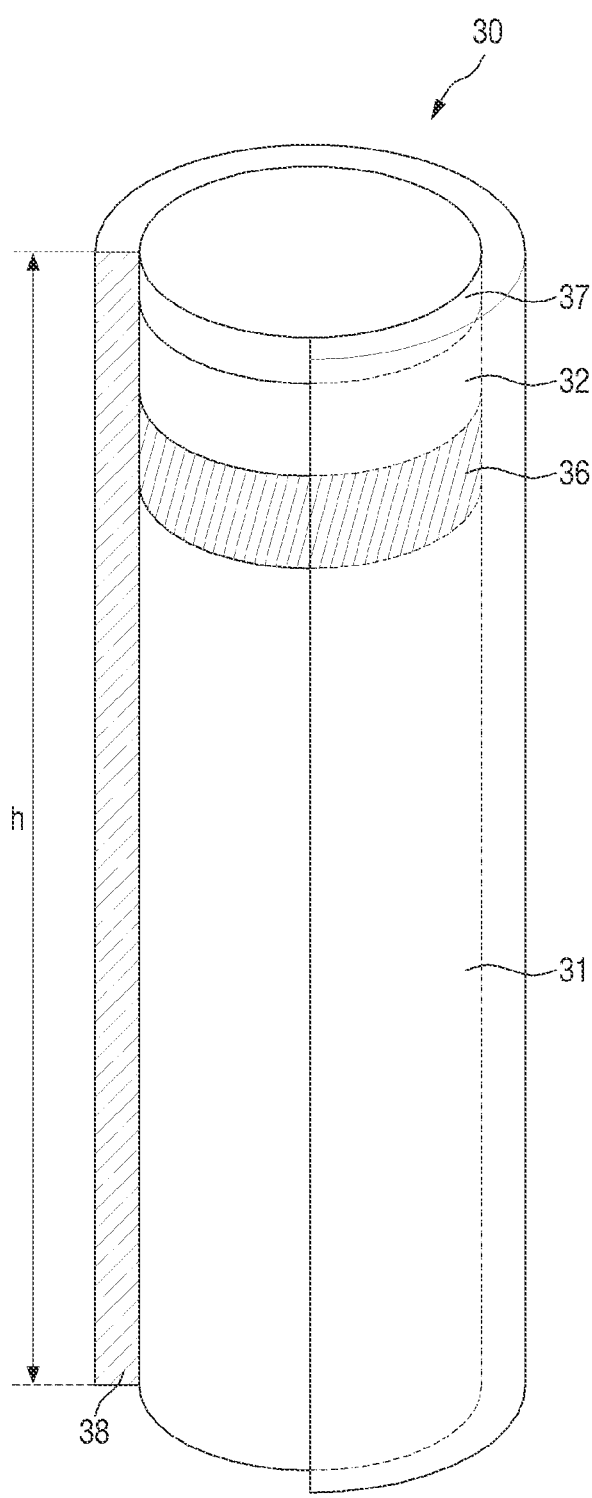
FIG. 11 is a schematic cutaway diagram of a light emitting element according to one or more embodiments.

FIG. 11 is a schematic diagram of a light emitting element according to one or more embodiments.

The light emitting element 30 may be a light emitting diode. Specifically, the light emitting element 30 may be an inorganic light emitting diode that has a micrometer or nanometer size, and is made of an inorganic material. Alternatively, the light emitting element 30 may have a nanometer or micrometer size. The inorganic light emitting diode may be aligned between two electrodes having polarity when an electric field is formed in a specific direction between two electrodes opposing each other. The light emitting element 30 may be aligned between two electrodes by the electric field generated between the electrodes.

The light emitting element 30 according to one or more embodiments may have a shape extending in one direction.

The light emitting element 30 may have a shape of a rod, wire, tube, or the like. In one or more embodiments, the light emitting element 30 may have a cylindrical or rod shape. However, the shape of the light emitting element 30 is not limited thereto, and the light emitting element 30 may have a polygonal prism shape such as a regular cube, a rectangular parallelepiped and a hexagonal prism, or may have various shapes such as a shape extending in one direction and having an outer surface partially inclined. A plurality of semiconductors included in the light emitting element 30 to be described later may have a structure in which they are sequentially arranged or stacked along the one direction.

The light emitting element 30 may include a semiconductor layer doped with any conductivity type (e.g., p-type or n-type) impurities. The semiconductor layer may emit light of a specific wavelength band by receiving an electrical signal applied from an external power source.

Referring to FIG. 11, the light emitting element 30 may include a first semiconductor layer 31, a second semiconductor layer 32, a light emitting layer 36, an electrode layer 37, and an insulating film 38.

The first semiconductor layer 31 may be an n-type semiconductor. For example, when the light emitting element 30 emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x \leq 1$). For example, it may be any one or more of n-type doped AlGaInN, GaN, AlGaN, InGaN, AlN and InN. The first semiconductor layer 31 may be doped with an n-type dopant. For example, the n-type dopant may be Si, Ge, Sn, or the like. In one or more embodiments, the first semiconductor layer 31 may be n-GaN doped with n-type Si. The length of the first semiconductor layer 31 may have a range of 1.5 mm to 5 mm, but is not limited thereto.

The second semiconductor layer 32 is disposed on the light emitting layer 36 to be described later. The second semiconductor layer 32 may be a p-type semiconductor. For example, when the light emitting element 30 emits light of a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x \leq 1$). For example, it may be any one or more of p-type doped AlGaInN, GaN, AlGaN, InGaN, AlN and InN. The second semiconductor layer 32 may be doped with a p-type dopant. For example, the p-type dopant may be Mg, Zn, Ca, Se, Ba, or the like. In one or more embodiments, the second semiconductor layer 32 may be p-GaN doped with p-type Mg. The length of the second semiconductor layer 32 may have a range of 0.05 mm to 0.10 mm, but is not limited thereto.

Although it is illustrated in the drawing that the first semiconductor layer 31 and the second semiconductor layer 32 are configured as one layer, the present disclosure is not limited thereto. According to one or more embodiments, depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. For example, when the light emitting layer 36 emits light of a blue wavelength band, a material such as AlGaN or AlGaInN may be included. In particular, when the light emitting layer 36 has a multiple quantum well structure in which quantum layers and well layers are alternately stacked, the quantum layer may include a material such as AlGaN or AlGaInN, and the well layer may include a material such as GaN or AlInN. In one or more embodiments, as described above, the light emitting layer 36 includes AlGaInN as a quantum layer and AlInN as a well layer, and the light emitting layer 36 may emit blue light having a central wavelength band of 450 nm to 495 nm.

However, the present disclosure is not limited thereto, and the light emitting layer 36 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 36 is not limited to the light of the blue wavelength band, but the light emitting layer 36 may also emit light of a red or green wavelength band in some cases. The length of the light emitting layer 36 may have a range of 0.05 mm to 0.10 mm, but is not limited thereto.

In one or more embodiments, light emitted from the light emitting layer 36 may be emitted to both side surfaces as well as the outer surface of the light emitting element 30 in a longitudinal direction. The directionality of light emitted from the light emitting layer 36 is not limited to one direction.

The electrode layer 37 may be an ohmic contact electrode. However, the present disclosure is not limited thereto, and they may be a Schottky contact electrode. The light emitting element 30 may include at least one electrode layer 37. Although FIG. 11 illustrates that the light emitting element 30 includes one electrode layer 37, the present disclosure is not limited thereto. In some cases, the light emitting element 30 may include a larger number of electrode layers 37 or none. The following description of the light emitting element 30 may be equally applied even if the number of electrode layers 37 is different or other structures are further included.

In the display device 10 according to one or more embodiments, when the light emitting element 30 is electrically connected to an electrode or a contact electrode, the electrode layer 37 may reduce the resistance between the light emitting element 30 and the electrode or contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). In addition, the electrode layer 37 may include a semiconductor material doped with an n-type or p-type dopant. However, the present disclosure is not limited thereto.

The insulating film 38 is arranged to be around (e.g., to surround) the outer surfaces (e.g., the outer peripheral or circumferential surfaces) of the plurality of semiconductor layers and electrode layers described above. In one or more embodiments, the insulating film 38 may be arranged to be around (e.g., to surround) at least the outer surface (e.g., the outer peripheral or circumferential surface) of the light emitting layer 36 and extend along the extension direction of the light emitting element 30. The insulating film 38 may function to protect the members. For example, the insulating film 38 may be formed to be around (e.g., to surround) side surfaces of the members to expose both ends of the light emitting element 30 in the longitudinal direction.

Although it is illustrated in the drawing that the insulating film 38 extends in the longitudinal direction of the light emitting element 30 to cover the side surface of the light emitting element ED ranging from the first semiconductor layer 31 to the electrode layer 37, the present disclosure is not limited thereto. The insulating film 38 may cover only the outer surface (e.g., the outer peripheral or circumferential surface) of a part of the semiconductor layer (e.g., the first semiconductor layer 31) including the light emitting layer 36, or may cover a part of the side surface of the electrode layer 37 to partially expose the side surface of each electrode layer 37. Further, in a cross-sectional view, the insulating film 38 may have a top surface, which is rounded in a region adjacent to at least one end of the light emitting element 30. The thickness of the insulating film 38 may have a range of 10 nm to 1.0 mm, but is not limited thereto. In one or more embodiments, the thickness of the insulating film 38 may be around 40 nm.

The insulating film 38 may include a material having insulating properties, such as silicon oxide (SiOx), silicon nitride (SiNx), silicon oxynitride (SiOxNy), aluminum nitride (AlNx), and aluminum oxide (AlOx). Accordingly, it is possible to prevent an electrical short circuit that may occur when the light emitting layer 36 is in direct contact with the electrode through which the electrical signal is transmitted to the light emitting element 30. Because the insulating film 38 protects the outer surface (e.g., the outer peripheral or circumferential surface) of the light emitting element 30 including the light emitting layer 36, it is possible to prevent degradation in luminous efficiency.

In one or more embodiments, the insulating film 38 may have an outer surface (e.g., the outer peripheral or circumferential surface) that is surface-treated. The light emitting elements 30 may be sprayed onto the electrode in a state of being dispersed in ink (e.g., a predetermined ink) to be aligned. The surface of the insulating film 38 may be treated to have hydrophobic property or hydrophilic property in order to keep the light emitting elements ED in the dispersed state without being aggregated with other adjacent light emitting elements ED in the ink.

The light emitting element 30 may have a length h of 1 mm to 10 mm or 2 mm to 6 mm, and in some embodiments, 3 mm to 5 mm. Further, a diameter of the light emitting element 30 may have a range of 30 nm to 700 nm, and an aspect ratio of the light emitting element 30 may be 1.2 to 100. However, the present disclosure is not limited thereto, and the plurality of light emitting elements 30 included in the display device 10 may have different diameters according to a difference in composition of the light emitting layer 36. In one or more embodiments, the diameter of the light emitting element 30 may have a range of about 500 nm.

Hereinafter, a manufacturing process of the display device 10 according to one or more embodiments will be described with further reference to other drawings.

FIGS. 12 to 20 are cross-sectional views illustrating a process of manufacturing a display device according to one or more embodiments. In the manufacturing process of the display device 10 described with reference to FIGS. 12 to 20, the order and method of forming the layers will be described in detail, and detailed descriptions of the structure and arrangement of the layers will be omitted because they are the same as described above.

Figure 12:
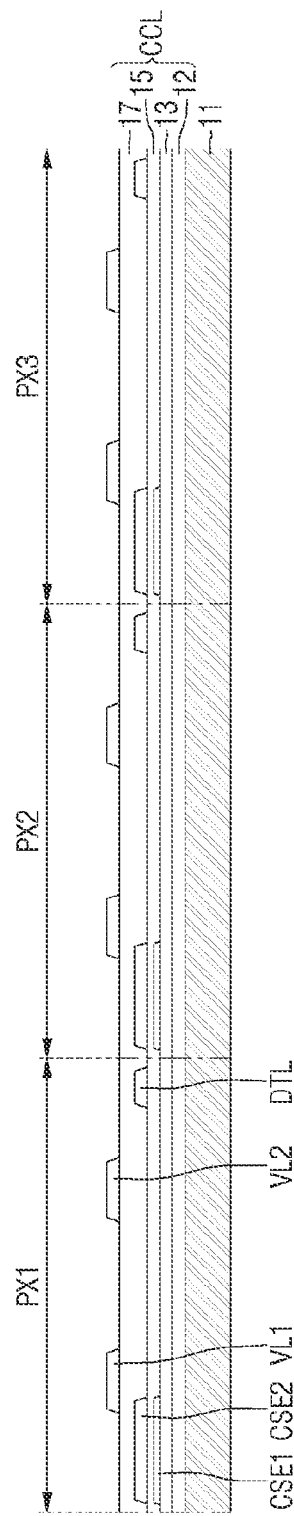
FIGS. 12 to 20 are cross-sectional views illustrating a process of manufacturing a display device according to one or more embodiments.

First, referring to FIG. 12, the first substrate 11 is prepared, and the circuit layer CCL disposed on the first substrate 11 is formed. The circuit layer CCL may be formed by stacking a semiconductor layer, a plurality of conductive layers, and a plurality of insulating layers. Although FIG. 12 illustrates only the voltage lines VL1 and VL2, and the data line DTL, the first and second capacitive electrodes CSE1 and CSE2 that form the storage capacitor, the present disclosure is not limited thereto, and at least the first transistor TR1 may be included.

Figure 13:
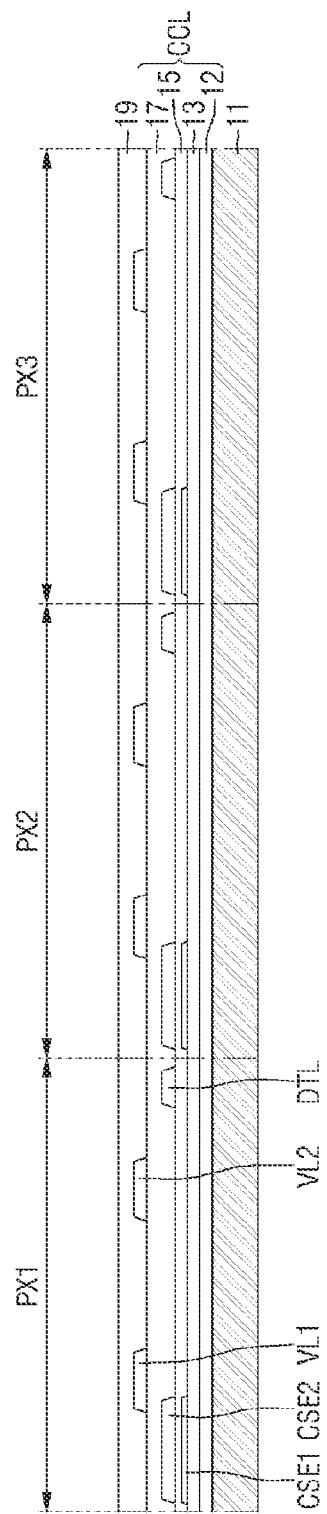

Next, referring to FIG. 13, the first planarization layer 19 is formed on the circuit layer CCL. The first planarization layer 19 may compensate the stepped portion formed by the circuit layer CCL disposed thereunder.

Figure 14:
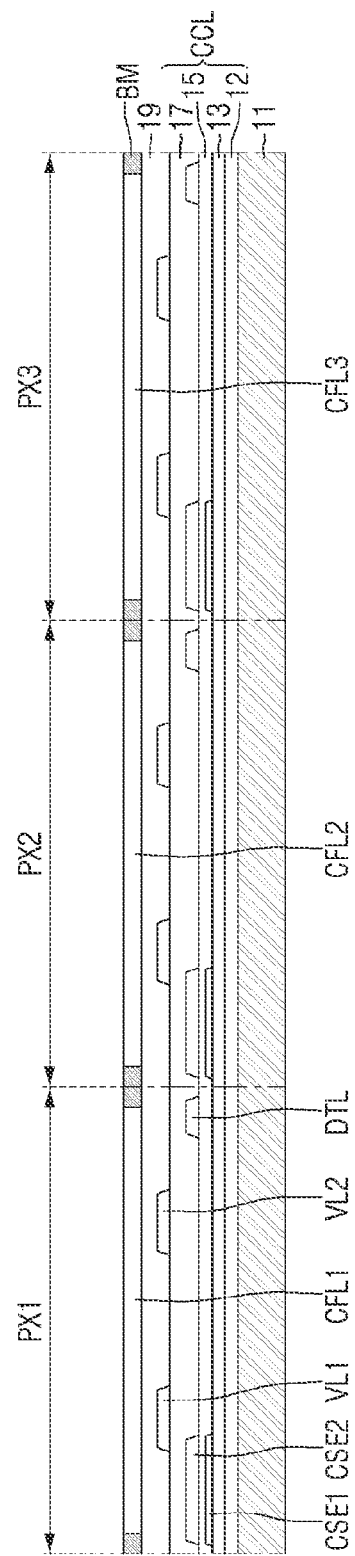

Next, referring to FIG. 14, the color filter layer CFL and the light blocking member BM are formed on the first planarization layer 19. The light blocking member BM may be formed across the boundary between the sub-pixels PXn defined on the first substrate 11. The light blocking member BM may be disposed to surround the sub-pixels PXn to form a grid pattern, and may include openings to partially expose the first planarization layer 19. The color filter layer CFL may be disposed in each opening of the light blocking member BM. The color filter layer CFL may include the first color filter layer CFL1, the second color filter layer CFL2, and the third color filter layer CFL3 to correspond to each sub-pixel PXn.

In one or more embodiments, the color filter layer CFL may be formed by applying a photosensitive organic material including a colorant of a specific color, and exposing and developing it. For example, the first color filter layer CFL1, the second color filter layer CFL2, and the third color filter layer CFL3 may be respectively formed by applying a photosensitive organic material containing a blue colorant, a photosensitive organic material containing a green colorant, and a photosensitive organic material containing a red colorant, and performing exposure and development. However, the present disclosure is not limited thereto.

Figure 15:
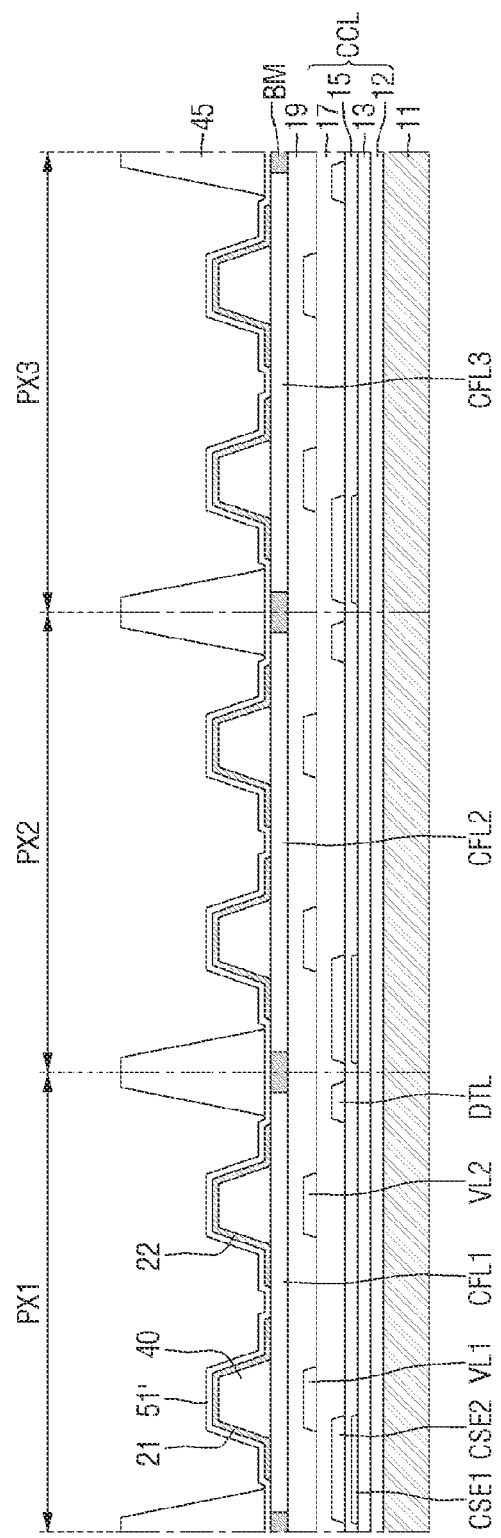

Next, referring to FIG. 15, the second bank 40, and the first and second electrodes 21 and 22 and a first insulating material layer 51' of the light emitting element layer EL are formed on the color filter layer CFL, and the first bank 45 of the bank layer BNL is formed on the first insulating material layer 51'. The description of the first bank 45 and the second bank 40 are the same as described above. The second bank 40 is directly disposed on the color filter layer CFL, and the first bank 45 is disposed to overlap the light blocking member BM in the thickness direction of the first substrate 11.

On the other hand, after the light emitting elements 30 are disposed on the first insulating material layer 51' as will be described later, an opening exposing a part of the top surface of the electrode 21 and a part of the top surface of the electrode 22 may be formed, thereby forming the first insulating layer 51. However, the present disclosure is not limited thereto, and an opening may be formed before the light emitting element 30 is disposed on the first insulating material layer 51'. In this case, the step of substantially forming the first insulating material layer 51' may be omitted and the step of forming the first insulating layer 51 including an opening on the electrodes 21 and 22 may be performed.

The first electrode 21 and the second electrode 22 of the light emitting element layer EL are disposed to cover the second bank 40. Here, the first contact hole CT1 and the second contact hole CT2 penetrating the light blocking member BM and the first planarization layer 19 may be formed before the first electrode 21 and the second electrode 22 are formed, and the first electrode 21 and the second electrode 22 may be electrically connected to the first transistor TR1 and the second voltage line VL2. The first insulating material layer 51' is entirely disposed on the color filter layer CFL. The first insulating material layer 51' may be partially patterned in a subsequent process to form the first insulating layer 51 including an opening exposing the top surfaces of the electrodes 21 and 22. The first insulating material layer 51' is formed and the first bank 45 disposed thereon is formed. The first bank 45 may be formed to be higher than the second bank 40 to separate the sub-pixels PXn.

Figure 16:
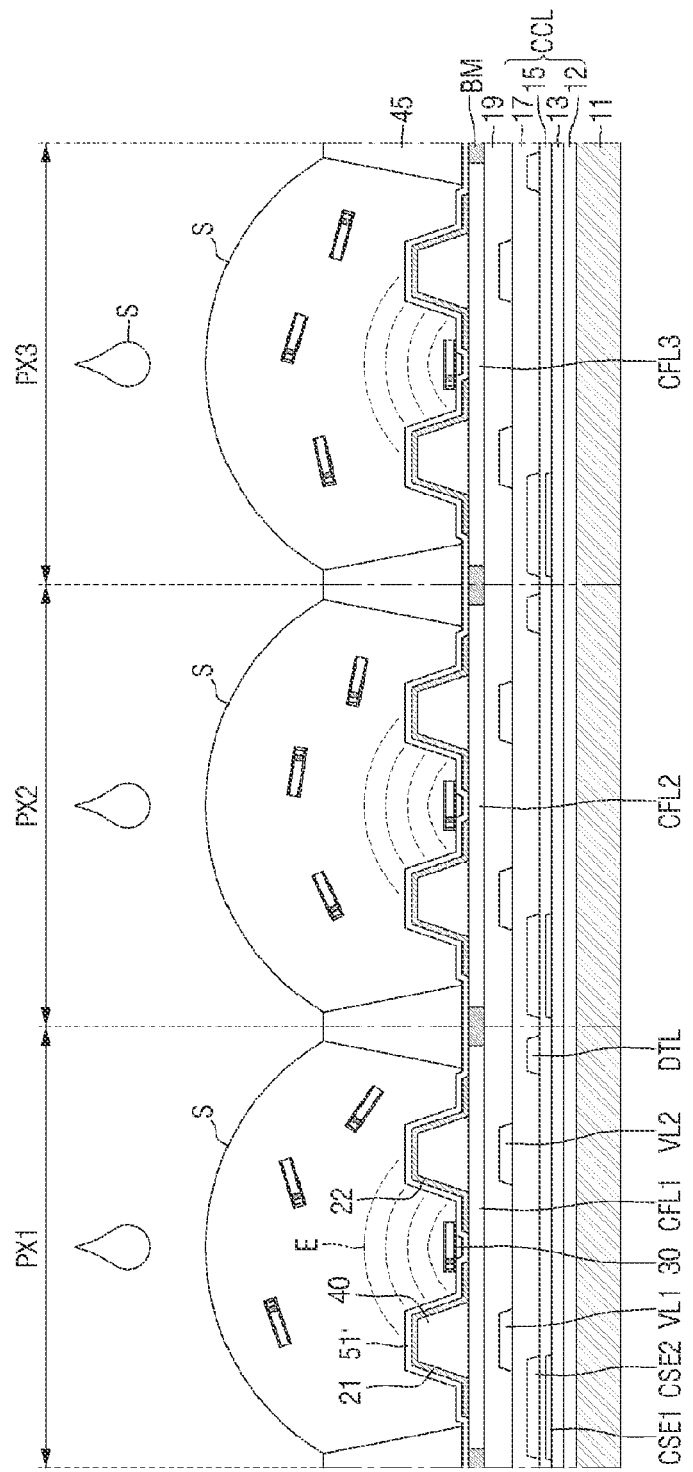
Figure 17:
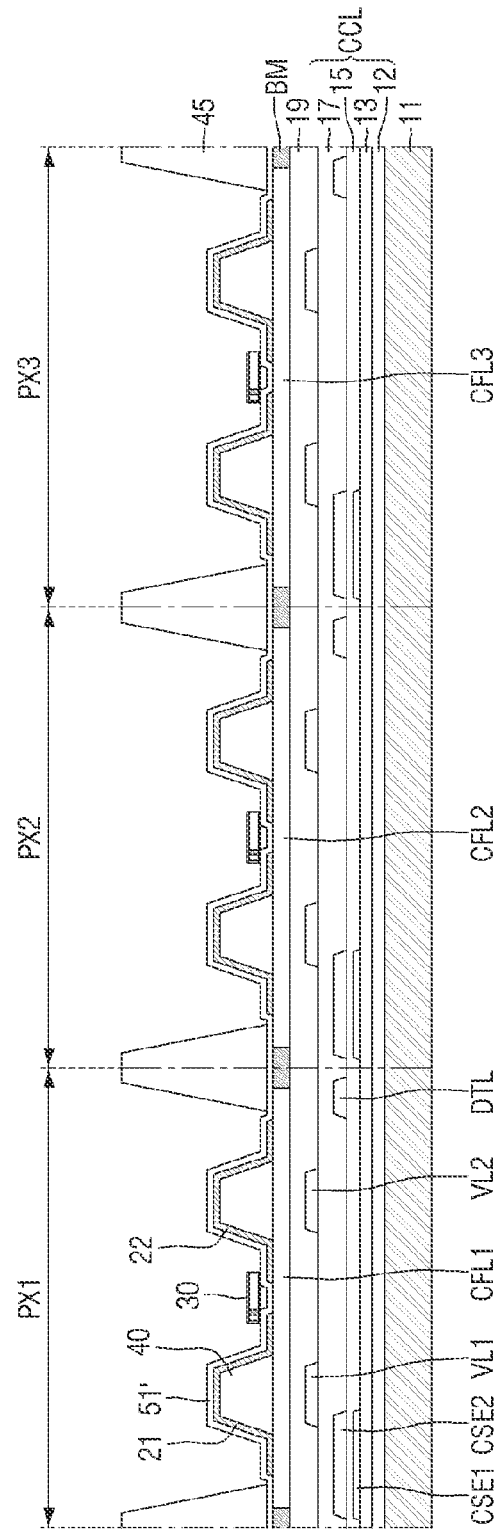

Next, referring to FIGS. 16 and 17, the light emitting elements 30 are disposed on the first insulating material layer 51'. Both ends of the light emitting element 30 may be disposed on the first electrode 21 and the second electrode 22 on the first insulating material layer 51'. In one or more embodiments, the light emitting element 30 may be prepared while being dispersed in ink S and may be sprayed to each sub-pixel PXn by a printing process using an inkjet printing apparatus. The ink S sprayed by the inkjet printing apparatus may be mounted in the region surrounded by the first bank 45. In this case, the first bank 45 may prevent the ink S from overflowing to another neighboring sub-pixel PXn.

When the ink S containing the light emitting elements 30 is sprayed, an electrical signal is applied to each of the electrodes 21 and 22 to arrange the plurality of light emitting elements 30 on the first insulating material layer 51'. When an electrical signal is applied to the plurality of electrodes 21 and 22, an electric field E may be generated between the electrodes 21 and 22. The light emitting elements 30 dispersed in the ink S may receive a dielectrophoretic force by the electric field E, and the light emitting element 30 that has received the dielectrophoretic force may be mounted on the first insulating material layer 51' while the orientation direction and position thereof are being changed.

Figure 18:
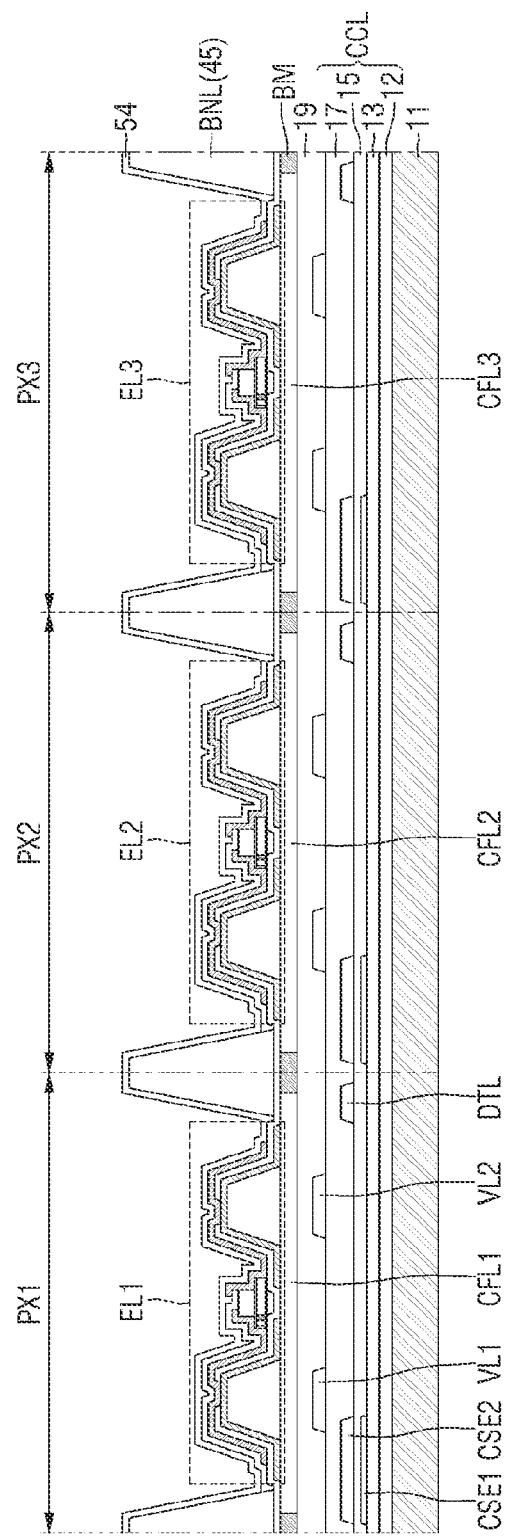

Next, referring to FIG. 18, when the light emitting elements 30 are disposed, the second insulating layer 52, the contact electrodes 26 and 27, the third insulating layer 53, and the fourth insulating layer 54 are stacked thereon, thereby forming the light emitting element layer EL.

Figure 19:
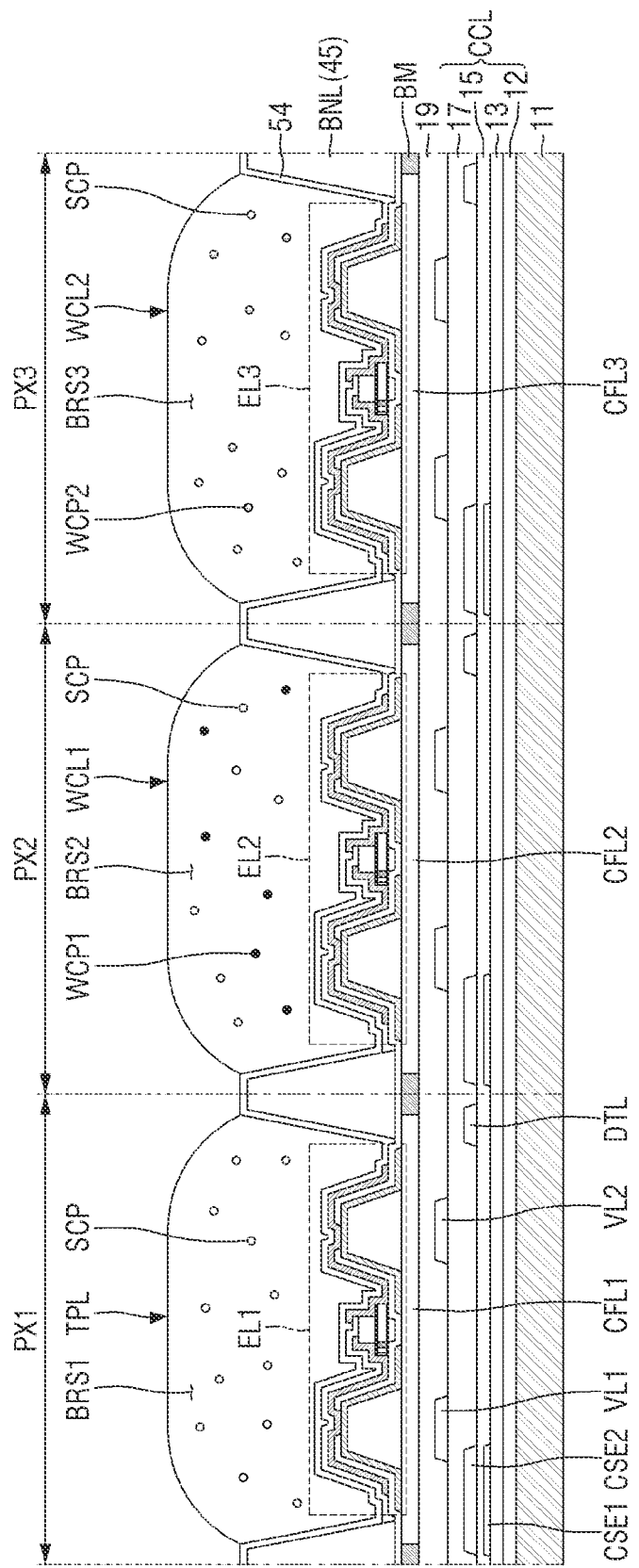

Next, referring to FIG. 19, the color control structures TPL and WCL are formed on the light emitting element layer EL in the region surrounded by the first banks 45. The light transmitting layer TPL is formed on the first light emitting element layer EL1 of the first sub-pixel PX1, the first wavelength conversion layer WCL1 is formed on the second light emitting element layer EL2 of the second sub-pixel PX2, and the second wavelength conversion layer WCL2 is formed on the third light emitting element layer EL3 of the third sub-pixel PX3.

The process of forming the color control structures TPL and WCL is not particularly limited. In one or more embodiments, the color control structures TPL and WCL may be formed by an inkjet printing process or a photoresist process.

For example, in the case of forming the color control structures TPL and WCL by an inkjet printing process, the color control structures TPL and WCL may be formed by spraying the base resins BRS1, BRS2, and BRS3 containing the scatterers SCP and/or the wavelength conversion materials WCP1 and WCP2 into the region surrounded by the first bank 45, and then drying them. Here, the first bank 45 may prevent the base resins BRS1, BRS2, and BRS3 from overflowing to another neighboring sub-pixel PXn, and different color control structures TPL and WCL may be formed for each sub-pixel PXn.

In one or more embodiments, in the case of forming the color control structures TPL and WCL by a photoresist process, the color control structures TPL and WCL may be formed by applying the base resins BRS1, BRS2, and BRS3 in which the scatterers SCP or the wavelength conversion materials WCP1 and WCP2 are dispersed into the region surrounded by the first bank 45, and then exposing and developing them. Here, the base resins BRS1, BRS2, and BRS3 containing different scatterers SCP or wavelength conversion materials WCP1 and WCP2 may be applied to different areas in the region surrounded by the first bank 45, and different color control structures TPL and WCL may be formed for each sub-pixel PXn.

Figure 20:
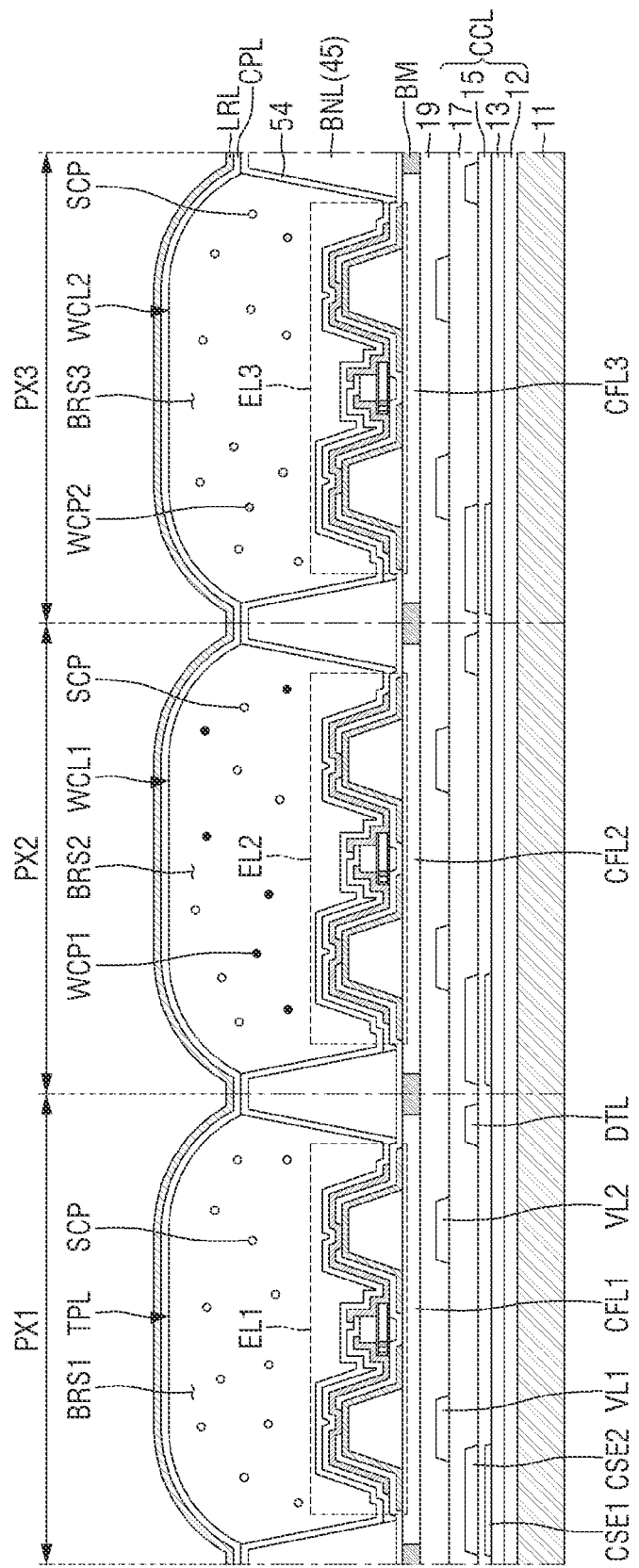
Figure 21:
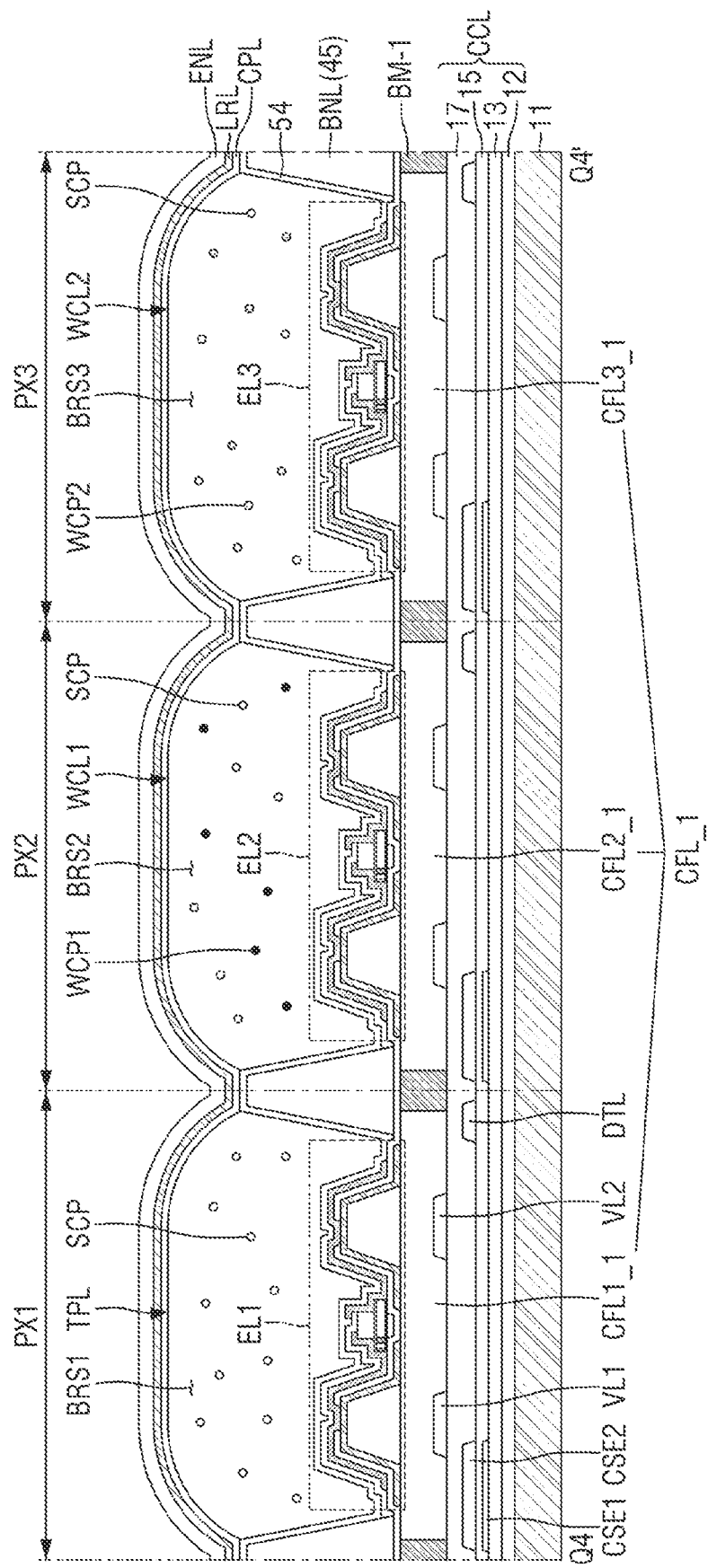
FIG. 21 is a cross-sectional view illustrating one pixel of a display device according to one or more embodiments.

Next, referring to FIG. 20, the capping layer CPL and the reflective layer LRL disposed on the color control structures TPL and WCL are formed, and the encapsulation layer ENL covering them is formed (e.g., see FIG. 21). The display device 10 including the color filter layer CFL, the light emitting element layer EL, and the color control structures TPL and WCL may be manufactured by the above processes. The display device 10 may be manufactured by sequentially stacking the circuit layer CCL, the color filter layer CFL, the light emitting element layer EL, the color control structures TPL and WCL, and the reflective layer LRL on one substrate while omitting a process of bonding the substrate to another substrate, so that the manufacturing process efficiency may be improved.

Hereinafter, one or more embodiments of the display device 10 will be described with reference to other drawings.

FIG. 21 is a cross-sectional view illustrating one pixel of a display device according to one or more embodiments.

Referring to FIG. 21, in the display device 10 according to one or more embodiments, the first planarization layer 19 may be omitted and a color filter layer CFL_1 may be directly disposed on the circuit layer CCL. The first planarization layer 19 may include an organic material to compensate the stepped portion formed by the circuit layer CCL disposed thereunder. Similar to the first planarization layer 19, the color filter layer CFL_1 and a light blocking member BM_1 may also include an organic material, and may compensate the stepped portion formed by the circuit layer CCL disposed thereunder. The present embodiment is different from the embodiment of FIG. 7 in that the first planarization layer 19 is omitted. In the following description, redundant description will be omitted while focusing on differences.

The light blocking member BM_1 is directly disposed on the first interlayer insulating layer 17. The light blocking member BM_1 may be disposed to surround each sub-pixel PXn on the first interlayer insulating layer 17, and a portion of the light blocking member BM_1 extending in the first direction DR1 may be disposed to partially cover the fourth conductive layer disposed thereunder. The color filter layer CFL_1 may also be directly disposed on the first interlayer insulating layer 17 and may be disposed to cover the first and second voltage lines VL1 and VL2 of the fourth conductive layer. Because the light emitting element layer EL is directly disposed on the color filter layer CFL_1, in one or more embodiments, the manufacturing process of the display device 10 may further include a process of flattening the top surfaces of the color filter layer CFL_1 and the light blocking member BM_1 after the color filter layer CFL_1 and the light blocking member BM_1 are formed. In the display device 10 according to the present embodiment, the first planarization layer 19 may be omitted, and the thicknesses of the color filter layer CFL_1 and the light blocking member BM_1 may be further increased. Accordingly, the manufacturing process of the display device 10 may be reduced by one step.

Figure 22:
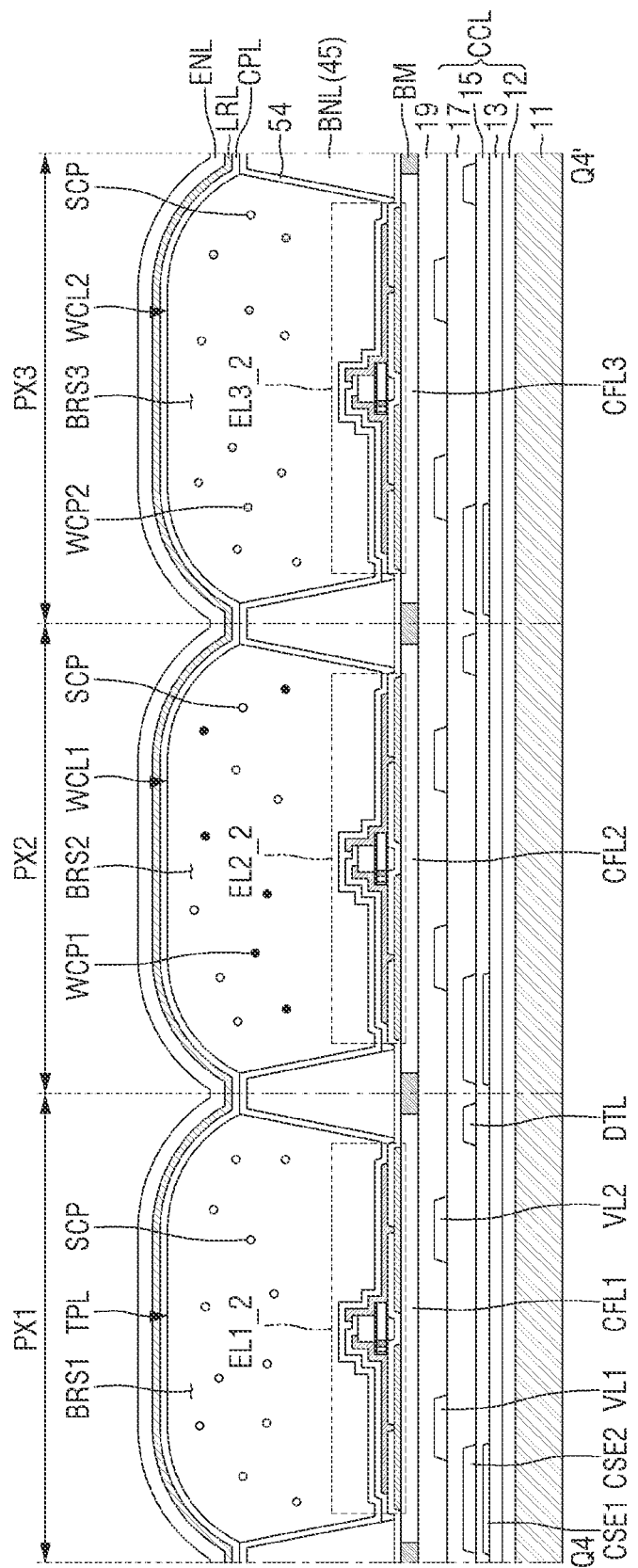
FIG. 22 is a cross-sectional view illustrating one pixel of a display device according to one or more embodiments.

FIG. 22 is a cross-sectional view illustrating one pixel of a display device according to one or more embodiments.

Referring to FIG. 22, in the display device 10 according to one or more embodiments, the second banks 40 may be omitted, and the electrodes 21 and 22 of a light emitting element layer EL_2 may be directly disposed on the color filter layer CFL. The present embodiment is different in that the second banks 40 are omitted and the electrodes 21 and 22 of the light emitting element layer EL_2 are directly disposed on the color filter layer CFL.

The second bank 40 may have a shape protruding with respect to the top surface of the color filter layer CFL, and may function as a reflective wall that reflects light emitted from the light emitting element 30 in an upward direction. However, because the color control structures TPL and WCL are directly disposed on the light emitting element layer EL_2, the base resins BRS1, BRS2, and BRS3, the scatterers SCP, and the wavelength conversion materials WCP1 and WCP2 may be disposed around the light emitting element 30. Even if the light emitted from the light emitting element 30 travel only toward both ends of the light emitting element 30, the lights incident on the scatterers SCP contained in the base resins BRS1, BRS2, and BRS3 may scatter and travel toward the reflective layer LRL. In other words, even if the second bank 40 for adjusting the movement path of the light emitted from the light emitting element 30 is omitted, the same effect may be obtained by the base resins BRS1, BRS2, and BRS3 and the scatterers SCP contained in the color control structures TPL and WCL. In the display device 10 according to one or more embodiments, the second bank 40 may be omitted, and the electrodes 21 and 22 of the light emitting element layer EL_2 may be entirely disposed directly on the color filter layer CFL. The bottom surfaces of the electrodes 21 and 22 may be in contact with the color filter layer CFL of each sub-pixel PXn. Further, the electrodes 21 and 22 directly disposed on the color filter layer CFL may reflect the light reflected by the circuit layer CCL and directed in the upward direction of the first substrate 11. Because the second bank 40 is omitted, the lights reflected by the circuit layer CCL may be reflected by the reflective layer LRL or the electrodes 21 and 22 and emitted toward the bottom surface of the first substrate 11.

Figure 23:
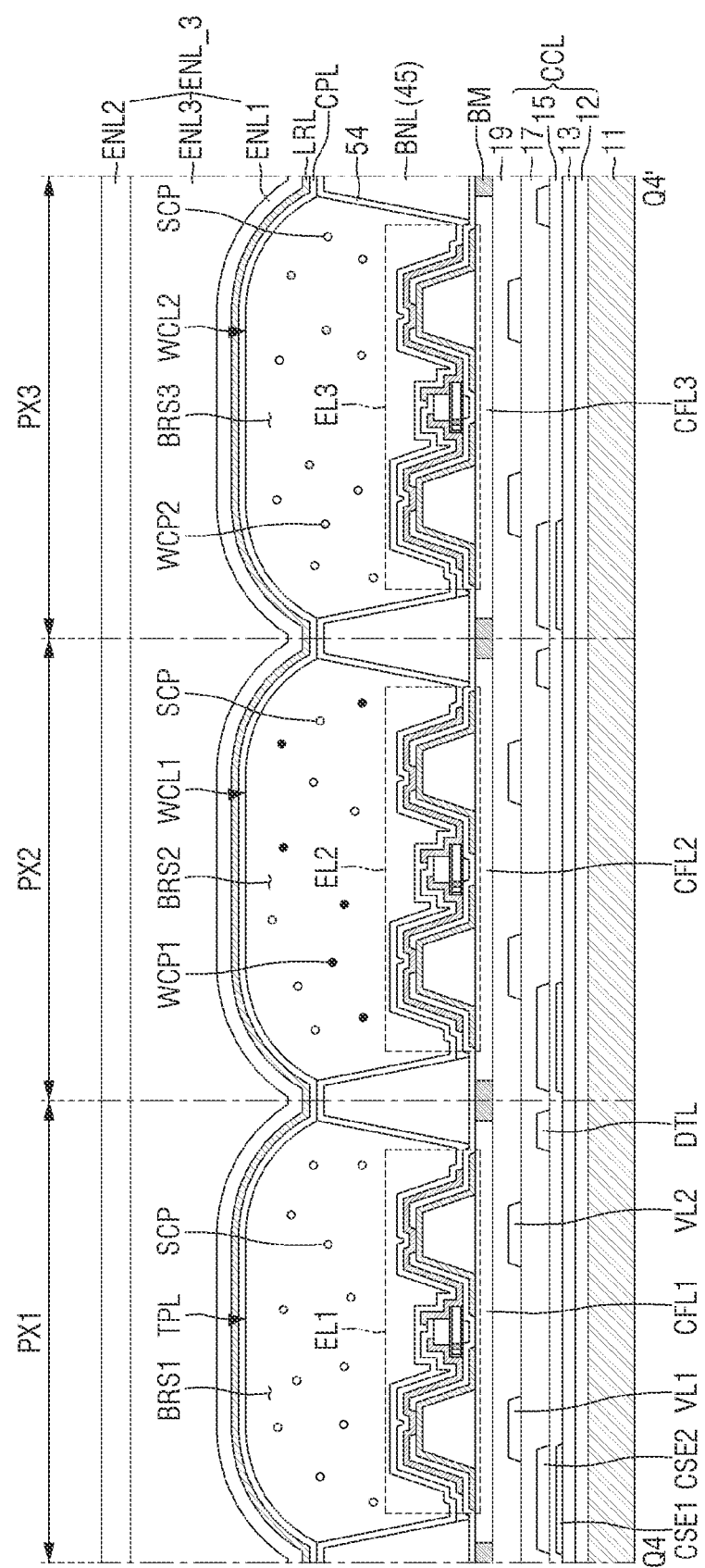
FIG. 23 is a cross-sectional view illustrating one pixel of a display device according to one or more embodiments.

FIG. 23 is a cross-sectional view illustrating one pixel of a display device according to one or more embodiments.

Referring to FIG. 23, in the display device 10 according to one or more embodiments, an encapsulation layer ENL_3 may include a plurality of layers. For example, the encapsulation layer ENL_3 may include a first inorganic encapsulation layer ENL1, a second inorganic encapsulation layer ENL2, and an organic encapsulation layer ENL3 disposed therebetween.

For example, the encapsulation layer ENL_3 may include a first inorganic encapsulation layer ENL1, a second inorganic encapsulation layer ENL2, and an organic encapsulation layer ENL3 disposed therebetween. Each of the first inorganic encapsulation layer ENL1 and the second inorganic encapsulation layer ENL2 may include silicon nitride, silicon oxide, silicon oxynitride, or the like. The organic encapsulation layer ENL3 may include an organic insulating material selected from the group consisting of acrylic resin, epoxy resin, phenolic resin, polyamide resin, polyimide resin, unsaturated polyester resin, polyphenylene resin, polyphenylenesulfide resin, and benzocyclobutene resin (BCB resin).

The first inorganic encapsulation layer ENL1 may be disposed to be curved along the stepped portion formed by the color control structures TPL and WCL and the reflective layer LRL disposed thereunder. However, the organic encapsulation layer ENL3 may have a flat top surface regardless of the stepped portion of the first inorganic encapsulation layer ENL1 disposed thereunder, and the second inorganic encapsulation layer ENL2 disposed on the uppermost layer may also have a flat surface. In the display device 10 according to one or more embodiments, the encapsulation layer ENL_3 may include a plurality of inorganic and organic encapsulation layers to have a flat top surface. The present embodiment is different from the embodiment of FIG. 7 in that the encapsulation layer ENL_3 includes a plurality of layers.

On the other hand, the reflective layer LRL may be made of another material, and may perform a function of capping the color control structures TPL and WCL.

Figure 24:
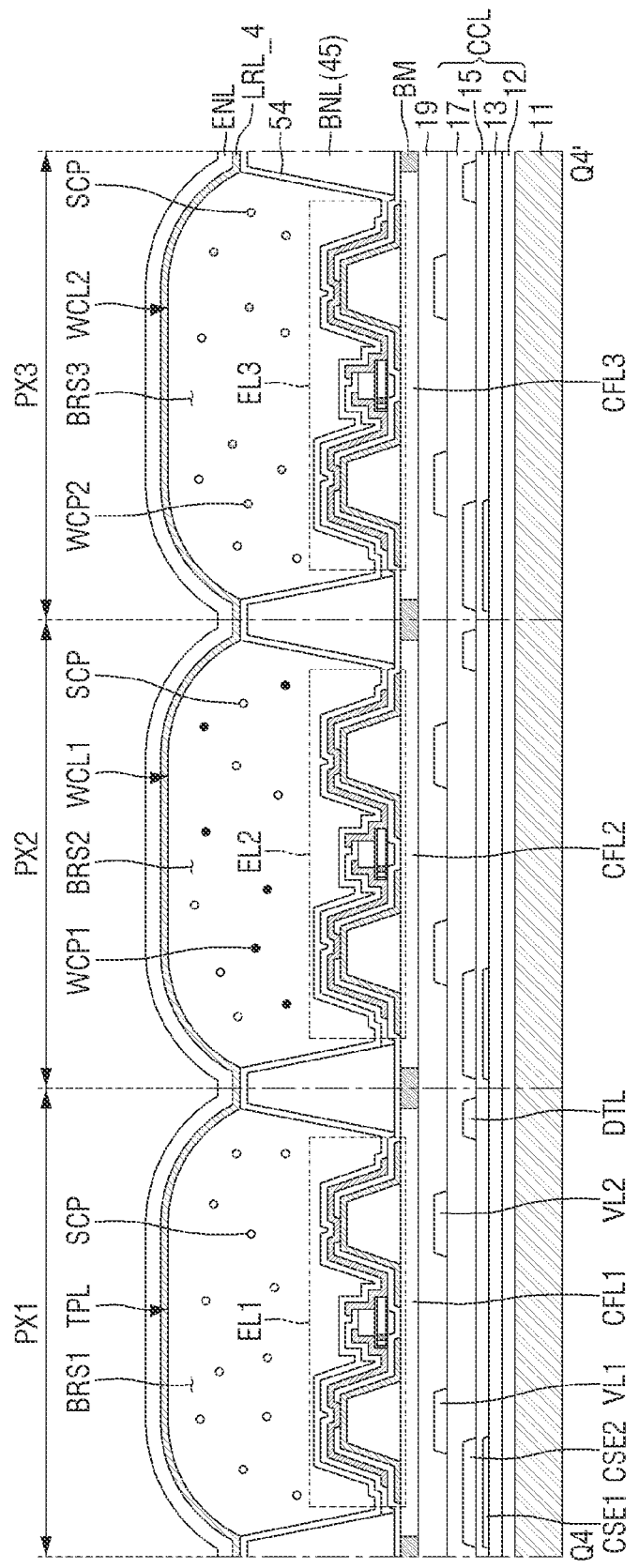
FIGS. 24 and 25 are cross-sectional views illustrating one pixel of a display device according to one or more embodiments.
Figure 25:
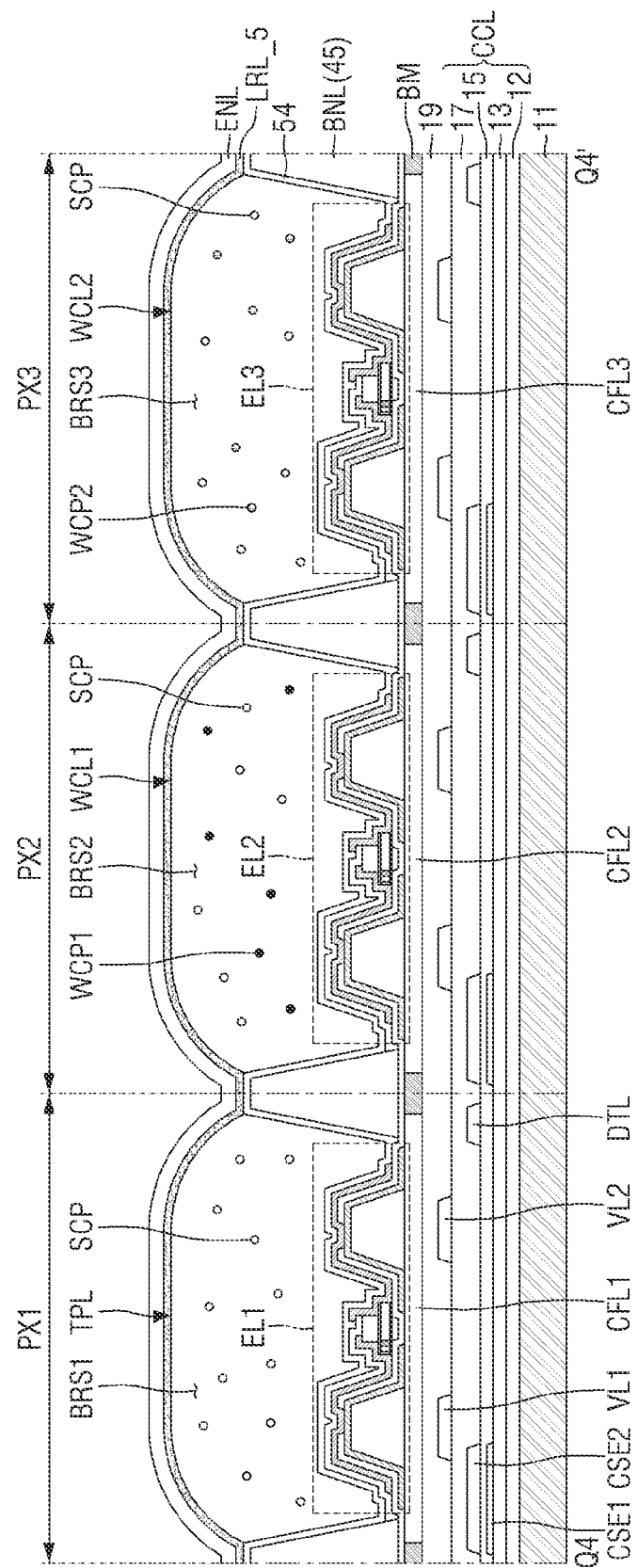

FIGS. 24 and 25 are cross-sectional views illustrating one pixel of a display device according to one or more embodiments.

First, referring to FIG. 24, in the display device 10, the capping layer CPL may be omitted and a reflective layer LRL_4 may be directly disposed on the color control structures TPL and WCL. When the color control structures TPL and WCL containing the base resins BRS1, BRS2, and BRS3 are formed by an inkjet printing process or a photoresist process, the capping layer CPL may be disposed on the color control structures TPL and WCL to protect them from external air and maintain the shape thereof. However, the capping layer CPL may be omitted if the color control structures TPL and WCL may be capped by the reflective layer LRL_4 without the capping layer CPL. The reflective layer LRL_4 may be directly disposed on the color control structures TPL and WCL, or may be in direct contact with the base resins BRS1, BRS2, and BRS3.

Further, referring to FIG. 25, in the display device 10, a reflective layer LRL_5 may be a low refractive layer containing a low refractive material having a low refractive index or a total reflection layer. The reflective layer LRL_5 may not necessarily contain a metal material having high reflectivity, and the incident light may be reflected by a plurality of insulating layers repeatedly stacked and having different refractive indices. When the reflective layer LRL_5 is a low refractive layer, it is possible to protect the color control structures TPL and WCL from external air due to an insulating material contained therein and also possible to reflect lights emitted from the light emitting element layer EL.

Figure 26:
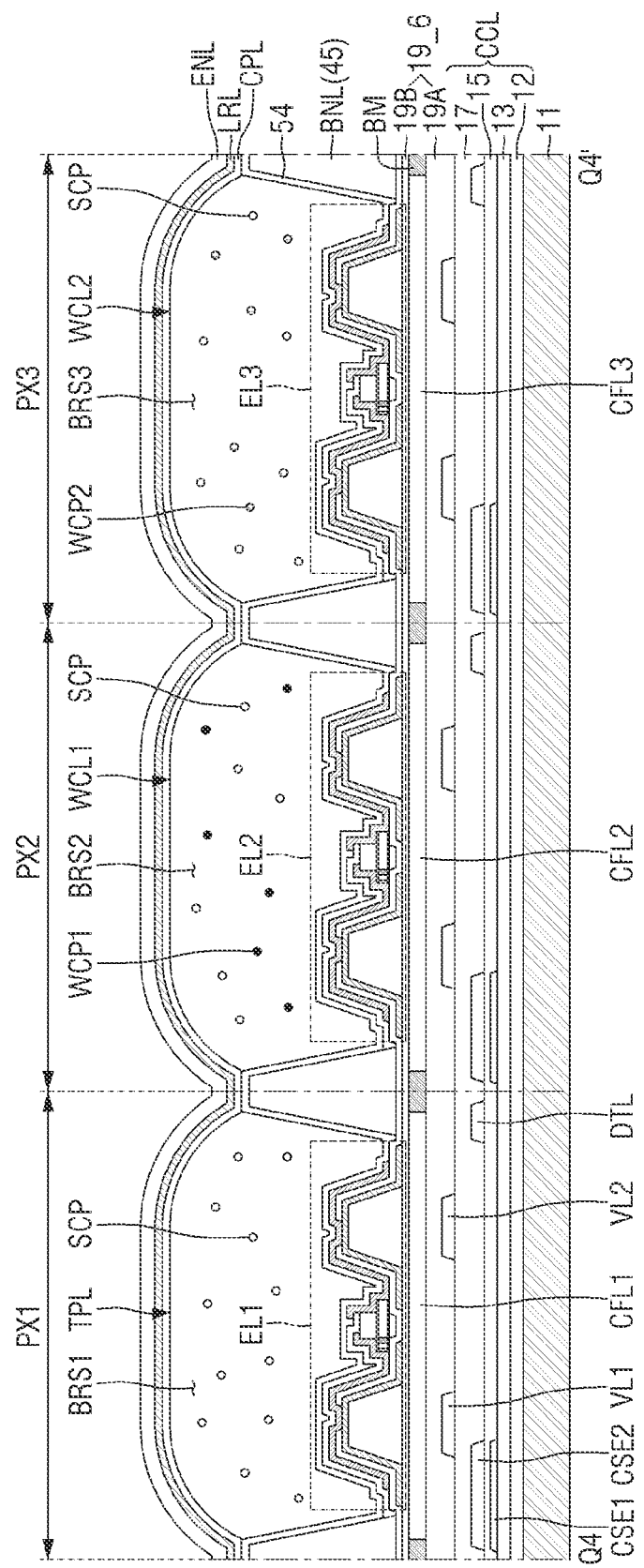
FIG. 26 is a cross-sectional view illustrating one pixel of a display device according to one or more embodiments.

FIG. 26 is a cross-sectional view illustrating one pixel of a display device according to one or more embodiments.

Referring to FIG. 26, the display device 10 may further include a second planarization layer 19B disposed between the color filter layer CFL and the light emitting element layer EL. A planarization layer 19_6 may further include the second planarization layer 19B disposed on the color filter layer CFL in addition to the first planarization layer 19A disposed between the circuit layer CCL and the color filter layer CFL. The second planarization layer 19B may be directly disposed on the color filter layer CFL to compensate the stepped portion formed by the light blocking member BM and the color filter layer CFL disposed for each sub-pixel PXn. The second bank 40 of the bank layer BNL, and the electrodes 21 and 22 and the first insulating layer 51 of the light emitting element layer EL may be disposed on the second planarization layer 19B. The present embodiment is different from the embodiment of FIG. 7 in that it further includes the second planarization layer 19B.

Figure 27:
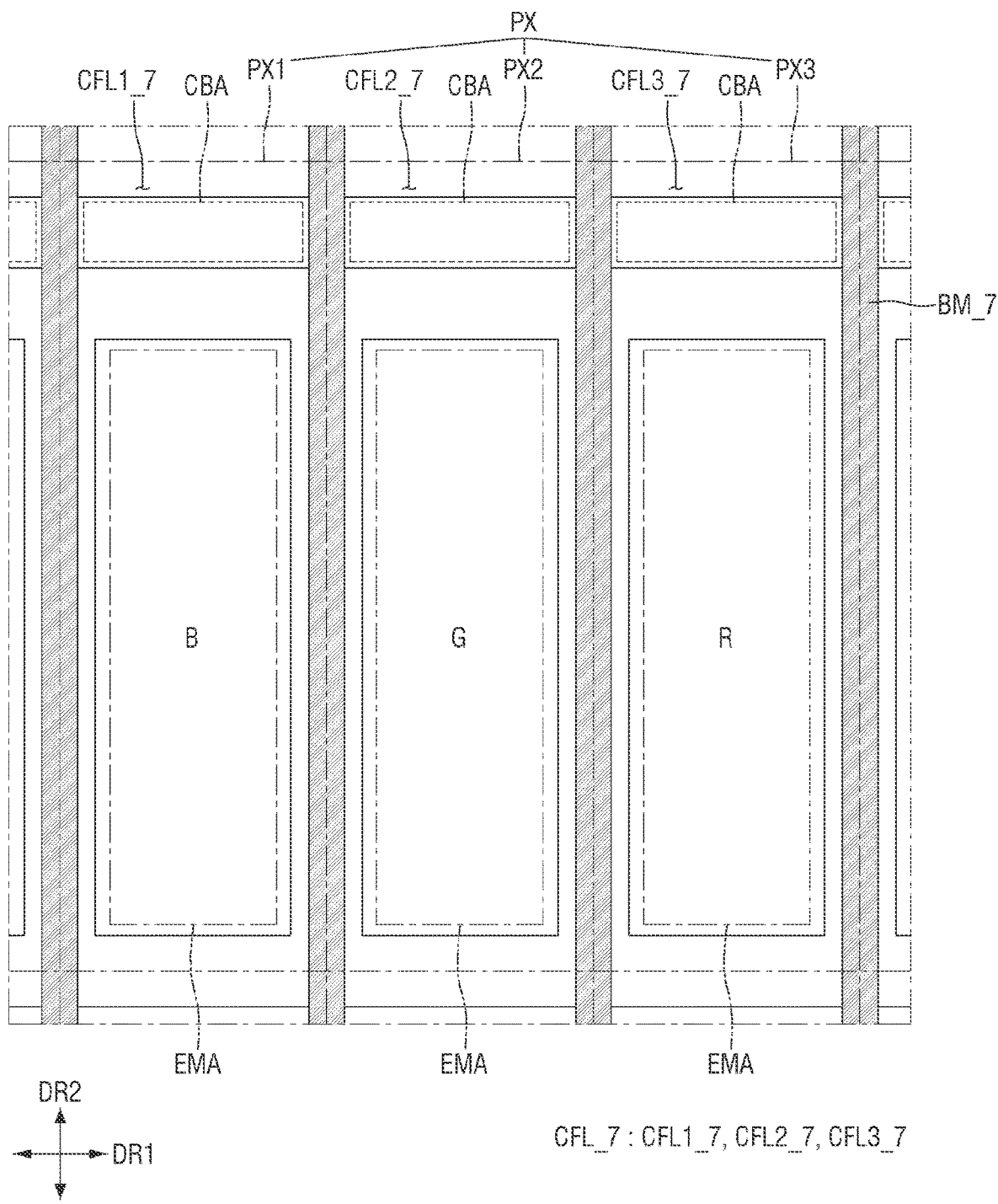
FIG. 27 is a schematic plan view showing a color filter layer disposed in one pixel of a display device according to one or more embodiments.

FIG. 27 is a schematic plan view showing a color filter layer disposed in one pixel of a display device according to one or more embodiments. FIG. 27 illustrates schematic arrangement of a color filter layer CFL_7 and a light blocking member BM_7 with respect to the bank layer BNL.

Referring to FIG. 27, in the display device 10, the color filter layer CFL_7 may extend in the second direction DR2 and may be disposed beyond a neighboring sub-pixel PXn. The plurality of sub-pixels PXn disposed in the display area DPA may be arranged along the first direction DR1 and the second direction DR2. In one or more embodiments, the sub-pixels PXn arranged along the second direction DR2 may emit light of the same color, and the color filter layers CFL_7 including the same colorant may be disposed therein.

In one or more embodiments, the color filter layers CFL_7 may extend in the second direction DR2 to be disposed beyond the boundary of the sub-pixel PXn, and the light blocking members BM_7 may also have a shape extending in the second direction DR2. Accordingly, the color filter layer CFL_7 and the light blocking member BM_7 may form a linear or stripe pattern over the entire display area DPA. The first color filter layer CFL1_7 may be disposed in the first sub-pixel PX1 and may be disposed across other sub-pixels PXn adjacent in the second direction DR2. Similarly, the second color filter layer CFL2_7 and the third color filter layers CFL3_7 may also be disposed across other sub-pixels PXn adjacent in the second direction DR2 in the second sub-pixel PX2 and the third sub-pixel PX3, respectively. The present embodiment is different from the embodiment of FIG. 3 in that the color filter layers CFL_7 form a linear pattern.

On the other hand, in order to allow the light emitted from the light emitting element layer EL to be reflected from the reflective layer LRL and smoothly emitted to the bottom surface of the first substrate 11, it may be required to secure a certain ratio of the area in which the conductive layers of the circuit layer CCL are not disposed compared to the emission area EMA, that is, a certain opening ratio. In accordance with one or more embodiments, in the display device 10, the conductive layers of the circuit layer CCL may be disposed to overlap the non-emission area NEA or the bank layer BNL without overlapping the emission area EMA.

Figure 28:
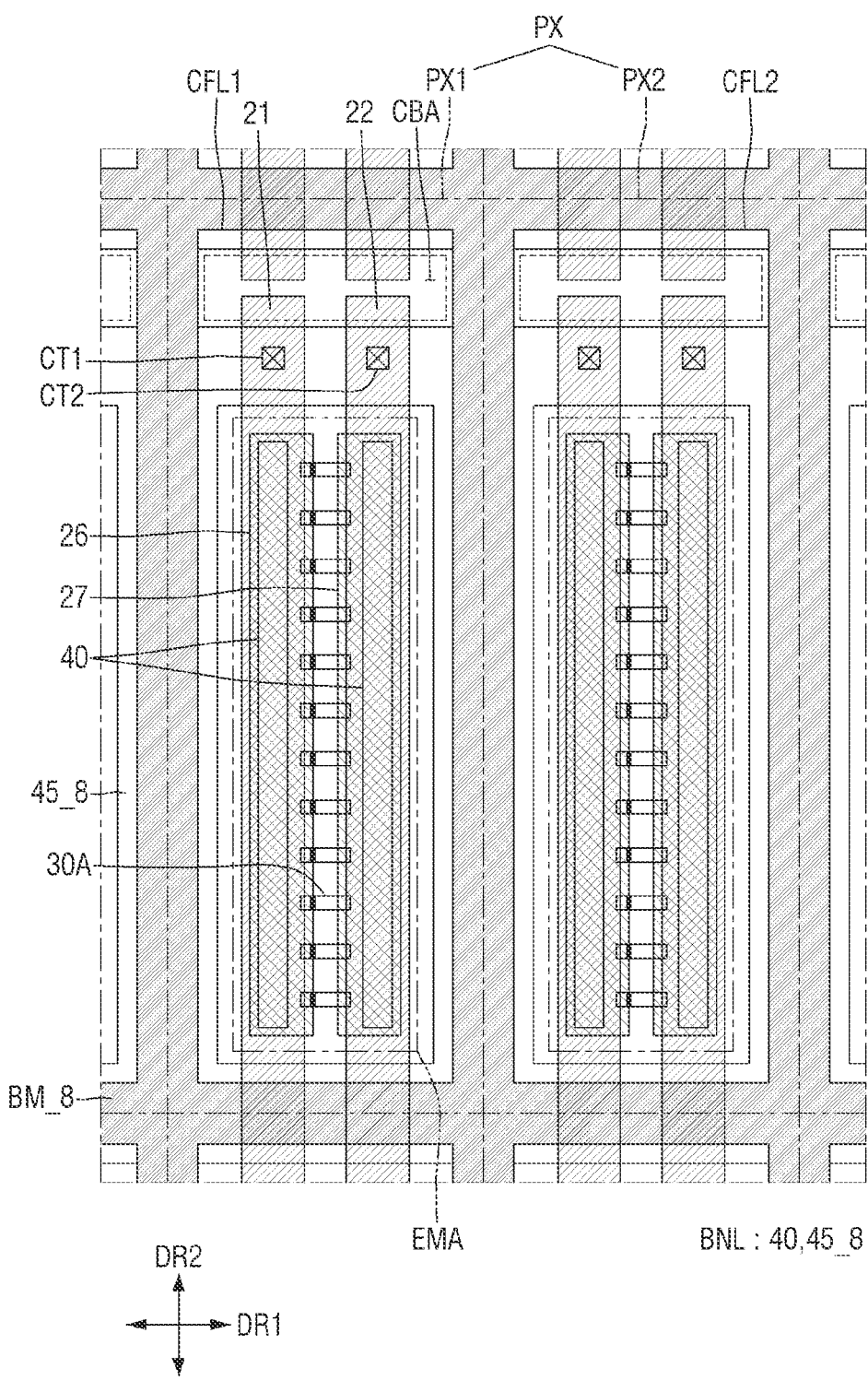
FIG. 28 is a schematic plan view illustrating a color filter layer disposed in some sub-pixels of a display device according to one or more embodiments.
Figure 29:
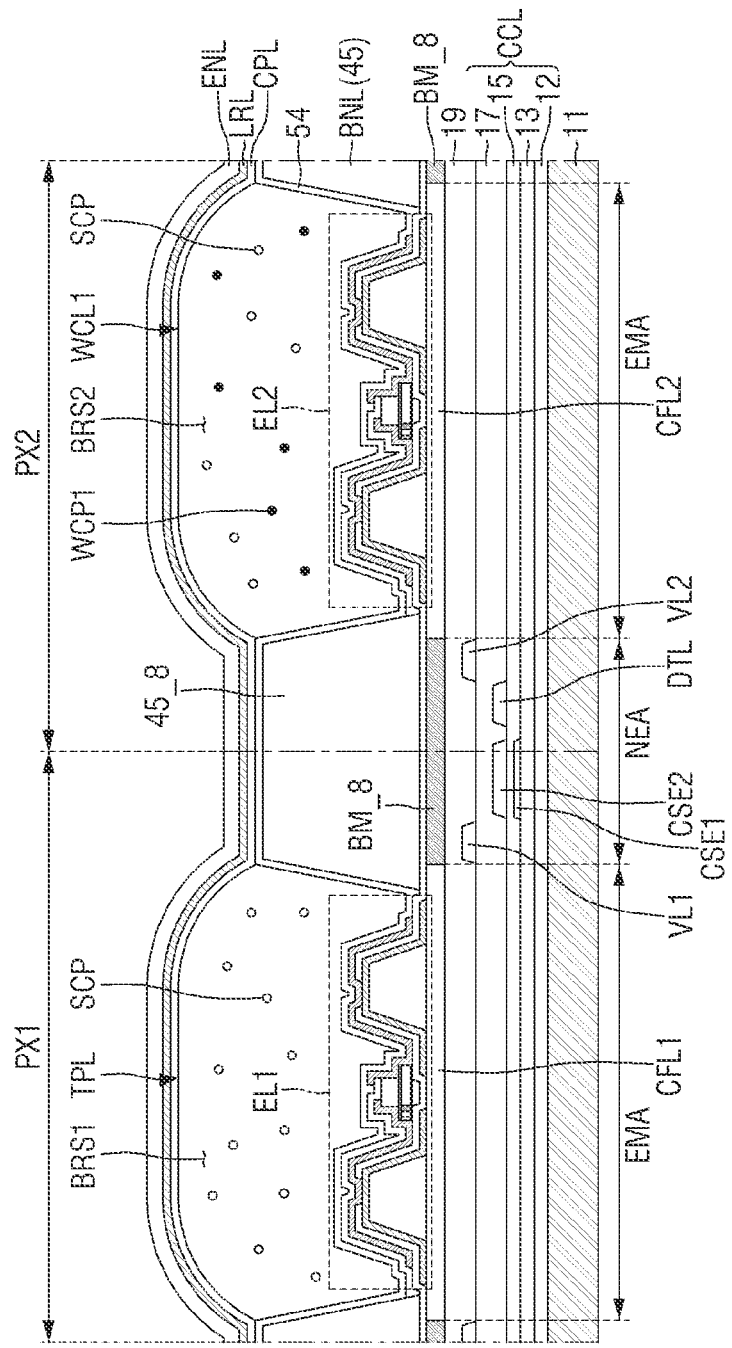
FIG. 29 is a schematic cross-sectional view illustrating some sub-pixels of the display device of FIG. 28.

FIG. 28 is a schematic plan view illustrating a color filter layer disposed in some sub-pixels of a display device according to one or more embodiments. FIG. 29 is a schematic cross-sectional view illustrating some sub-pixels of the display device of FIG. 28. FIG. 28 illustrates schematic planar arrangement of the color filter layer CFL and the light emitting element layer EL of the first sub-pixel PX1 and the second sub-pixel PX2, and FIG. 29 illustrates a schematic cross section including the boundary between the first sub-pixel PX1 and the second sub-pixel PX2.

Referring to FIGS. 28 and 29, in the display device 10, the conductive layers disposed on the circuit layer CCL of each sub-pixel PXn may be disposed to overlap the bank layer BNL disposed at the boundary of the sub-pixel PXn, and the emission area EMA may not overlap the circuit elements in the thickness direction of the first substrate 11. In one or more embodiments, in the display device 10, the first bank 45 of the bank layer BNL may be formed to have a larger width, and the conductive layers of the circuit layer CCL may be disposed only in the region overlapping the first bank 45. Although FIG. 29 illustrates only the first capacitive electrode CSE1, the second capacitive electrode CSE2, the data line DTL, the first voltage line VL1, and the second voltage line VL2, the present disclosure is not limited thereto, and the active layer ACT, the gate electrode GE, and the source/drain electrodes SD1 and SD2 of the first transistor TR1 may also be disposed to overlap the first bank 45 in the thickness direction of the first substrate 11.

The wirings extending in one direction of the circuit layer CCL may extend while overlapping them in the thickness direction in the non-emission area NEA in which the first bank 45 is disposed, and the layers of the storage capacitor and the transistor may be disposed adjacent to the lines. Accordingly, the conductive layers disposed in the circuit layer CCL may be disposed so as not to overlap the emission area EMA, and lights passing through the color filter layer CFL in the emission area EMA may be emitted toward the bottom surface of the first substrate 11 without being reflected from the circuit layer CCL. In the display device 10 according to the present embodiment, the conductive layers of the circuit layer CCL are disposed only in the non-emission area NEA, so that a sufficient opening ratio in which the conductive layer of the circuit layer CCL is not disposed compared to the emission aera EMA may be ensured, which makes it possible to improve the light emission amount and light emission efficiency of each sub-pixel PXn.

In one or more embodiments, the first electrode 21 and the second electrode 22 may not necessarily have a shape extending in one direction. In one or more embodiments, the electrodes 21 and 22 of the display device 10 may have a shape including portions extending with different widths and portions extending in different directions.

Figure 30:
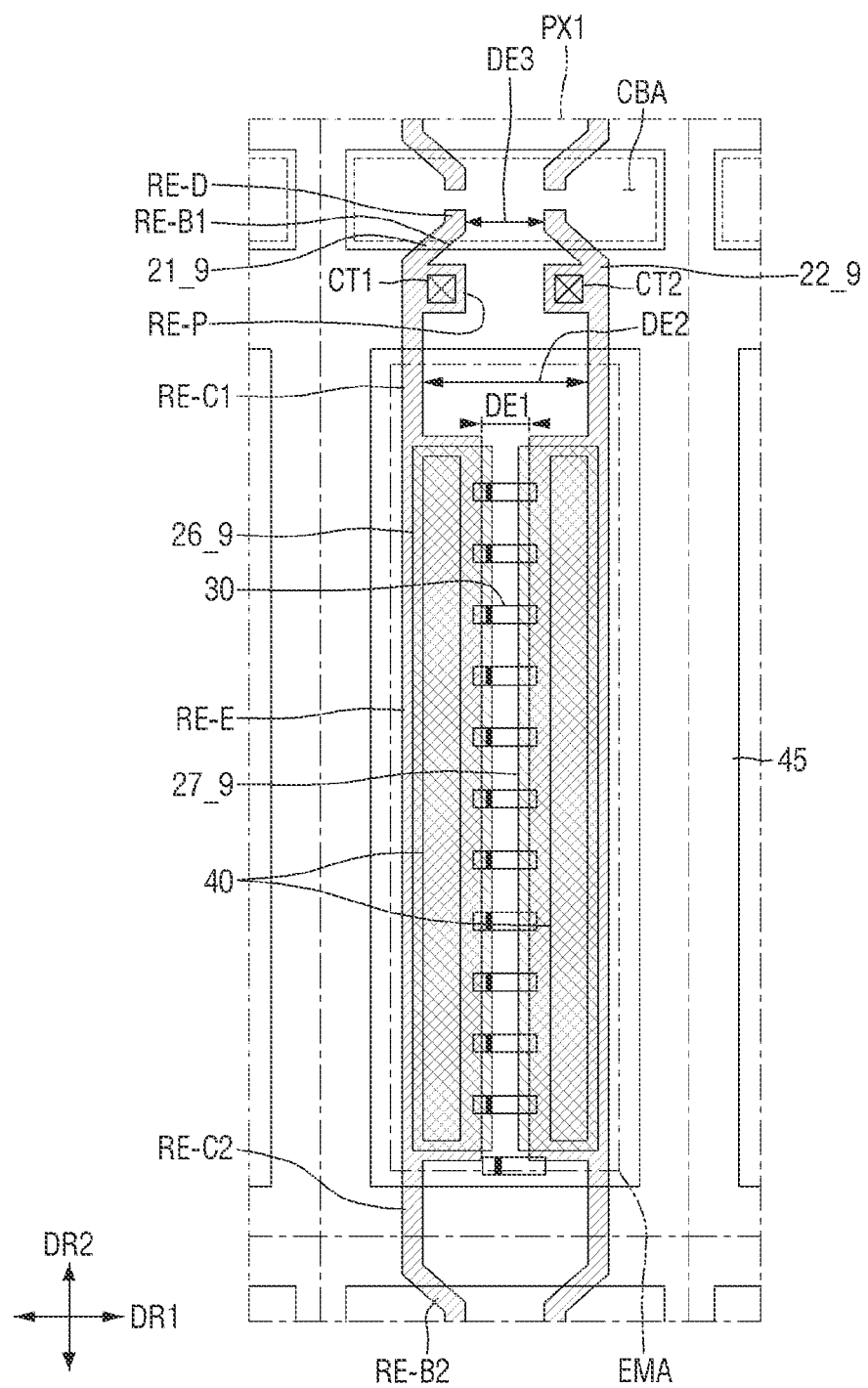
FIG. 30 is a schematic plan view illustrating a light emitting element layer of one sub-pixel of a display device according to one or more embodiments.

FIG. 30 is a schematic plan view illustrating a light emitting element layer of one sub-pixel of a display device according to one or more embodiments.

Referring to FIG. 30, electrodes 21_9 and 22_9 of the display device 10 according to one or more embodiments may include an extension portion RE-E extending in the second direction DR2 and having a width greater than those of other portions, bent portions RE-B1 and RE-B2 extending in a direction inclined from the first direction DR1 and the second direction DR2, and connection portions RE-C1 and RE-C2 connecting the bent portions RE-B1 and RE-B2 and the extension portion RE-E. Each of the electrodes 21_9 and 22_9 may have an overall shape extending in the second direction DR2, and may have a partially larger width or a shape bent in a direction inclined from the second direction DR2. The first electrode 21_9 and the second electrode 22_9 may be disposed in a symmetrical structure with respect to the region therebetween. Further, in one or more embodiments, the light blocking member BM, the color filter layer CFL, the color control structures TPL and WCL, and the reflective layer LRL may be disposed in the same manner as described above with reference to FIGS. 3 to 5 with respect to the first bank 45. Hereinafter, the redundant description will be omitted and the shape of the first electrode 21_9 will be mainly described.

The first electrode 21_9 may include the extension portion RE-E having a width greater than those of other portions. The extension portion RE-E may be disposed on the second banks 40 in the emission area EMA of the sub-pixel PXn and may extend in the second direction DR2. The light emitting elements 30 may be disposed on the extension portions RE-E of the first electrode 21_9 and the second electrode 22_9. Further, the first contact electrode 26_9 and the second contact electrode 27_9 may be disposed on the extension portions RE-E of the electrodes 21_9 and 22_9, respectively, and the widths thereof may be smaller than the widths of the extension portions RE-E of the electrodes 21_9 and 22_9.

The connection portions RE-C1 and RE-C2 may be connected to both sides of the extension portions RE-E in the second direction DR2. The first connection portion RE-C1 may be disposed on one side of the extension portion RE-E in the second direction DR2, and the second connection portion RE-C2 may be disposed on the other side of the extension portion RE-E in the second direction DR2. The connection portions RE-C1 and RE-C2 may be connected to the extension portion RE-E and may be disposed over the emission area EMA of each sub-pixel PXn and the first bank 45.

The widths of the first connection portion RE-C1 and the second connection portion RE-C2 may be smaller than the width of the extension portion RE-E. One sides of the connection portions RE-C1 and RE-C2 extending in the second direction DR2 may be connected to one side of the extension portion RE-E extending in the second direction DR2 on the same line. For example, from among both sides of the extension portion RE-E and both sides of the connection portions RE-C1 and RE-C2, one sides positioned on the outer sides with respect to the center of the emission area EMA may be extended and connected. Accordingly, a distance DE1 between the extension portions RE-E of the first electrode 21_9 and the second electrode 22_9 may be smaller than a distance DE2 between the connection portions RE-C1 of the first electrode 21_9 and the second electrode 22_9 and the connection portions RE-C2 of the first electrode 21_9 and the second electrode 22_9.

The bent portions RE-B1 and RE-B2 are connected to the connection portions RE-C1 and RE-C2. The bent portions RE-B1 and RE-B2 may include the first bend portion RE-B1 connected to the first connection portion RE-C1 and disposed across the first bank 45 and the sub-region CBA, and the second bent portion RE-B2 connected to the second connection portion RE-C2 and disposed across the first bank 45 and the sub-region CBA of another sub-pixel PXn. The bent portions RE-B1 and RE-B2 may be connected to the connection portions RE-C1 and RE-C2 and may be bent in a direction inclined from the second direction DR2, for example, toward the center of the sub-pixel PXn. A shortest distance DE3 between the bent portions RE-B1 of the first electrode 21_9 and the second electrode 22_9 and the bent portions RE-B2 of the first electrode 21_9 and the second electrode 22_9 may be smaller than the distance DE2 between the connection portions RE-C1 and RE-C2. However, the shortest distance DE3 between the bent portions RE-B1 and RE-B2 may be greater than the distance DE1 between the extension portions RE-E.

A contact portion RE-P having a relatively large width may be formed at a portion where the first connection portion RE-C1 and the first bent portion RE-B1 are connected. The contact portion RE-P may overlap the first bank 45, so that the first contact hole CT1 of the first electrode 21_9 and the second contact hole CT2 of the second electrode 22_9 may be formed.

Further, a piece portion RE-D remaining after the first electrode 21_9 and the second electrode 22_9 are separated in the sub-region CBA may be formed at one end of the first bent portion RE-B1. The piece portion RE-D may be a portion remaining after the electrodes 21_9 and 22_9 of the sub-pixel PXn adjacent in the second direction DR2 are disconnected in the sub-region CBA.

The embodiment of FIG. 30 is different from the embodiment of FIG. 2 in that the first electrode 21_9 and the second electrode 22_9, each including the extension portion RE-E, the connection portions RE-C1 and RE-C2, and the bent portions RE-B1 and RE-B2, are symmetrically disposed with respect to the center of the sub-pixel PXn. However, the present disclosure is not limited thereto, and in some cases, the first electrode 21_9 and the second electrode 22_9 may have different shapes.

Figure 31:
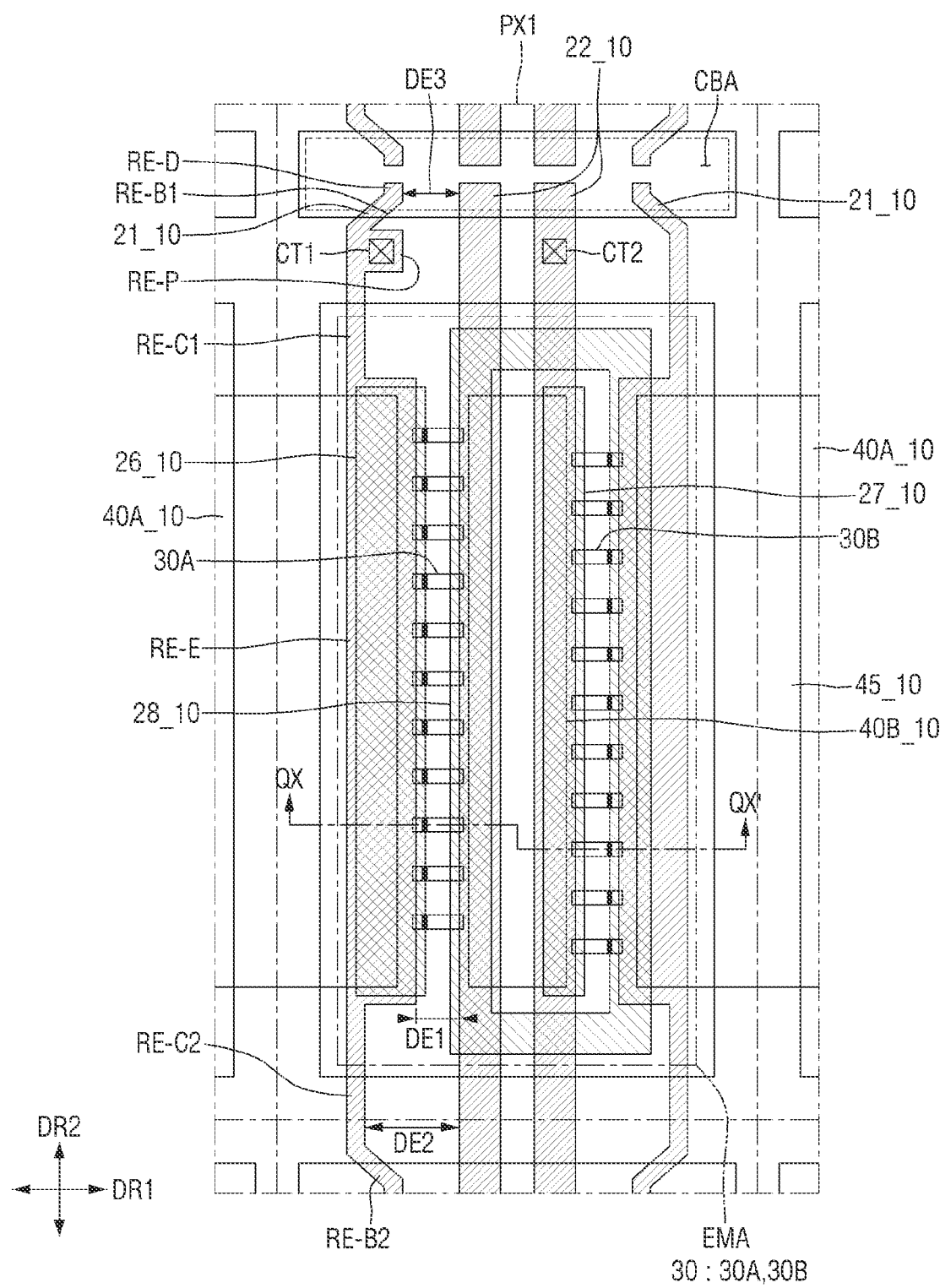
FIG. 31 is a schematic plan view illustrating a light emitting element layer of one sub-pixel of a display device according to one or more embodiments.
Figure 32:
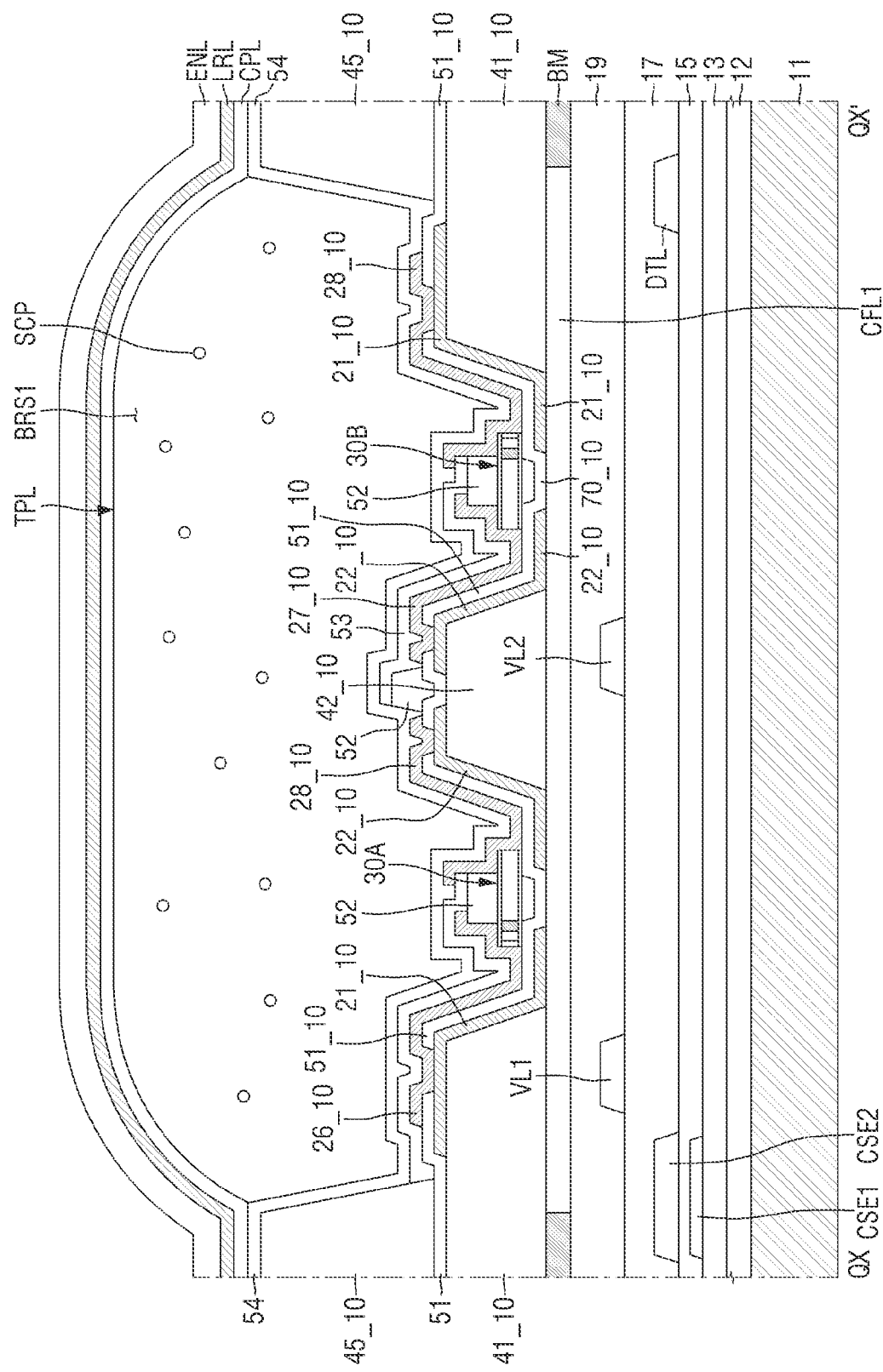
FIG. 32 is a cross-sectional view taken along the line QX-QX' of FIG. 31.

FIG. 31 is a schematic plan view illustrating a light emitting element layer of one sub-pixel of a display device according to one or more embodiments. FIG. 32 is a cross-sectional view taken along the line QX-QX' of FIG. 31.

Referring to FIGS. 31 and 32, the display device 10 may include a plurality of first electrodes 21_10 and a plurality of second electrodes 22_10 for each sub-pixel PXn. The first electrodes 21_10 have the same shape as that in the embodiment of FIG. 30, and the plurality of first electrodes 21_10, for example, two first electrodes 21_10 may be symmetrically disposed with respect to the center of the sub-pixel PXn. The second electrodes 22_10 may have the same shape as that in the embodiment of FIG. 2, and a plurality of second electrodes 22_10, for example, two second electrodes 21_10 may be disposed between the first electrodes 21_10. The distance between the first electrode 21_10 and the second electrode 22_10 may vary depending on portions of the first electrode 21_10. For example, the distance DE1 between the extension portion RE-E and the second electrode 22_10 may be smaller than the distance DE2 between the connection portions RE-C1 and RE-C2 and the second electrode 22_10 and the distance DE3 between the bent portions RE-B1 and RE-B2 and the second electrode 22_10. The distance DE2 between the connection portions RE-C1 and RE-C2 and the second electrode 22_10 may be greater than the distance DE3 between the bent portions RE-B1 and RE-B2 and the second electrode 22_10. However, the present disclosure is not limited thereto. Because the shape of each of the electrodes 21_10 and 22_10 is the same as that described above with reference to FIGS. 4 and 30, detailed description thereof will be omitted.

In one or more embodiments, the arrangement and shapes of the second banks 40 (40A_10 and 40B_10), a first insulating layer 51_10, and contact electrodes 26_10, 27_10, and 28_10 disposed in each sub-pixel PXn may vary depending on the arrangement of the first electrodes 21_10 and the second electrodes 22_10.

The first insulating layer 51_10 may be disposed between the extension portion RE-E of the first electrode 21_10 and the second electrode 22_10, and both side surfaces thereof may be in contact with them. The light emitting element 30 may have one end disposed on the extension portion RE-E of the first electrode 21_10 and the other end disposed on the second electrode 22_10.

The second bank 40 may include the first sub-bank 40A_10 and the second sub-bank 40B_10 having different widths. The first sub-bank 40A_10 and the second sub-bank 40B_10 may extend in the second direction DR2, and may have different widths measured in the first direction DR1. The first sub-bank 40A_10 has a width greater than that of the second sub-bank 406_10, and thus may be disposed across the boundary between the sub-pixels PXn adjacent in the first direction DR1. For example, the first sub-banks 40A_10 may include the emission area EMA of each sub-pixel PXn and located over the boundary between the sub-pixels. Accordingly, the portion of the first bank 45_10 extending in the second direction DR2 may be partially disposed on the first sub-bank 40A_10. Two first sub-banks 40A_10 may be partially disposed in one sub-pixel PXn. One second sub-bank 40B_10 may be disposed between the first sub-banks 40A_10.

The second sub-bank 40B_10 may extend in the second direction DR2 from the center of the emission area EMA of the sub-pixel PXn. The second sub-bank 40B_10 may have a width smaller than that of the first sub-bank 40A_10 and may be disposed between the first sub-banks 40A_10 while being spaced therefrom.

The extension portions RE-E of the first electrode 21_10 and the first bank 45_10 may be disposed on the first sub-banks 40A_10. The extension portions RE-E of the first electrodes 21_10 of the sub-pixels PXn adjacent in the first direction DR1 may be disposed on the first sub-bank 40A_10. That is, the extension portions RE-E of two first electrodes 21_10 are disposed on one first sub-bank 40A_10. Two second electrodes 22_10 may be disposed on the second sub-bank 40B_10. The second electrodes 22_10 may be disposed on both sides of the second sub-bank 40B_10 extending in the second direction DR2, and may be spaced from each other on the second sub-bank 40B_10.

The contact portion RE-P may be formed at one of the first electrodes 21_10 to form the first contact hole CT1, and the contact portion RE-P may not be formed at another first electrode 21_10. Similarly, the contact portion RE-P may be formed at one of the second electrodes 22_10 to form the second contact hole CT2, and the contact portion RE-P may not be formed at another second electrode 22_10. The electrodes 21_10 and 22_10 connected to the first transistor TR1 or the second voltage line VL2 through the contact holes CT1 and CT2 may receive an electrical signal therefrom, and other electrodes 21_10 and 22_10 may receive an electrical signal through the contact electrodes 26_10, 27_10, and 28_10 to be described later.

Both ends of the light emitting elements 30 are disposed on the extension portion RE-E of the first electrode 21_10 and the second electrode 22_10 on the first insulating layer 51_10. Between both ends of the light emitting element 30, one end on which the second semiconductor layer 32 is disposed may be disposed on the first electrode 21_10. Accordingly, one ends of first type light emitting elements 30A between the electrodes 21_10 and 22_10 disposed on the left side with respect to the center of the sub-pixel PXn and one ends of second type light emitting elements 30B between the electrodes 21_10 and 22_10 disposed on the right side may be directed in opposite directions.

The display device 10 includes a larger number of electrodes 21_10 and 22_10, and thus may include a larger number of contact electrodes 26_10, 27_10, and 28_10.

In one or more embodiments, the contact electrodes 26_10, 27_10, and 28_10 may include the first contact electrode 26_10 disposed on any one first electrode 21_10, the second contact electrode 27_10 disposed on any one second electrode 22_10, and the third contact electrode 28_10 disposed on another first electrode 21_10 and another second electrode 22_10 and surrounding the second contact electrode 27_10.

The first contact electrode 26_10 is disposed on any one first electrode 21_10. For example, the first contact electrode 26_10 is disposed on the extension portion RE-E of the first electrode 21_10 on which one end of the first type light emitting element 30A is disposed. The first contact electrode 26_10 may be in contact with the extension portion RE-E of the first electrode 21_10 and one end of the first type light emitting element 30A. The second contact electrode 27_10 is disposed on any one second electrode 22_10. For example, the second contact electrode 27_10 is disposed on the second electrode 22_10 on which the other end of the second type light emitting element 30B is disposed. The second contact electrode 27_10 may be in contact with the second electrode 22_10 and the other end of the second type light emitting element 30B. The first contact electrode 26_10 and the second contact electrode 27_10 may be in contact with the electrodes 21_10 and 22_10 in which the first contact hole CT1 and the second contact hole CT2 are formed, respectively. The first contact electrode 26_10 may be in contact with the first electrode 21_10 electrically connected to the first transistor TR1 through the first contact hole CT1, and the second contact electrode 27_10 may be in contact with the second electrode 22_10 electrically connected to the second voltage line VL2 through the second contact hole CT2. The first contact electrode 26_10 and the second contact electrode 27_10 may transmit an electrical signal applied from the first transistor TR1 or the second voltage line VL2 to the light emitting elements 30. The first contact electrode 26_10 and the second contact electrode 27_10 are substantially the same as described above.

The electrodes 21_10 and 22_10 in which the contact holes CT1 and CT2 are not formed are further disposed in each sub-pixel PXn. They may be substantially in a floating state in which an electrical signal is not directly applied from the first transistor TR1 or the second voltage line VL2. However, the third contact electrode 28_10 may be disposed on the electrodes 21_10 and 22_10 in which the contact holes CT1 and CT2 are not formed, and the electrical signal transmitted to the light emitting element 30 may flow through the third contact electrode 28_10.

The third contact electrode 28_10 may be disposed on the first electrode 21_10 and the second electrode 22_10 in which the contact holes CT1 and CT2 are not formed, and may be disposed to surround the second contact electrode 27_10. The third contact electrode 28_10 may include portions extending in the second direction DR2 and a portion connecting them and extending in the first direction DR1 to surround the second contact electrode 27_10. The portions of the third contact electrode 28_10 extending in the second direction DR2 may be disposed on the first electrode 21_10 and the second electrode 22_10 in which the contact holes CT1 and CT2 are not formed, and may be in contact with the light emitting element 30. For example, a portion of the third contact electrode 28_10 disposed on the second electrode 22_10 may be in contact with the other end of the first type light emitting element 30A, and a portion thereof disposed on the first electrode 21_10 may be in contact with one end of the second type light emitting element 30B. A portion of the third contact electrode 28_10 extending in the first direction DR1 may overlap the second electrode 22_10 in which the second contact hole CT2 is formed, but another insulating layer may be disposed therebetween to prevent direct connection therebetween.

The electrical signal transmitted from the first contact electrode 26_10 to one end of the first type light emitting element 30A is transmitted to the third contact electrode 28_10 in contact with the other end of the first type light emitting element 30A. The third contact electrode 28_10 may transmit the electrical signal to one end of the second type light emitting element 30B, and this may be transmitted to the second electrode 22_10 through the second contact electrode 27_10. Accordingly, the electrical signal for light emission of the light emitting element 30 may be transmitted to only one first electrode 21_10 and only one second electrode 22_10, and the first type light emitting element 30A and the second type light emitting element 30B may be connected in series through the third contact electrode 28_10.

The display device 10 may be a rear emission type light emitting display device that includes the reflective layer LRL to emit light emitted from the light emitting element 30 to the bottom surface of the first substrate 11. As described above, the first transistor TR1 and the plurality of lines VL1 and VL2 of the circuit layer CCL may be disposed only in the non-emission area NEA without overlapping the emission area EMA.

Figure 33:
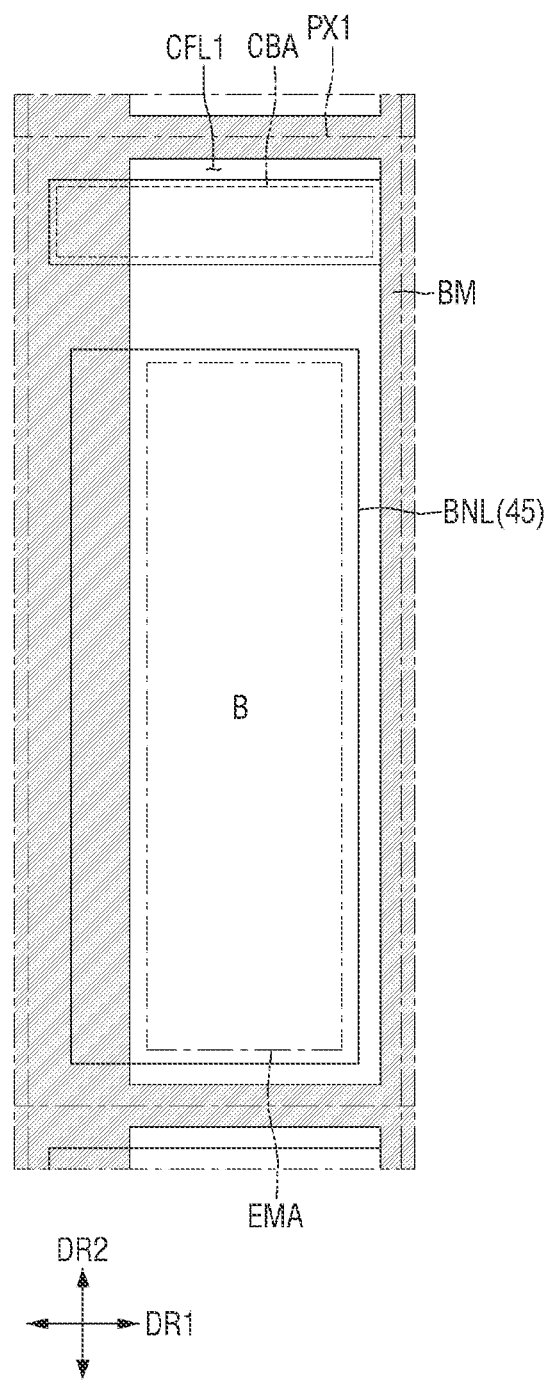
FIG. 33 is a schematic plan view showing a color filter layer disposed in one sub-pixel of a display device according to one or more embodiments.
Figure 34:
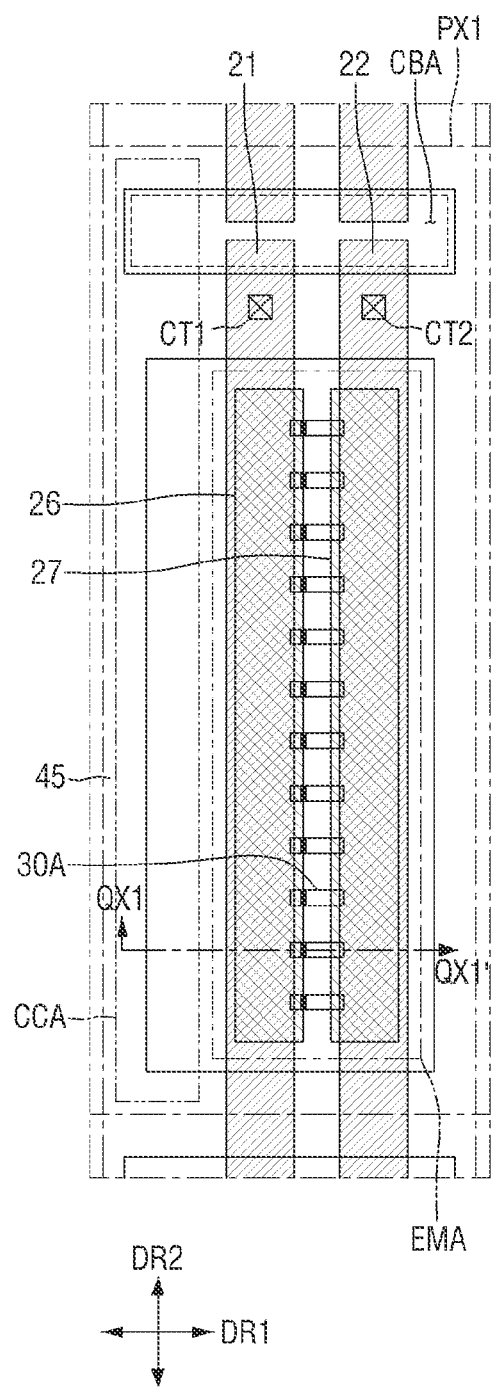
FIG. 34 is a schematic plan view showing a light emitting element layer disposed in one sub-pixel of a display device according to one or more embodiments.
Figure 35:
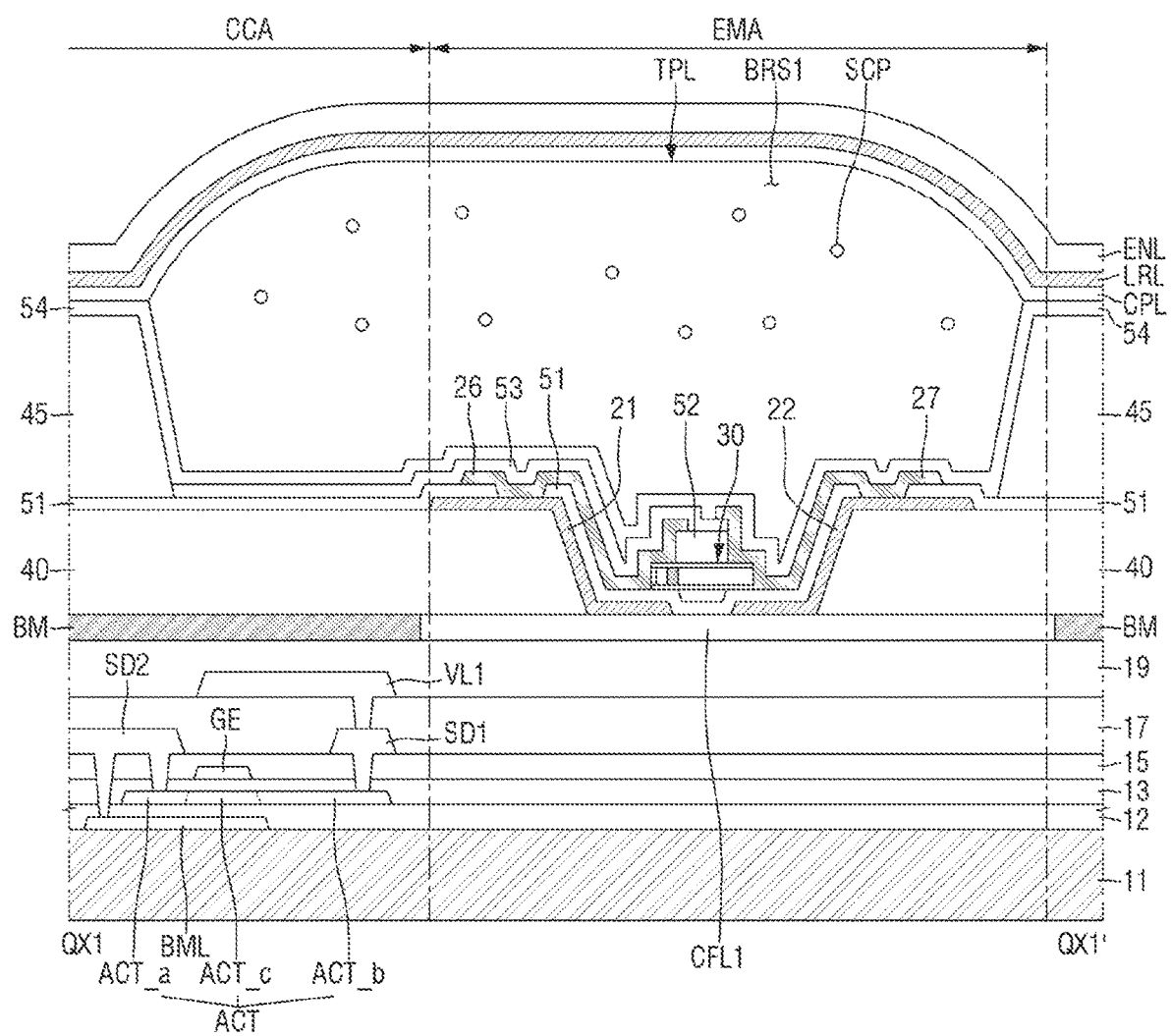
FIG. 35 is a cross-sectional view taken along the line QX1-QX1' of FIG. 34.

FIG. 33 is a schematic plan view showing a color filter layer disposed in one sub-pixel of a display device according to one or more embodiments. FIG. 34 is a schematic plan view showing a light emitting element layer disposed in one sub-pixel of a display device according to one or more embodiments. FIG. 35 is a cross-sectional view taken along the line QX1-QX1' of FIG. 34. FIG. 35 illustrates a cross section of both ends of the light emitting element 30 together with a circuit area CCA and the emission area EMA in the display device 10 of FIG. 34.

Referring to FIGS. 33 to 35, the display device 10 according to one or more embodiments may include the emission area EMA in which the light emitting element 30 is disposed in each sub-pixel PXn to emit light, and the circuit area CCA in which the light emitting element 30 is not disposed and the wirings of the circuit layer CCL are disposed. The display device 10 according to the present embodiment is different from the embodiment of FIGS. 3 to 6 in that the sub-pixels PXn include the emission area EMA and the circuit area CCA. In the following description, redundant description will be omitted while focusing on differences.

In each sub-pixel PXn, the emission area EMA in which the light emitting element 30 and the electrodes 21 and 22 are disposed in the region surrounded by the first bank 45, and the circuit area CCA adjacent thereto and in which the light emitting elements 30 are not disposed may be formed. The emission area EMA is an area in which the light emitting elements 30 are disposed to emit light as described above. The circuit area CCA may be an area in which the light emitting elements 30 and the electrodes 21 and 22 are not disposed and a small amount of light reaches, and may be an area in which the first transistor TR1 and the wirings of the circuit layer CCL disposed under the color filter layer CFL are disposed. The emission area EMA may not overlap the wirings of the circuit layer CCL disposed on the first substrate 11 while including the light emitting element 30 disposed therein.

The light blocking member BM may partially have a larger width to prevent the lights emitted from the light emitting element 30 from being incident on the color filter layer CFL in the circuit area CCA. For example, in the portion of the light blocking member BM extending in the second direction DR2, a portion disposed on the other side of each sub-pixel PXn in the first direction DR1 may be thicker than a portion disposed on one side thereof in the first direction DR1. The light blocking member BM may have a large width so that it may be partially disposed in the circuit area CCA, and may prevent lights emitted from the light emitting element 30 and reflected from the reflective layer LRL from being incident on the circuit area CCA. Although it is illustrated in the drawing that the circuit area CCA is positioned on the other side of the emission area EMA in the first direction DR1 by the light blocking member BM, the present disclosure is not limited thereto. In one or more embodiments, the circuit area CCA may be positioned on one side of the emission area EMA in the first direction DR1, and the circuit area CCA and the emission area EMA may be positioned adjacent to each other in the second direction DR2 in each sub-pixel PXn.

Further, the second bank 40 may be disposed across the boundary between neighboring sub-pixels PXn similarly to the first sub-bank 40A_10 in the embodiment of FIG. 32. The first transistors TR1 and the wirings disposed in the circuit area CCA may be disposed to overlap the first sub-bank 40A_10, and a part of the light blocking member BM may be disposed under the first sub-bank 40A_10.

Although it is illustrated in the drawing that the first bank 45 has a thickness similar to that of FIG. 3 unlike the light blocking member BM, the present disclosure is not limited thereto. In one or more embodiments, the first bank 45 may be formed to have a larger width at a portion where the light blocking member BM has a larger width to correspond to the thickness of the light blocking member BM. The first bank 45 may be disposed to partially overlap the circuit area CCA, and accordingly, the emission area EMA may be disposed in the region surrounded by the first bank 45. In this case, the base resin BRS1 of the color control structures TPL, WCL1, and WCL2 may not be disposed in the circuit area CCA and may be disposed only in the emission area EMA.

The lights emitted from the light emitting element 30 may not be reflected by the wirings of the circuit layer CCL while they are being reflected from the reflective layer LRL and emitted to the bottom surface of the first substrate 11 through the color filter layer CFL. In the present embodiment, most of the light emitted from the light emitting element 30 may be emitted compared to the embodiment in which each sub-pixel PXn does not include the circuit area CCA.

Figure 36:
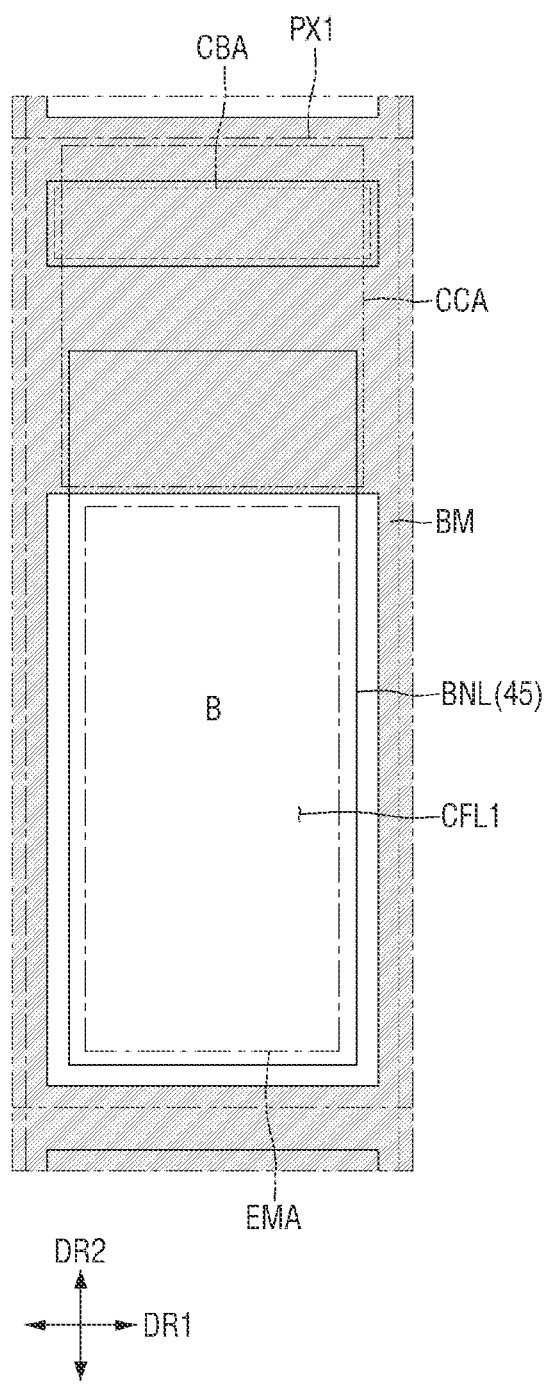
FIG. 36 is a schematic plan view showing a color filter layer disposed in one sub-pixel of a display device according to one or more embodiments.

FIG. 36 is a schematic plan view showing a color filter layer disposed in one sub-pixel of a display device according to one or more embodiments.

Referring to FIG. 36, each sub-pixel PXn of the display device 10 may be disposed such that the circuit area CCA and the emission area EMA are adjacent to each other in the second direction DR2. The emission area EMA may be disposed in the region surrounded by the first bank 45, and the circuit area CCA may be disposed on one side of the emission area EMA in the second direction DR2. However, as described above, the arrangement positions of the circuit area CCA and the emission area EMA may be opposite to each other. Although it is illustrated in the drawing that the circuit area CCA is formed across the first bank 45 and the sub-region CBA in addition to the region surrounded by the first bank 45, the present disclosure is not limited thereto. The circuit area CCA may be disposed on one side of the emission area EMA in the second direction DR2, and the arrangement relationship with the first bank 45 and the sub-region CBA may be changed.

Further, the first bank 45 may be formed to partially have a larger width corresponding to the width of the light blocking area BM and the arrangement of the circuit area CCA. Accordingly, the emission area EMA may be disposed in the region surrounded by the first bank 45, and the first bank 45 may be disposed to overlap the circuit area CCA.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

The invention claimed is:
1. A display device comprising:
a first substrate on which a plurality of sub-pixels are located;
a plurality of color filter layers on the first substrate;
a bank layer comprising a first bank at a boundary between the plurality of sub-pixels and located on the color filter layers;

a color control structure comprising a plurality of light transmitting layers and wavelength conversion layers in a region surrounded by the first bank on the color filter layer;
a light emitting element layer between the color filter layer and the color control structure;
a reflective layer on the color control structure; and
a first electrode and a second electrode on the color filter layer and at least partially located at the same plane,
wherein the light emitting element layer comprises a plurality of light emitting elements, each of the plurality of light emitting elements having respective ends on the first electrode and the second electrode.

2. The display device of claim 1, wherein the light emitting element layer further comprises a first contact electrode in contact with one end of the light emitting element and the first electrode, and a second contact electrode in contact with an other end of the light emitting element and the second electrode.

3. The display device of claim 1, wherein the reflective layer is on the first bank.

4. The display device of claim 3, wherein the reflective layer comprises a metal material or a low refractive material.

5. The display device of claim 3, further comprising an encapsulation layer on the reflective layer,
wherein the encapsulation layer comprises a first inorganic encapsulation layer, a second inorganic encapsulation layer on the first inorganic encapsulation layer, and an organic encapsulation layer between the first inorganic encapsulation layer and the second inorganic encapsulation layer.

6. The display device of claim 1, wherein the first bank is surrounding the sub-pixels,
wherein the plurality of light emitting elements of the light emitting element layer is in the sub-pixel, and
wherein the light transmitting layer and the wavelength conversion layers are on the light emitting elements in a region surrounded by the first bank.

7. The display device of claim 6, wherein the bank layer further comprises a plurality of second banks on the color filter layer in a region surrounded by the first bank, and
wherein the first electrode and the second electrode are on the plurality of second banks, and are at least partially directly on the color filter layer.

8. The display device of claim 7, further comprising a first insulating layer on the color filter layer and the plurality of second banks,
wherein the first bank is directly on the first insulating layer.

9. The display device of claim 8, wherein the first insulating layer partially covers the first electrode and the second electrode of the light emitting element layer.

10. The display device of claim 1, wherein the color filter layer comprises a first color filter layer in a first sub-pixel and a second color filter layer in a second sub-pixel,
wherein the light emitting element layer comprises a first light emitting element layer in the first sub-pixel and a second light emitting element layer in the second sub-pixel, and
wherein the color control structure comprises a first light transmitting layer in the first sub-pixel and a first wavelength conversion layer in the second sub-pixel.

11. The display device of claim 10, wherein light emitted from the first light emitting element layer is reflected from the reflective layer while passing through the light transmitting layer and is emitted to a bottom surface of the first substrate through the first color filter layer, and
wherein light emitted from the second light emitting element layer is reflected from the reflective layer while passing through the first wavelength conversion layer and is emitted to the bottom surface of the first substrate through the second color filter layer.

12. The display device of claim 11, wherein the light emitting element layer is configured to emit light of a first color, and
wherein the first sub-pixel is configured to emit light of the first color, and the second sub-pixel is configured to emit light of a second color different from the first color.

13. The display device of claim 12, wherein the color filter layer further comprises a third color filter layer in a third sub-pixel,
wherein the light emitting element layer further comprises a third light emitting element layer in the third sub-pixel,
wherein the color control structure further comprises a second wavelength conversion layer in the third sub-pixel, and
wherein the third sub-pixel is configured to emit light of a third color that is different from the first color and the second color.

14. The display device of claim 10, further comprising a light blocking member surrounding the first color filter layer and the second color filter layer and overlapping the first bank in a thickness direction of the display device.

15. The display device of claim 14, further comprising a circuit layer between the first substrate and the color filter layer and comprising at least one first transistor and a plurality of wirings,
wherein the first electrode and the second electrode of the light emitting element are electrically connected to the first transistor and the plurality of wirings, respectively.

16. The display device of claim 15, wherein the plurality of wirings and the first transistor of the circuit layer overlap the first bank in the thickness direction of the display device.

17. The display device of claim 15, further comprising a first planarization layer between the color filter layer and the circuit layer,
wherein the color filter layer is directly on the first planarization layer.

18. The display device of claim 17, wherein the first electrode is electrically connected to the first transistor through a first contact hole penetrating the light blocking member and the first planarization layer, and
wherein the second electrode is electrically connected to the plurality of wirings through a second contact hole penetrating the light blocking member and the first planarization layer.

19. A display device comprising:
a plurality of sub-pixels arranged along a first direction and a second direction;
a bank layer at a boundary between the plurality of sub-pixels and extending in the first direction and the second direction;
a first color filter layer in a first sub-pixel and a second color filter layer in a second sub-pixel located in the second direction of the first sub-pixel;
a light emitting element layer comprising a first electrode and a second electrode respectively located in the first sub-pixel and the second sub-pixel and extending in the first direction and a plurality of light emitting elements, each of the plurality of light emitting elements having respective ends disposed on the first electrode and the second electrode;

a color control structure comprising a light transmitting layer in the first sub-pixel and a first wavelength conversion layer in the second sub-pixel in a region surrounded by the bank layer; and a reflective layer covering the color control structure and the bank layer.

20. The display device of claim 19, further comprising a light blocking member overlapping the bank layer and surrounding the first color filter layer and the second color filter layer.

21. The display device of claim 20, further comprising a third color filter layer in a third sub-pixel located in the second direction of the second sub-pixel, and a second wavelength conversion layer in the third sub-pixel.

22. The display device of claim 20, wherein the first color filter layer and the second color filter layer extend in the first direction and are over the bank layer, and the light blocking member has a shape extending in the first direction.

23. The display device of claim 20, wherein a width of the light blocking member is smaller than a width of the bank layer, and the first color filter layer and the second color filter layer partially overlap the bank layer.

24. The display device of claim 23, wherein the light transmitting layer and the first wavelength conversion layer have widths measured in the second direction that are smaller than widths measured in the second direction of the first color filter layer and the second color filter layer, respectively.

* * * * *